(12) United States Patent
Peng et al.

(10) Patent No.: US 11,942,470 B2
(45) Date of Patent: Mar. 26, 2024

(54) SEMICONDUCTOR DEVICE AND METHOD FOR MANUFACTURING THE SAME

(71) Applicant: TAIWAN SEMICONDUCTOR MANUFACTURING COMPANY, LTD., Hsinchu (TW)

(72) Inventors: Shih-Wei Peng, Hsinchu (TW); Jiann-Tyng Tzeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/155,536

(22) Filed: Jan. 17, 2023

(65) Prior Publication Data

US 2023/0154916 A1    May 18, 2023

Related U.S. Application Data

(63) Continuation of application No. 17/135,614, filed on Dec. 28, 2020, now Pat. No. 11,574,901.

(60) Provisional application No. 63/017,357, filed on Apr. 29, 2020.

(51) Int. Cl.
| | |
|---|---|
| *H01L 27/02* | (2006.01) |
| *G06F 30/3953* | (2020.01) |
| *H01L 21/8234* | (2006.01) |
| *H01L 23/522* | (2006.01) |
| *H01L 29/06* | (2006.01) |

(52) U.S. Cl.
CPC ...... *H01L 27/0207* (2013.01); *G06F 30/3953* (2020.01); *H01L 21/823475* (2013.01); *H01L 23/5226* (2013.01); *H01L 29/0696* (2013.01)

(58) Field of Classification Search
CPC ......... H01L 27/0207; H01L 21/823475; H01L 23/5226; H01L 29/0696; G06F 30/3953
USPC ....................................................... 257/288
See application file for complete search history.

(56) References Cited

U.S. PATENT DOCUMENTS

| | | | |
|---|---|---|---|
| 8,704,384 B2 | 4/2014 | Wu | |
| 11,211,375 B2* | 12/2021 | Lee | ............ H01L 29/0673 |
| 2007/0126066 A1 | 6/2007 | Liao | |
| 2014/0252653 A1 | 9/2014 | Okamoto et al. | |
| 2018/0315709 A1 | 11/2018 | Schultz | |

FOREIGN PATENT DOCUMENTS

TW    200415778 A    8/2004

* cited by examiner

*Primary Examiner* — Tu-Tu V Ho
(74) *Attorney, Agent, or Firm* — Maschoff Brennan

(57) ABSTRACT

A semiconductor device includes a first cell. The first cell is surrounded by a castle-shaped forbidden region. The first cell includes a first active region, a second active region, and at least one via. The first active region and the second active region extend along a first direction and are separated from each other along a second direction traverse to the first direction. The first active region partially overlaps an upper region of the castle-shaped forbidden region, and the second active region partially overlaps a lower region of the castle-shaped forbidden region. The at least one via is arranged outside the castle-shaped forbidden region.

20 Claims, 30 Drawing Sheets

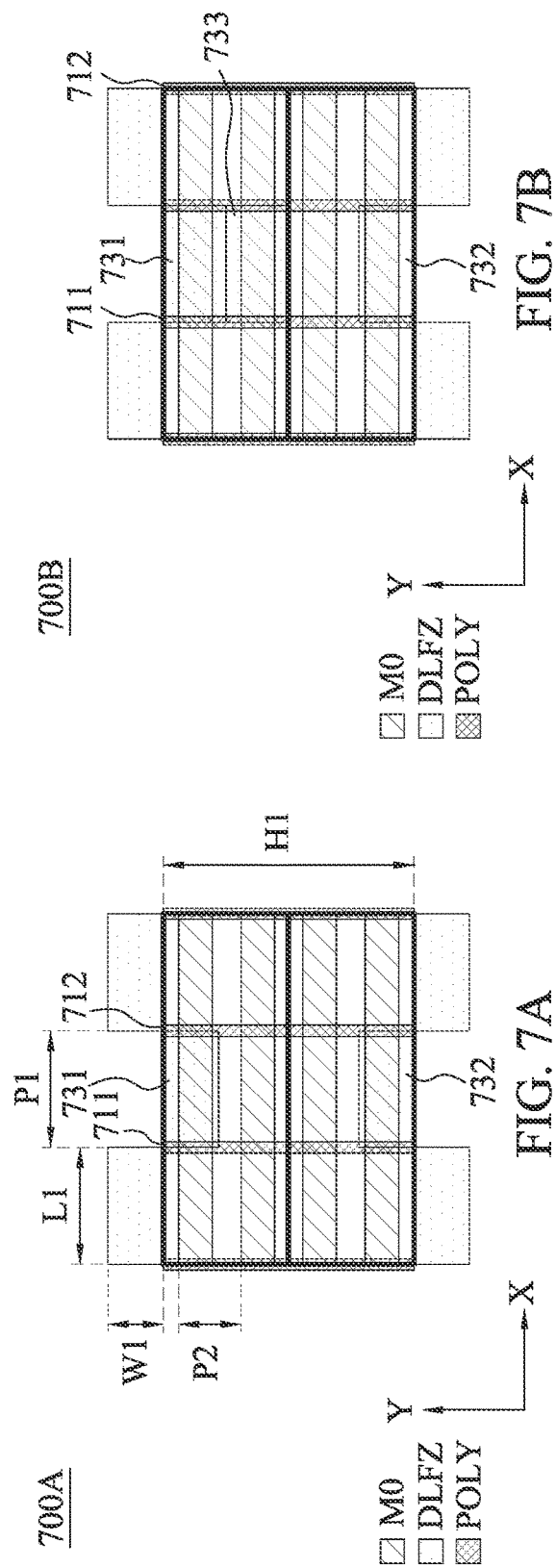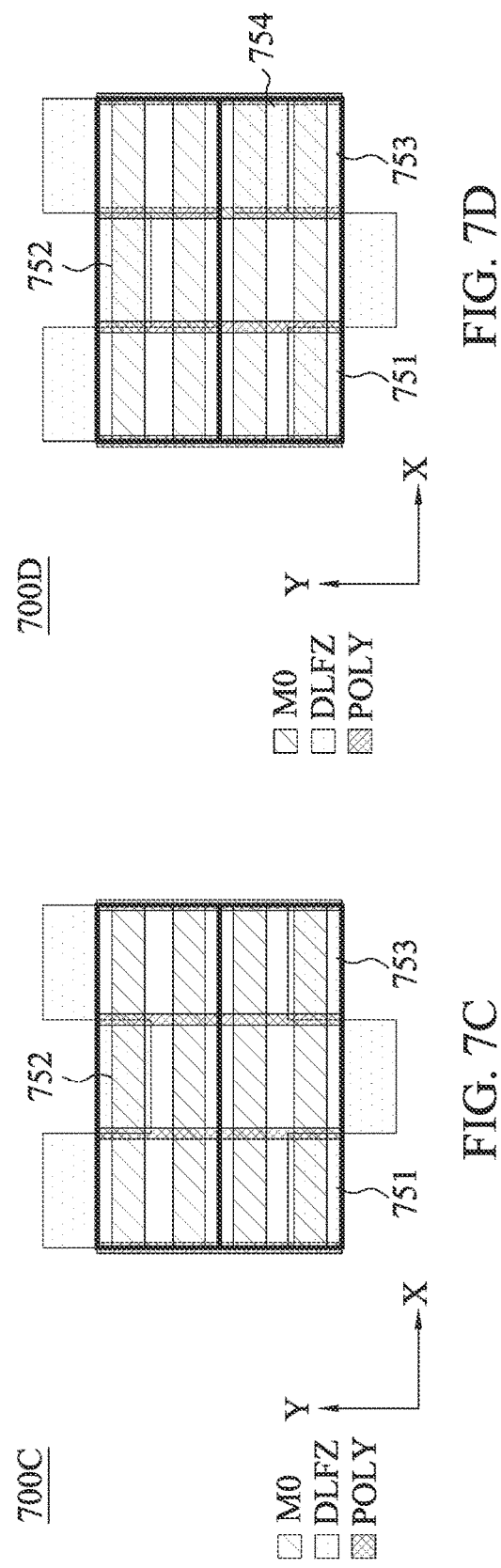

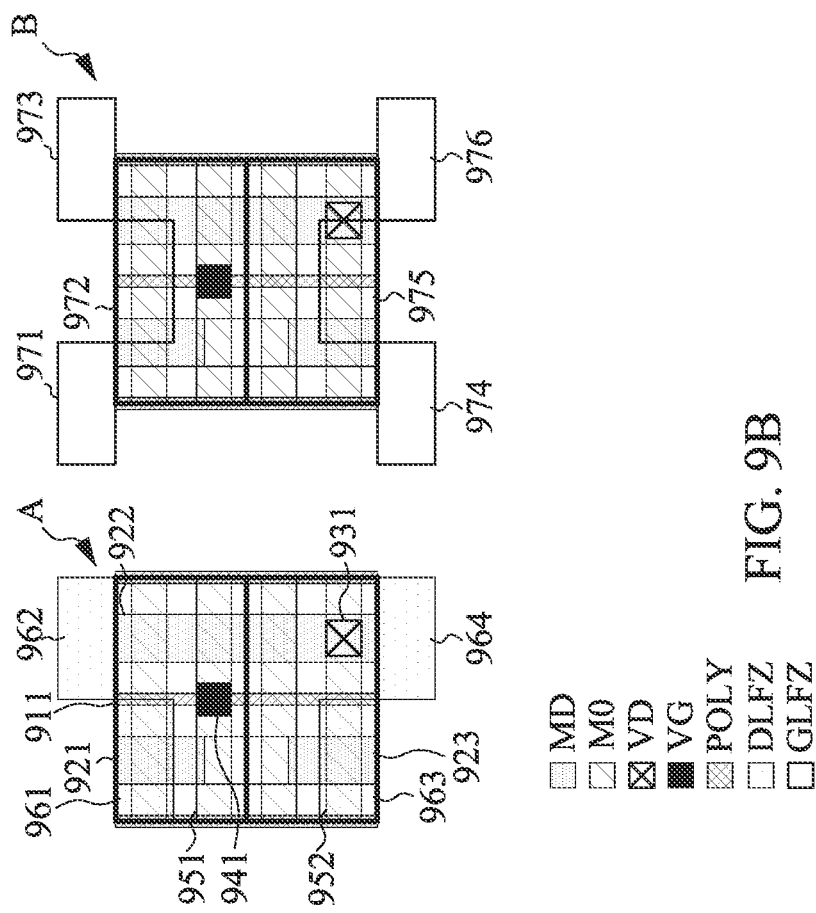
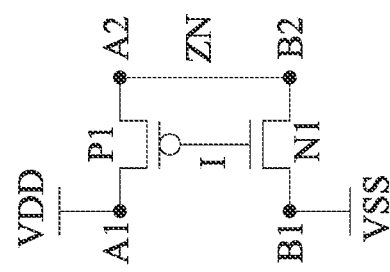
FIG. 9B
FIG. 9A

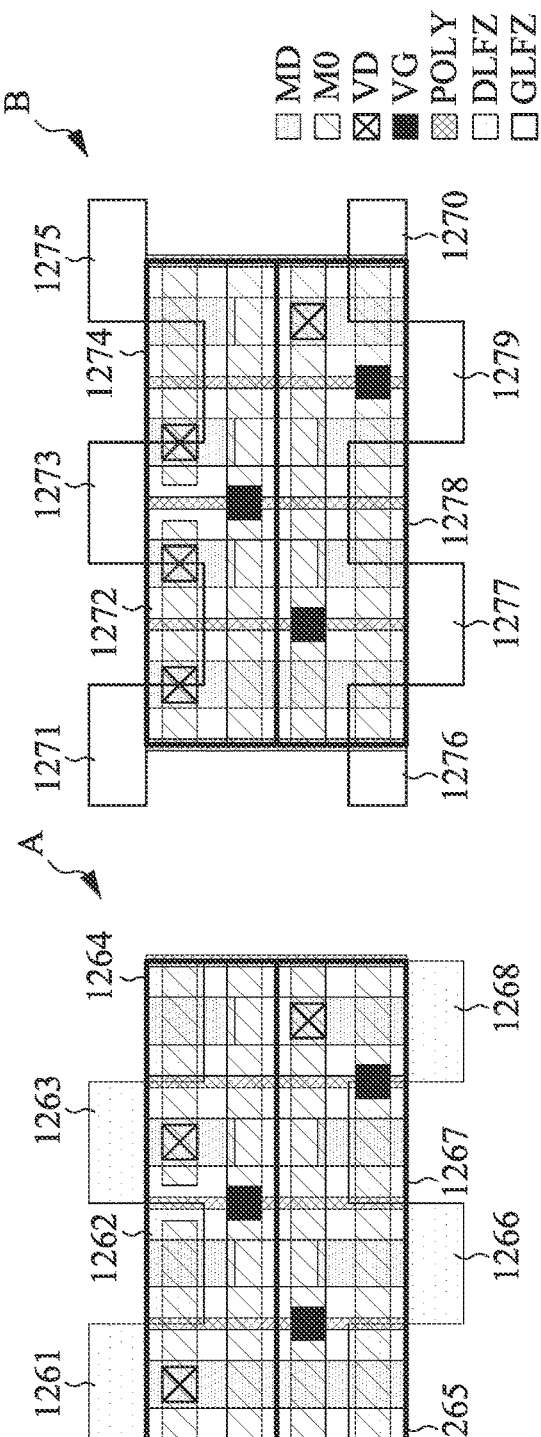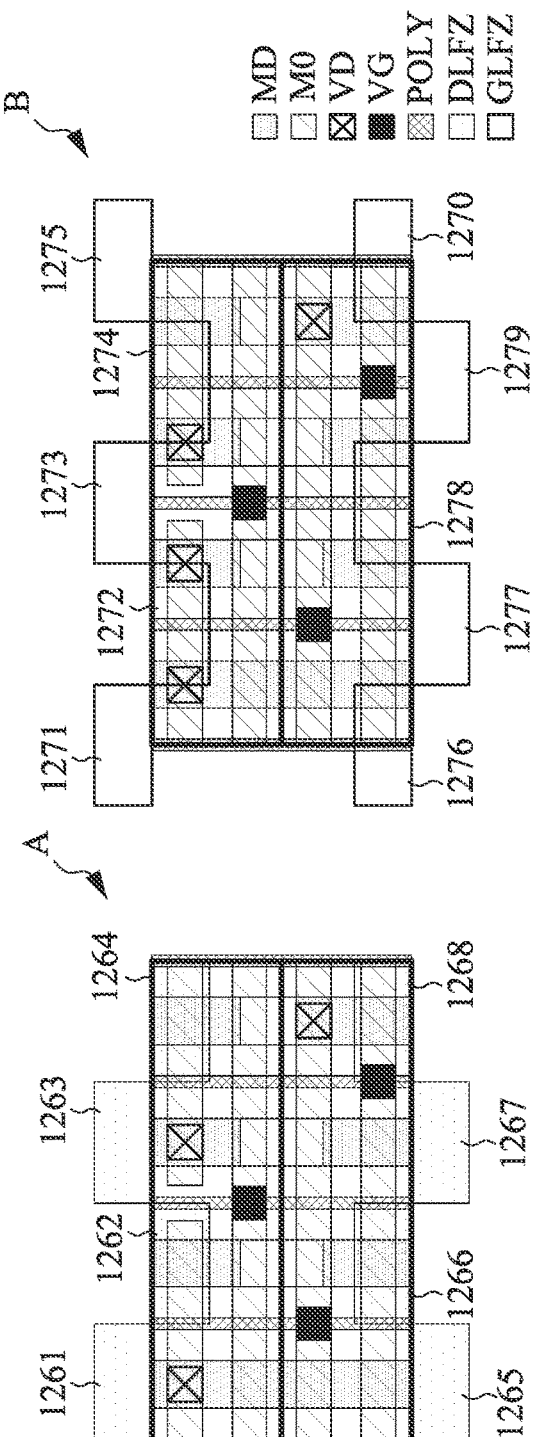
FIG. 12C
FIG. 12D

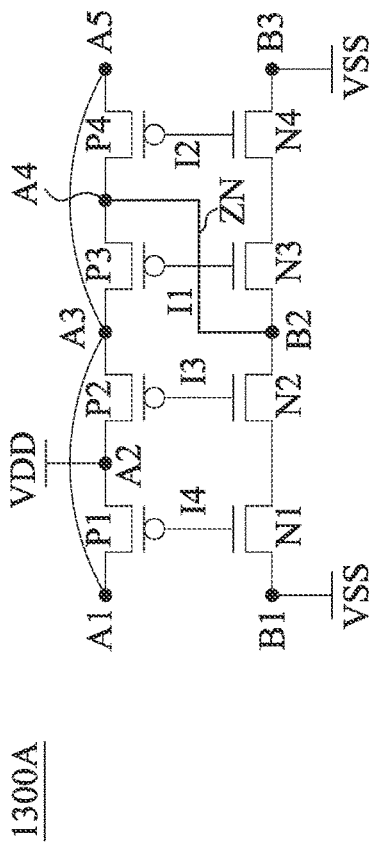
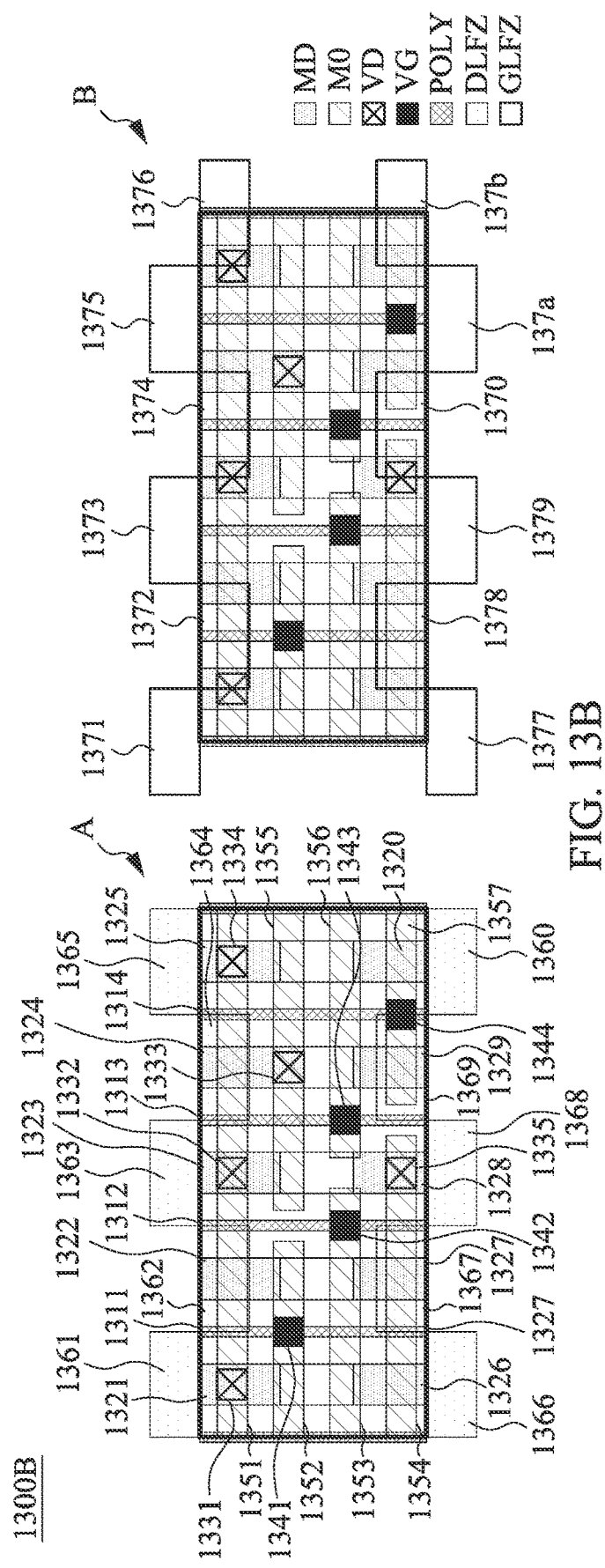
FIG. 13A
FIG. 13B

SEMICONDUCTOR DEVICE AND METHOD FOR MANUFACTURING THE SAME

RELATED APPLICATIONS

This application is a continuation of U.S. application Ser. No. 17/135,614, filed on Dec. 28, 2020, which claims the benefit of U.S. Provisional Application Ser. No. 63/017,357, filed Apr. 29, 2020, which is herein incorporated by reference.

BACKGROUND

The semiconductor integrated circuit (IC) industry has experience rapid growth. In pursuit of higher device density, higher performance, and lower costs, technological advances in IC design have produced generations of ICs. Compared to previous generation, the present generation has smaller and more complex circuits. In IC evolution, the number of interconnected devices per chip area has generally increased while the smallest component or line that can be created using a fabrication process has decreased. This scaling-down process increases the complexity of designing and fabricating ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A-7D are schematic layout diagrams of a semiconductor device corresponding to the semiconductor device in FIG. 5, in accordance with some embodiments of the present disclosure.

FIG. 9A is a circuit diagram of an IC, in accordance with some embodiments of the present disclosure.

FIGS. 9B-9D are layout diagrams of an IC corresponding to the IC of FIG. 9A, in accordance with some embodiments of the present disclosure.

FIGS. 12B-12D are layout diagrams of an IC corresponding to the IC of FIG. 12A, in accordance with some embodiments of the present disclosure.

FIG. 13A is a circuit diagram of an IC, in accordance with some embodiments of the present disclosure.

FIGS. 13B-13D are layout diagrams of an IC corresponding to the IC of FIG. 13A, in accordance with some embodiments of the present disclosure.

DETAILED DESCRIPTION

Figure 1:
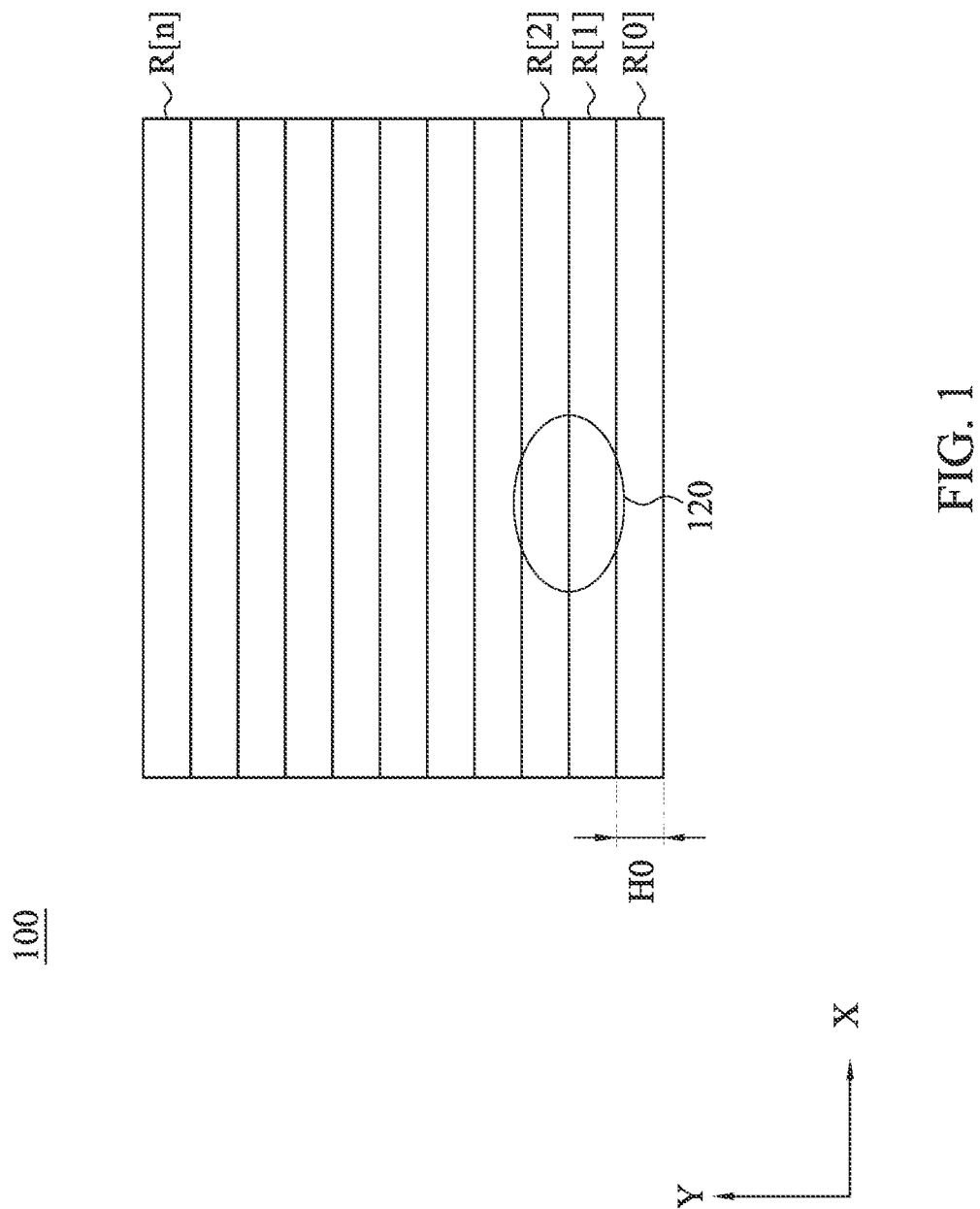
FIG. 1 is a schematic layout diagram of an integrated circuit (IC), in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

In this document, the term "coupled" may also be termed as "electrically coupled", and the term "connected" may be termed as "electrically connected". "Coupled" and "connected" may also be used to indicate that two or more elements cooperate or interact with each other.

Furthermore, spatially relative terms, such as "underlying," "below," "lower," "overlying," "upper" and the like, may be used throughout the description for ease of understanding to describe one element or feature's relationship to another element(s) or feature(s) as illustrated in the figures. The spatially relative terms are intended to encompass different orientations of the device in use or operation in addition to the orientation depicted in the figures. The structure may be otherwise oriented (e.g., rotated 90 degrees or at other orientations) and the spatially relative descriptors used herein may likewise be interpreted accordingly.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

FIG. 1 is a schematic layout diagram 100 of an integrated circuit (IC), in accordance with some embodiments of the present disclosure. The layout diagram 100 is arranged in rows including several rows R[0], R[1], R[2], . . . , and R[n]. The rows R[0], R[1], R[2], . . . , and R[n] extend in an X direction, and stack in a Y direction sequentially.

Figure 2:
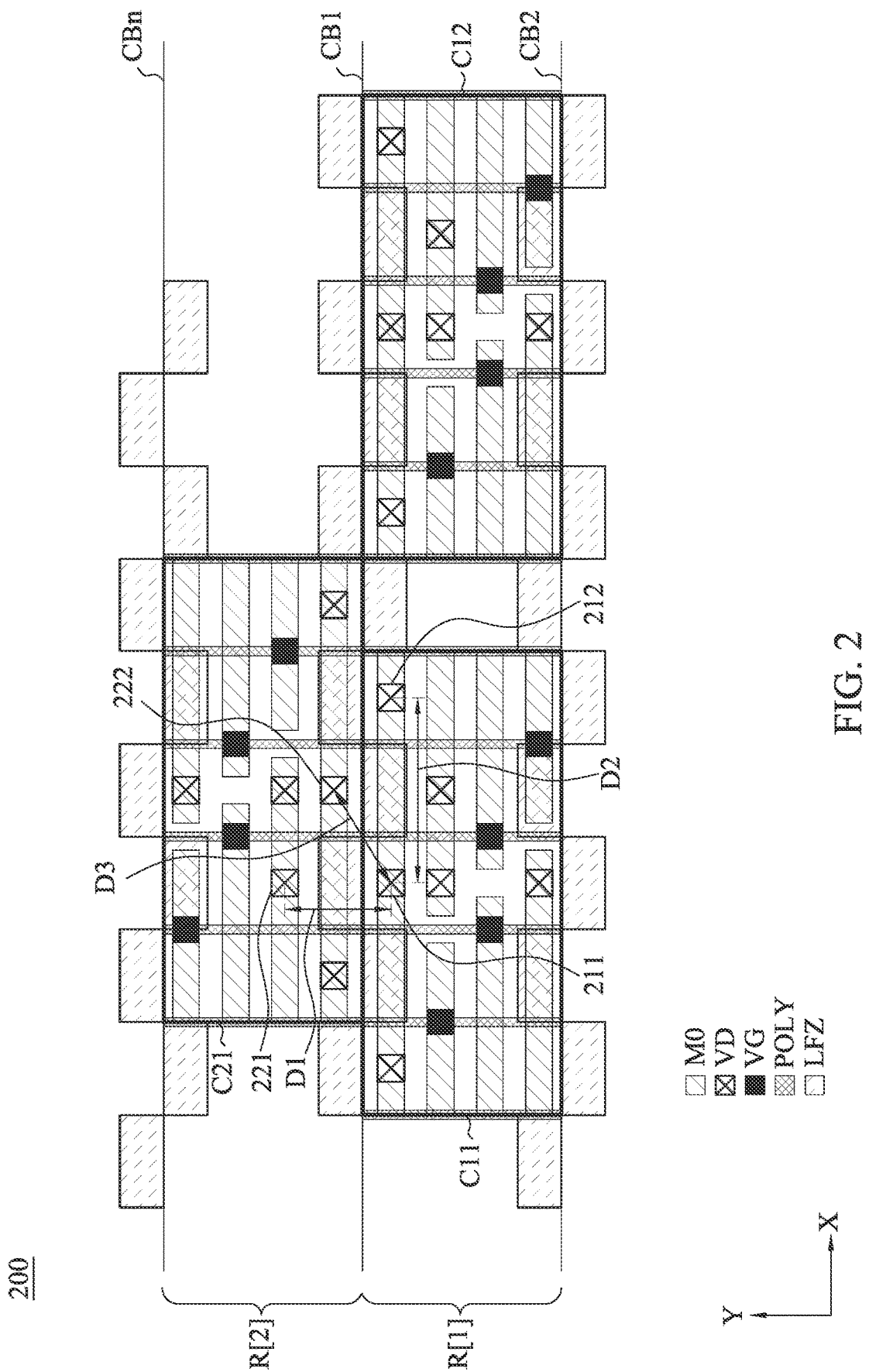
FIG. 2 is a schematic layout diagram of a semiconductor device included in an IC corresponding to the IC in FIG. 1, in accordance with some embodiments of the present disclosure.

Cells (which are shown in FIG. 2) are disposed in various rows R[0], R[1], R[2], . . . , and R[n] for designing corresponding circuits of the IC, in some embodiments. Relative to the Y direction, various cells in the rows R[0], R[1], R[2], . . . , and R[n] have respective heights. For example, as illustrated in FIG. 1, one cell in the row R[0] has a height H0, which is only one height labeled in FIG. 1 for simplicity of illustration. In some embodiments, the heights are referred to as cell heights, which are also equal to heights of the corresponding rows. In some other embodiments, at least one of the height of the rows R[0], R[1], R[2], . . . , and R[n] is different from the others. In some alternative embodiments, at least two of the heights of the rows R[0], R[1], R[2], . . . , and R[n] are the same.

In some embodiments, the layout diagram 100 represents an initial layout diagram according to one or more methods of generating a layout diagram. In some other embodiments, the IC including the semiconductor device is fabricated based on a larger layout diagram which includes the layout diagram 100.

Reference is now made to FIG. 2. FIG. 2 is a schematic layout diagram 200 of a semiconductor device, in accordance with some embodiments of the present disclosure. In some embodiments, the layout diagram 200 is a zoomed-in view of an area 120 in the layout diagram 100 shown in FIG. 1. The layout diagram 200 with respect to the embodiments of FIG. 1, like elements in FIG. 2 are designated with the same reference numbers for ease of understanding. For simplicity of illustration, only few rows R[0] and R[1] and few cells C11, C12 and C21 are shown in the layout diagram 200.

For illustration in FIG. 2, the cells C11 and C12 are arranged in the row R[1], and are arranged next to each other with respect to the X direction. The cell C21 is arranged in the row R[2], and abuts the cell C11 with respect to the Y direction.

Various cells C11, C12 and C21 in the layout diagram 200 are utilized for the design of corresponding circuits, with a consideration of circuit performance, circuit power and a manufacturing process. In some embodiments, the cells C11, C12 and C21 are utilized from a standard cell library (which is a standard cell library 2062 discussed with reference to FIG. 20). The cells C11, C12 and C21 have the same cell heights that are equal to the heights of the rows R[1]-R[2]. In some other embodiments, the cells C11, C12 and C21 are utilized from respective cell libraries, and have respective cell heights that are equal to the corresponding heights of the rows R[1]-R[2].

With reference to FIG. 2, the layout diagram 200 further includes several patterns which are patterned as "LFZ". These patterns LFZ are arranged along boundaries of the rows R[1]-R[2] in the X direction. Specifically, the patterns LFZ are arranged at each boundaries CB1, CB2 and CBn of the rows R[1]-R[2], and are arranged alternatively and separated from each other. Alternatively stated, the patterns LFZ are arranged around a top boundary CBn and a bottom boundary CB1 of the cell C21, and also arranged around top boundaries CB1 and bottom boundaries CB2 of the cells C11 and C12.

In some embodiments, the patterns LFZ are utilized to design an arrangement of via patterns. For example, with reference to FIG. 2, vias 211 and 212 in the cell C11 are separated from each other by one pattern LFZ, and the via 211 in the cell C11 is spaced apart from a via 221 in the cell C21 by at least one pattern LFZ. In some embodiments, the via patterns are utilized to form vias in the semiconductor device. The vias include gate vias and conductive vias, as discussed in more detail in the following embodiments. By following at least one guideline, the via patterns are forbad to be placed in the patterns LFZ. As such, in the corresponding semiconductor device, no vias are formed at the regions where the patterns LFZ are disposed. In various embodiments, some guidelines are provided in following paragraphs of the present disclosure for demonstrating when and/or where to arrange or form the vias in the semiconductor device.

Reference is now made to FIGS. 3A-3B. FIGS. 3A-3B are schematic layout diagrams of a semiconductor device 300, in accordance with some embodiments of the present disclosure. In some embodiments, the semiconductor device 300 is fabricated based on the layout diagram 200. The semiconductor device 300 with respect to the embodiments of FIG. 2, like elements in FIGS. 3A-3B are designated with the same reference numbers for ease of understanding. For simplicity of illustration, only a portion of the semiconductor device 300 is shown in FIGS. 3A-3B, and only few elements are labeled in FIGS. 3A-3B. For example, FIG. 3A illustrates the cell C11 corresponding to the cell C11 in FIG. 2 and a part of a cell C01. FIG. 3B illustrates the cell C11. The cell C01 abuts the cell C11 and is arranged in another row (which is R[0] shown in FIG. 1).

As illustrated in FIG. 3A, a front side of the semiconductor device 300 is illustrated. The semiconductor device 300 includes gates 311, 312 and 313 patterned as "POLY", conductive segments 321, 322 and 323 patterned as "MD", gate via 341 patterned as "VG", contact via 331 patterned as "VD", and signal rails 351, 352, 353 and 354 patterned as "M0".

The gates 311-313 are formed across active areas (not labeled in FIG. 3A) which is patterned as "AA". The gates 311-313 extend along the Y direction. The conductive segments 321-323 are formed above the active areas and extend along the Y direction. The conductive segments are referred to as MD segments hereinafter. In some embodiments, the gates 311-313 correspond to gate terminals of respective transistors. The MD segments 321-323 correspond to source/drain terminals of respective transistors. In some other embodiments, the gate 311 and the adjacent MD segments 321 and 323 correspond to a same transistor.

The active areas are symbol layers where a main part of the semiconductor device 300 disposed, rather than physical layers, in some embodiments. In some embodiments, the active areas are polysilicon. In some embodiments, the active areas are made of p-type doped material. In some other embodiments, the active areas are made of n-type doped material. In various embodiments, the active areas are configured to form channels of transistors. In some other embodiments, the active areas are fin-shaped active regions and are configured to form fin structures for forming fin field-effect transistors (FinFET).

The gate via 341 is disposed above the active areas and is coupled between the gate 311 and the signal rail 352 that is disposed in a metal-zero (M0) layer above the active areas.

In some embodiments, the gate via 341 and other gate vias discussed with the following embodiments of the present disclosure correspond to vias that are coupled between the corresponding gate terminals and metal rails formed in the M0 layer.

The contact via 331 is disposed above the active areas and is coupled between the MD segment 322 and the signal rail 353 that is disposed in the M0 layer. In some embodiments, the contact via 331 and contact gate vias discussed with the following embodiments of the present disclosure correspond to vias that are coupled between the corresponding source/drain terminals and metal rails formed in the M0 layer.

The signal rails 351, 352, 353 and 354 are disposed in the M0 layer. The signal rails 351-354 extend along the X direction. In some other embodiments, the signal rails 351-354 are configured to couple data signals to the corresponding transistors.

As illustrated in FIG. 3B, a back side of the semiconductor device 300 is illustrated. The back side is opposite to the front side. The semiconductor device 300 further includes backside vias 361 patterned as "VB", and backside power rails 371 and 372 patterned as "BM0".

The backside via 361 is disposed above the back side of the semiconductor device 300, which is also below the front side of the semiconductor device 300 including, for example, the active areas and the M0 layer. The backside via 361 is coupled between the MD segment 321 and the backside power rail 371 that is disposed in a backside metal-0 (BM0) layer. With reference to FIG. 3B, the BM0 layer is above the backside via 361.

The backside power rails 371 and 372 are disposed in the BM0 layer. The backside power rails 371 and 372 extend along the X direction. In some other embodiments, the backside power rails 371 and 372 are configured to transmit power signals. For example, with reference to FIG. 3B, the backside power rail 371 is coupled to a first reference voltage VSS, and is configured to receive the voltage signal VSS and couple the voltage signal VSS to the corresponding transistors. The backside power rail 372 is coupled to a second reference voltage VDD, and is configured to receive the voltage signal VDD and couple the voltage signal VDD to the corresponding transistors.

In some embodiments, with reference to FIGS. 3A-3B, with respect to the direction Y, widths of the signal rails 351-354 are the same, and widths of the backside power rails 371-372 are the same. The widths of the signal rails 351-354 are smaller than the widths of the backside power rails 371-372.

In some approaches, a semiconductor device including backside power rails have cells. These cells abut to each other without overlapping with a power rail in a front side of a layout view. As such, at least two vias disposed on two adjacent signal rails of these two abutting cells are arranged adjacent and close to each other. In such case, these two vias are hard to be fabricated with limited manufacturing techniques. Even these two vias are fabricated by chance, the corresponding data signals transmitted therebetween are interfered to each other.

Figure 3:
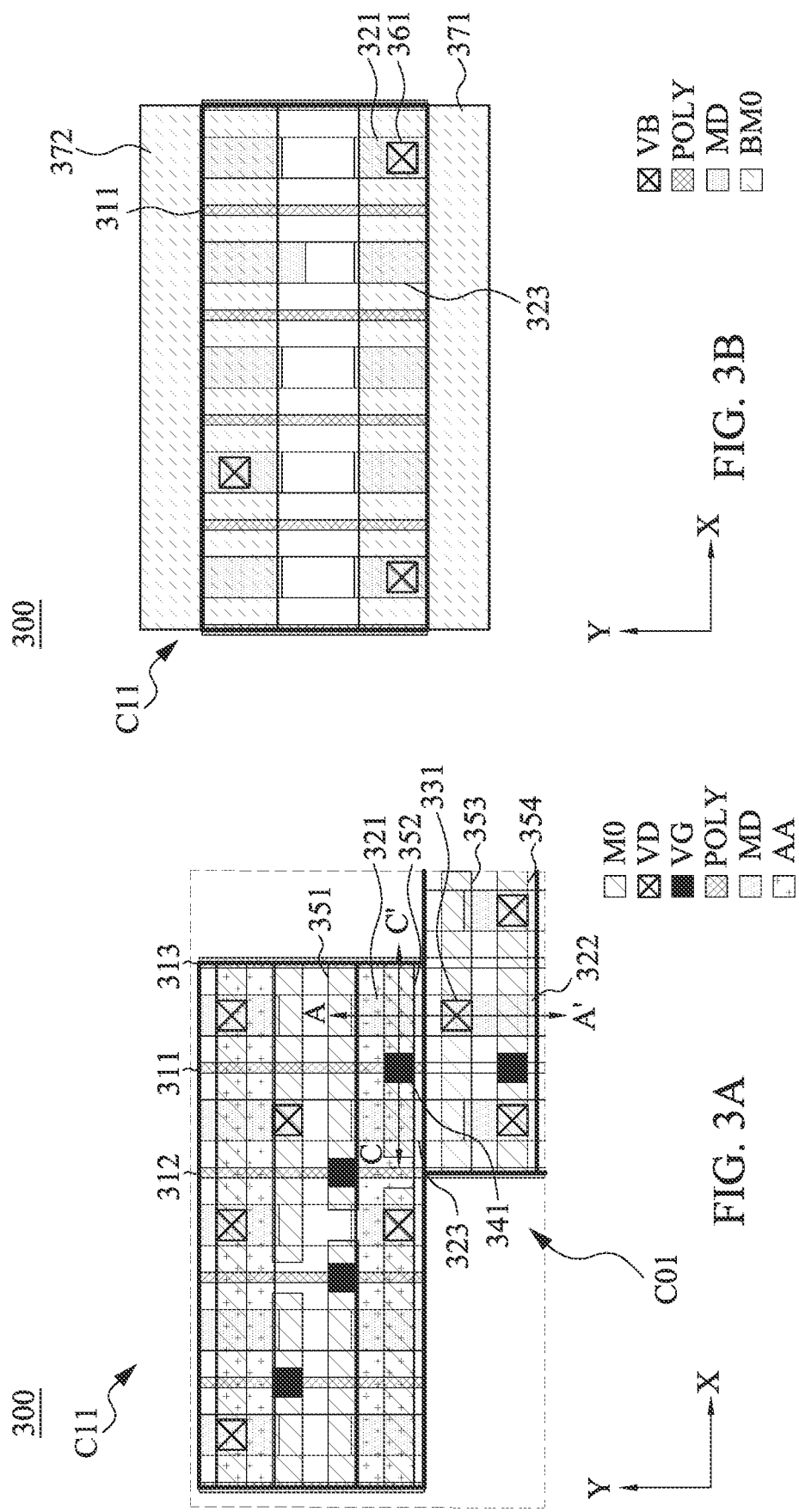
FIGS. 3A-3B are schematic layout diagrams of a semiconductor device corresponding to the semiconductor device in FIG. 2, in accordance with some embodiments of the present disclosure.

Compared to the above approaches, in the embodiments of the present disclosure, for example with reference to FIGS. 2-3B, the backside power rails 371-372 are included in the semiconductor device 300 that includes the cells C11 and C21. In a layout view, by arranging the forbidden regions patterned as LFZ in FIG. 2, the contact vias 211-212 of the cell C11 and the contact vias 221-222 of the cell C21 disposed in two adjacent signal rails are separated from each other by at least a distance D1, D2 or D3. Thereby, the contact vias are not too close to each other, and are easy to be fabricated.

Figure 4:
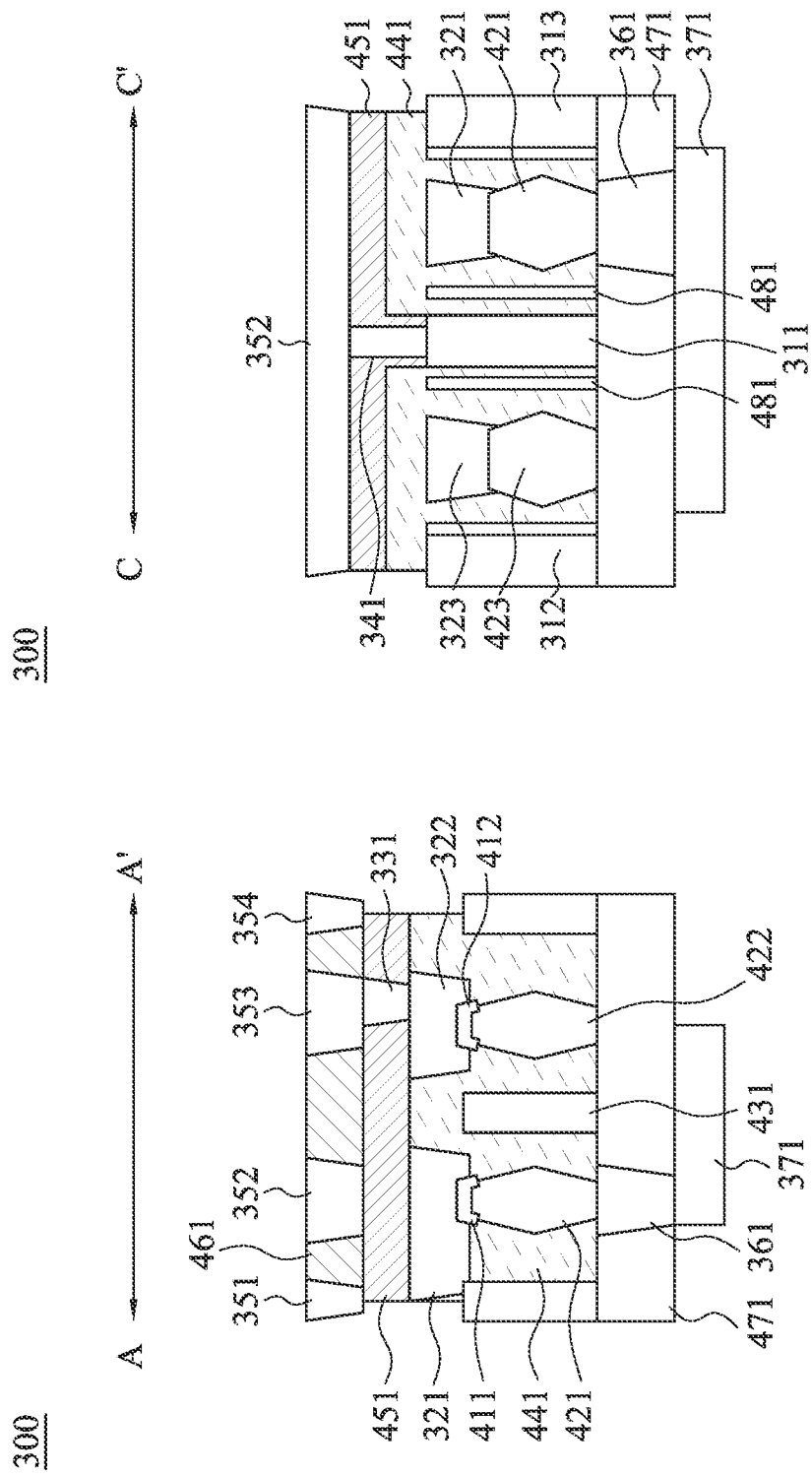
FIGS. 4A-4B are cross sectional view of a semiconductor device corresponding to the semiconductor device in FIGS. 3A-3B, in accordance with some embodiments of the present disclosure.

Reference is now made to FIGS. 4A-4B. FIGS. 4A-4B are cross sectional view of the semiconductor device 300 shown in FIGS. 3A-3B, in accordance with some embodiments of the present disclosure. FIG. 4A is a cross-sectional view along a line A-A' of FIG. 3A. FIG. 4B is a cross-sectional view along a line C-C' of FIG. 3A. For ease of understanding, the embodiments with respect to FIG. 4A are discussed with reference to FIG. 4B, and only illustrates some structures that are associated with the corresponding structures shown in FIGS. 3A-3B as an exemplary embodiment. The semiconductor device 300 with respect to the embodiments of FIGS. 3A-3B, like elements in FIGS. 4A-4B are designated with the same reference numbers for ease of understanding.

As illustrated in FIG. 4A, the MD segments 321 and 322 are respectively disposed on epitaxy structures 421 and 422, and silicide layers 411 and 412 are respectively disposed over therebetween. The MD segment 321, the silicide layer 411 and the epitaxy structure 421 are spaced apart from the MD segment 322, the silicide layer 412 and the epitaxy structure 422 by an isolation structure 431. A dielectric structure 441 is filled between the MD segments 321 and 322, the epitaxy structures 421 and 422 and the isolation structure 431.

In some embodiments, the epitaxy structures 421 and 422 correspond to the active areas illustrated in FIG. 3A. In some other embodiments, the epitaxy structures 421 and 422 include Ge, Si, GaAs, AlGaAs, SiGe, GaAsP, SiP, or other suitable material.

In some embodiments, the silicide layers 411 and 412 cover tops of the epitaxy structures 421 and 422, respectively. In some other embodiments, the silicide layers 411 and 412 are embedded in the epitaxy structures 421 and 422, respectively. In various embodiments, the epitaxy structures 421 and 422 include $CoSi_2$, $TiSi_2$, $WSi_2$, $NiSi_2$, $MoSi_2$, $TaSi_2$, $PtSi$, or the like.

In some embodiments, the isolation structure 431 is a shallow trench isolation (STI) structure, suitable isolation structure, combinations thereof or the like. In some other embodiments, the isolation structure 431 is made of oxide (e.g., silicon oxide) or nitride (e.g., silicon nitride).

In some embodiments, the dielectric structure 441 is made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HMO), hafnium zirconium oxide (HfZrO), zirconium oxide, titanium oxide, aluminum oxide, hafnium dioxide-alumina ($HfO_2$—$Al_2O_3$) alloy, or other applicable dielectric materials.

With reference to FIG. 4A, an interlayer dielectric (ILD) layer 451 is disposed above the MD segments 321 and 322 and the dielectric structure 441. A dielectric structure 461 is filled between the signal rails 351, 352, 353 and 354, and is also indicated as the M0 layer in some embodiments. The contact via 331 is disposed in the ILD layer 451, and contacts both of the MD segment 322 and the signal rail 353.

In some embodiments, the ILD layer 451 includes silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide.

With reference to FIG. 4A, a backside ILD layer 471 is disposed below the epitaxy structures 421 and 422, the isolation structure 431 and the dielectric structure 441. The backside power rail 371 is disposed below the backside ILD layer 471 and the backside via 361. A dielectric structure (not shown) is filled around the backside power rail 371, and is also indicated as the BM0 layer in some embodiments. The backside via 361 is disposed in the backside ILD layer 471, and contacts both of the MD segment 321 and the backside power rail 371. In some embodiments, the backside ILD layer 471 and the ILD layer 451 include the same materials.

Compared to FIG. 4A, in the cross sectional view of the semiconductor device 300 shown in FIG. 4B, a spacer 481 is disposed on opposite sidewalls of the gate 311, and between the MD segment 321 and the MD segment 323 which are disposed above the epitaxy structures 421 and 423 respectively. The dielectric structure 441 is filled between the gates 311-313, the MD segments 321 and 323, the epitaxy structures 421 and 423, and the spacer 481. The gate via 341 is disposed in the ILD layer 451, and contacts both of the gate 311 and the signal rail 352.

In some embodiments, the spacer 481 includes $SiO_2$, $Si_3N_4$, $SiO_xN_y$, SiC, SiCN films, SiOC, SiOCN films, and/or combinations thereof.

Figure 5:
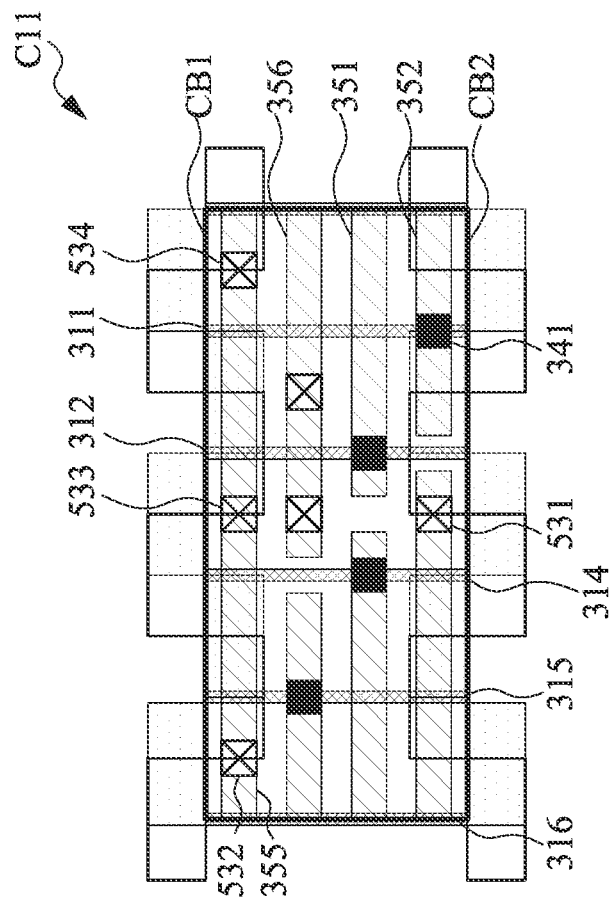
FIG. 5 is a schematic layout diagram of a semiconductor device corresponding to the semiconductor device in FIG. 2, in accordance with some embodiments of the present disclosure.

Reference is now made to FIG. 5. FIG. 5 is a schematic layout diagram 500 of a semiconductor device, in accordance with some embodiments of the present disclosure. In some embodiments, the layout diagram 500 is a zoomed-in view of the cell C11 in the layout diagram 200 shown in FIG. 2. In some embodiments, the layout diagram 500 is utilized to fabricate the semiconductor device 300 in FIGS. 3A-4B. In various embodiments, the layout diagram 500 is utilized to fabricate the semiconductor device 1700 in FIGS. 17-18C. The correspondence between a given layout diagram feature formed based on the given layout diagram feature, a same reference designator is used in each of the layout diagram and structure depictions, as discussed below. For simplicity of illustration, the MD segments are not shown in FIG. 5. The layout diagram 500 with respect to the embodiments of FIGS. 2-4B, like elements in FIG. 5 are designated with the same reference numbers for ease of understanding.

As illustrated in FIG. 5, the cell C11 is arranged in the row R[1] that is arranged between the rows R[0] and R[2]. In the cell C11, multiple gates 311, 312, 314, 315 and 316 are disposed, and multiple signal rails 351, 352, 355 and 356 are disposed. The layout diagram 500 further includes several forbidden regions patterned as DLFZ and GLFZ, which are discussed in detailed with reference to FIGS. 6A-6B. These forbidden regions are arranged along the boundaries of the rows R[0]-R[1]. Alternatively stated, the forbidden regions are arranged along cell boundaries including a top cell boundary CB1 and a bottom cell boundary CB2.

In some embodiments, the forbidden regions inside the cell C11 are some separated regions that are included in the active areas of the cell C11 as discussed with reference to FIGS. 3A-4B. In some other embodiments, the forbidden regions outside the cell C11 are some other separated regions of active areas that are included in other cells (not shown). These other cells abut the cell C11, and are arranged in the corresponding row R[0] and R[2]. These other cells include, for example, the cell C21 in the row R[2] shown in FIG. 2, and the cell C01 in the row R[0] shown in FIG. 3A.

To implement the semiconductor device 300 discussed with reference FIGS. 3A-4B, whether to arrange the vias, including the gate vias and the contact vias, is determined. Specifically, where to arrange the vias in specific regions in the corresponding cell is determined, based on the forbidden regions patterned as DLFZ and GLFZ.

In some embodiments, a first guideline is provided to determine whether to arrange the contact vias. For illustration in FIG. 5, when the first guideline is followed, the contact vias are not arranged in the forbidden regions patterned as DLFZ. The first guideline is discussed below with reference to embodiments of FIG. 6A.

In some embodiments, a second guideline is provided to determine whether to arrange the gate vias. For illustration in FIG. 5, when the second guideline is followed, the gate vias are not arranged in the forbidden regions patterned as GLFZ. The second guideline is discussed below with reference to embodiments of FIG. 6B.

Figures 6A, 6B:
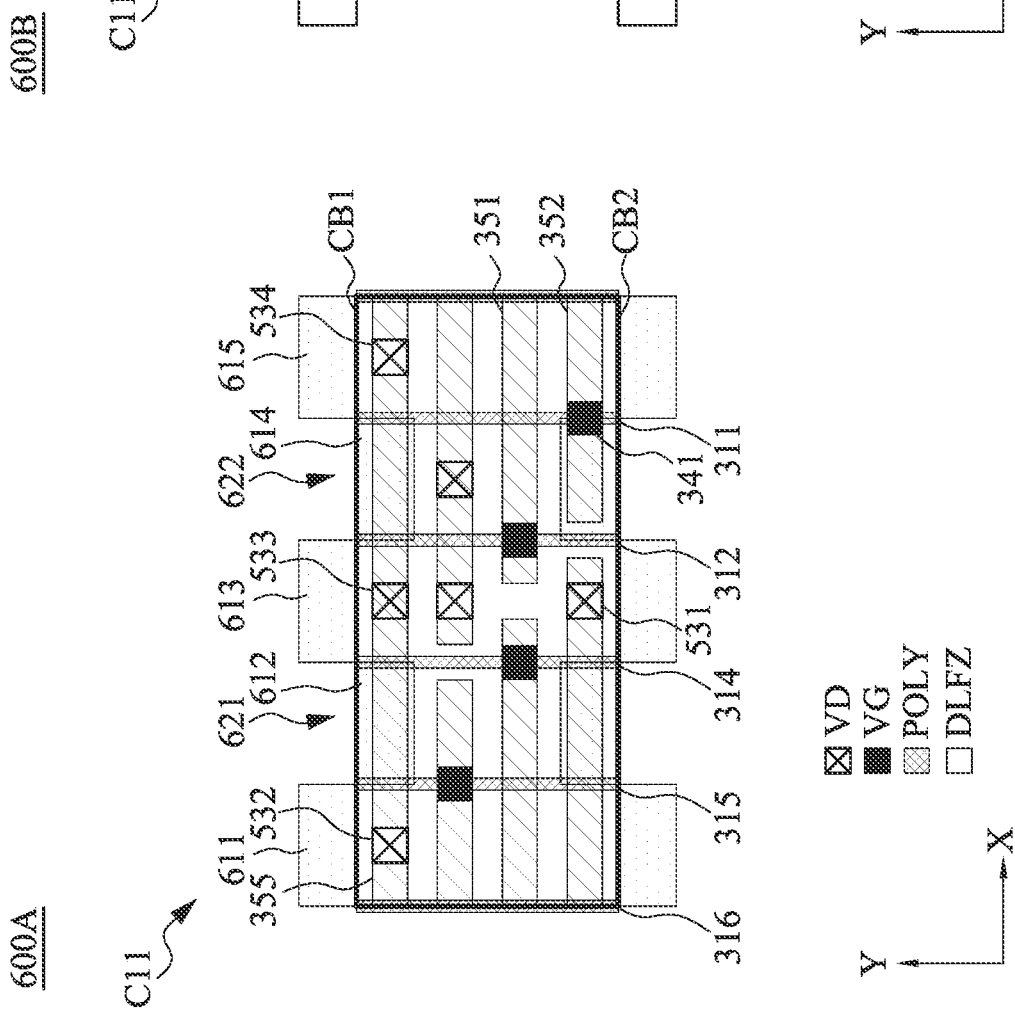
FIGS. 6A-6B are schematic layout diagrams of a semiconductor device corresponding to the semiconductor device in FIG. 5, in accordance with some embodiments of the present disclosure.

Reference is now made to FIGS. 6A-6B. FIGS. 6A-6B are schematic layout diagrams 600A-600B of a semiconductor device, in accordance with some embodiments of the present disclosure. In some embodiments, the layout diagrams 600A and 600B are alternative embodiments of the layout diagram 500 shown in FIG. 5. The layout diagram 600A or 600B has configurations similar to that of the layout diagram 500 as illustrated in FIG. 5, and similar detailed description is therefore omitted. The layout diagrams 600A and 600B with respect to the embodiments of FIG. 5, like elements in FIGS. 6A-6B are designated with the same reference numbers for ease of understanding.

Compared to FIG. 5, in the layout diagram 600A shown in FIG. 6A, the forbidden regions patterned as GLFZ are not illustrated. In the layout diagram 600A, the forbidden regions patterned as DLFZ are disposed along the cell boundaries CB1-CB2, and are separated from each other. Alternatively stated, these forbidden regions are castle-like shaped and arranged regularly along the cell boundaries CB1-CB2. For example, with reference to FIG. 6A, the forbidden regions 611, 612, 613, 614 and 615 are disposed abutting the cell boundary CB1, and some others without labeling are disposed abutting the cell boundary CB2. With respect to the cell boundary CB1, the forbidden regions 611 and 612 are disposed diagonally, and the forbidden regions 613 and 614 are also disposed diagonally, and so on.

As illustrated in FIG. 6A, the forbidden regions 611, 613 and 615 are disposed outside the cell C11, and bottom sides thereof are located at the cell boundary CB1. The forbidden regions 612 and 614 are disposed inside the cell C11, and top sides thereof are located at the cell boundary CB1.

Furthermore, with respect to the Y direction, the forbidden region 612 abuts a region 621. The region 621 is included in the active area in the abutted cell (not shown), and spaces the forbidden regions 611 and 613 apart. Similarly, the forbidden region 614 abuts a region 622. The region 622 is included in the active area in the abutted cell, and spaces the forbidden regions 613 and 615 apart.

Regarding the first guideline, there are some conditions to be followed in the first guideline. When these conditions are satisfied, the contact vias are allowed to be formed with a high density in at least two abutting cells.

One condition of the first guideline is that there is a cell abutting a target cell, for generating another circuit that is other than the circuit generated based on the target cell. For illustration of FIG. 6A, the cell C11 is the target cell, and another cell (not shown) abuts the cell C11.

Another condition of the first guideline is that at least one contact via is arranged in at least one region that abuts the active region in the target cell. For illustration of FIG. 6A, a contact via (not shown) is arranged in the region 621 that abuts a region in the cell C11, which is indicated as the forbidden region 612. Similarly, a contact via (not shown) is arranged in the region 622 that abuts a region in the cell C11, which is indicated as the forbidden region 614.

When the above conditions are satisfied, at least one contact via is allowed to be arranged in the active region in the target cell, excluding the region that abuts the region in the abutted cell arranged with the contact via. For illustration of FIG. 6A, when the contact vias are arranged in the regions 621 and 622, the contact vias 531, 532, 533 and 534 in the cell C11 are arranged outside the forbidden regions 612 and 614 that abut the regions 621 and 622. Accordingly, no contact vias are arranged in the forbidden regions 612 and 614.

Aforementioned configurations of the contact vias in the abutted cells and the forbidden regions patterned as DLFZ are regarded as the first guideline, in some embodiments. When the first guideline is followed, the contact vias 531-533 are disposed in the cell C11 as illustrated in FIG. 6A.

When the abutted cell is substituted with the cell C11 as the target cell, in some embodiments, the first guideline is also provided, to determine where to arrange the contact vias in such abutted cell. For example, with reference to FIG. 6A, when the contact via 532 is disposed in a region that abuts the forbidden region 611, no contact vias are allowed to be disposed in the forbidden region 611. Similarly, when the contact vias 533 and 534 are respectively disposed in regions that abut the forbidden regions 613 and 615, the contact vias are forbade being disposed in the forbidden regions 613 and 615.

Compared to FIG. 5, in the layout diagram 600B shown in FIG. 6B, the forbidden regions patterned as DLFZ are not illustrated. Compared to FIG. 6A, in the layout diagram 600B shown in FIG. 6B, the forbidden regions patterned as GLFZ are illustrated, substituted with the forbidden regions patterned as DLFZ. The forbidden regions in FIG. 6B have configurations similar to that of the forbidden regions in FIG. 6A, and similar detailed description is therefore omitted.

As illustrated in FIG. 6B, the forbidden regions 631, 633 and 635 are disposed outside the cell C11, and top sides thereof are located at the cell boundary CB2. The forbidden regions 632 and 634 are disposed inside the cell C11, and bottom sides thereof are located at the cell boundary CB2. Furthermore, the regions 641 and 642 are included in the active area in another abutted cell (not shown), and respectively space the forbidden regions 631 and 633 apart, and the forbidden regions 633 and 635 apart.

Regarding the second guideline, there are some conditions to be followed in the second guideline. When these conditions are satisfied, the gate vias are allowed to be formed with a high density in at least two abutting cells.

Similar to the conditions followed by the first guideline, the conditions of the second guideline include that there are at least two abutting cells for generating respective circuits, and that at least one gate via is arranged in at least one region of one cell that abuts the active region of the other one cell. For illustration of FIG. 6B, a cell (not shown) and the cell C11 abut to each other. In addition, a gate via (not shown) is arranged in the region 641 that abuts a region in the cell C11, which is indicated as the forbidden region 632. Similarly, a gate via (not shown) is arranged in the region 642 that abuts a region in the cell C11, which is indicated as the forbidden region 634.

When the above conditions are satisfied, at least one gate via is allowed to be arranged in the active region in one of the abutting cells, excluding the region that abuts the region in the other one arranged with that gate via. For illustration of FIG. 6B, when the gate vias are arranged in the regions 641 and 642, the gate via 341 in the cell C11 is arranged outside the forbidden regions 631 and 632 that abut the regions 641 and 642. Accordingly, gate contact vias are not arranged in the forbidden regions 631 and 632.

Aforementioned configurations of the gate vias in the abutted cells and the forbidden regions patterned as GLFZ are regarded as the second guideline, in some embodiments. When the second guideline is followed, the gate via 341 is disposed in the cell C11 as illustrated in FIG. 6B.

When the arrangement of the gate vias in the cell C11 is determined, in some embodiments, the second guideline is also provided to determine where to arrange the gate vias in the abutted cells. For example, with reference to FIG. 6B, when the gate via 341 is disposed in a region that abuts the forbidden region 635, no gate vias are allowed to be disposed in the forbidden region 635.

Compared to the above approaches that vias are arranged adjacent and close to each other in two abutting cells, in the embodiments of the present disclosure, for example with reference to FIGS. 5-6B, in a layout view of the layout diagrams 500-600B, by arranging the forbidden regions patterned as DLFZ and/or GLFZ, it avoids that the gate vias or the contact vias in these abutting cells are placed too close to each other, and it further eases the difficulty of the manufacturing.

In some embodiments, the configurations of the forbidden regions patterned as DLFZ and GLFZ in FIGS. 5-6B are defined by, for illustration in FIGS. 7A-7D, the cell geometry. The cell geometry includes, for example, a cell height, amounts of the gates and signal rails, and intervals between two adjacent gates and between two adjacent signal rails.

Reference is now made to FIGS. 7A-7D. FIGS. 7A-7D are schematic layout diagrams 700A-700D of a semiconductor device, in accordance with some embodiments of the present disclosure. In some embodiments, the layout diagrams 700A-700D are alternative embodiments of the layout diagram 500 shown in FIG. 5 or the layout diagrams 600A-600B shown in FIGS. 6A-6B. For simplicity of illustration, only few elements are shown in FIGS. 7A-7D.

As illustrated in FIG. 7A, a cell (not labeled) is included in the layout diagram 700A. With respect to the Y direction, the cell has a cell height H1 that is substantially equal to a height of a corresponding row where such cell is disposed. The height H1 is also referred to as a cell height H1. In the cell, multiple gates 711-712 are disposed, and are separated from each other by a gate pitch P1, with respect to the X direction. In the cell, also disposed multiple signal rails (not labeled) having the same width, with respect to the Y direction. These signal rails are separated from each other by a signal rail pitch P2, with respect to the Y direction. The signal rail pitch P2 is indicated as a M0 pitch hereinafter.

In some embodiments, the cell height H1 is substantially equal to four times to fifth times of the M0 pitch P2. As such, about four signal rails are disposed in one cell.

In some embodiments, the forbidden regions patterned as DLFZ have sizes that are the same. In some other embodiments, with reference to FIG. 7A, with respect to the X direction, a length L1 of one forbidden region 731 is substantially equal to one gate pitch P1 (i.e., L1=1*P1). With respect to the Y direction, a width W1 of the forbidden region 731 is substantially in a range one M0 pitch P2 to two times of the M0 pitch P2 (i.e., W1=1*P2~2*P2). Therefore, with such configurations, when the forbidden region 731 or 732 is arranged along a top or a bottom boundary of the cell, such forbidden region 731 or 732 is partially overlapped with one signal rail in a layout view.

Regarding the first guideline, arrangement and distribution of the forbidden regions with the above configurations are defined, in some embodiments. Such arrangement and distribution of the forbidden regions discussed with reference to FIGS. 7A-7B are indicated as a first constraint. For example, with reference to FIG. 7A, in one cell, at least two forbidden regions 731 and 732 are arranged between two adjacent gates 711 and 712. Meanwhile, no other forbidden regions are arranged between other two adjacent gates including one of the gates 711 and 712. In another example, with reference to FIG. 7B, at least two forbidden regions 731, 732 and 733 are arranged between the gates 711 and 712, and the forbidden regions 731 and 733 are stacked with respect to the Y direction. Therefore, with the above arrangement and distribution, two adjacent gates 711-712 are arranged with at least two forbidden regions 731-733 therebetween.

Compared to FIG. 7A, in the layout diagram 700C shown in FIG. 7C, the forbidden regions patterned as DLFZ have different arrangement and distribution.

As discussed above, when the first guideline is followed, the contact vias has a distribution with a high density in at least two abutting cells. For example, with reference back to FIG. 2, in the cells C11 and C21, especially at an area (not labeled) that is across the cell boundary CB1 thereof, the contact vias 211-212 and 221-222 have a high density configuration. In such region, a distance D1 between the contact vias 211 and 221 is substantially equal to two times of the gate pitch P1 (i.e., D1=2*P1). These two contact vias 211 and 221 are separated from each other by one forbidden region patterned as LFZ, with respect to the Y direction. A distance D2 between the contact vias 211 and 212 is substantially equal to two times of the M0 pitch P2 (i.e., D2=2*P2). These two contact vias 211 and 212 are separated from each other by another forbidden region, with respect to the X direction. A distance D3 between the contact vias 211 and 222 is substantially equal to a square root of a sum of the gate pitch P1 squared and the M0 pitch P2 squared (i.e., D3=$\sqrt{P1^2+P2^2}$). These two contact vias are separated from each other and arranged diagonally. In some embodiments, the vias 212 and 222 is spaced apart by the distance D3.

Regarding the first guideline, another arrangement and distribution of the forbidden regions are defined, in some embodiments. Such arrangement and distribution of the forbidden regions discussed with reference to FIGS. 7C-7D are indicated as a second constraint. For example, with reference to FIG. 7C, in one cell, at least one forbidden region 752 is arranged between two adjacent gates 711 and 712. Meanwhile, at least one forbidden region 751 or 753 is also arranged between other two adjacent gates including one of the gates 711 and 712. In another example, with reference to FIG. 7D, at least one forbidden regions 751, 752, 753 and 754 are arranged between every two gates 711 and 712, and the forbidden regions 753 and 754 are stacked with respect to the Y direction. Therefore, with the above arrangement and distribution, every two adjacent gates 711-712 are arranged with at least one forbidden regions 751-754 therebetween.

In some embodiments, the forbidden regions patterned as GLFZ shown in FIGS. 5 and 6B and the forbidden regions patterned as DLFZ have similar configurations as discussed above with reference to FIGS. 7A-7D.

In some embodiments, the forbidden regions patterned as GLFZ shown in FIGS. 5 and 6B, regarding the second guideline, have similar arrangement and distribution as the forbidden regions patterned as DLFZ. Alternatively stated, the second guideline includes similar constraints, including the first and the second constraints, in the first guideline, as discussed above with reference to FIGS. 7A-7B and FIGS. 7C-7D respectively. The difference between the forbidden regions patterned as GLFZ and that patterned as DLFZ is a relative placement between the forbidden regions and the gates. For example, with reference to FIG. 6B, in the cell C11, the forbidden regions 632 and 634 are overlapped with the gates 315 and 312. A middle of each of the forbidden regions 632 and 634 are substantially aligned with the gates 315 and 312, with respect to the Y direction. On the other hand, with reference to FIG. 6A, in the cell C11, the forbidden regions 612 and 614 are arranged between the adjacent gates 314-315 and between the adjacent gates 311-312.

Figure 8:
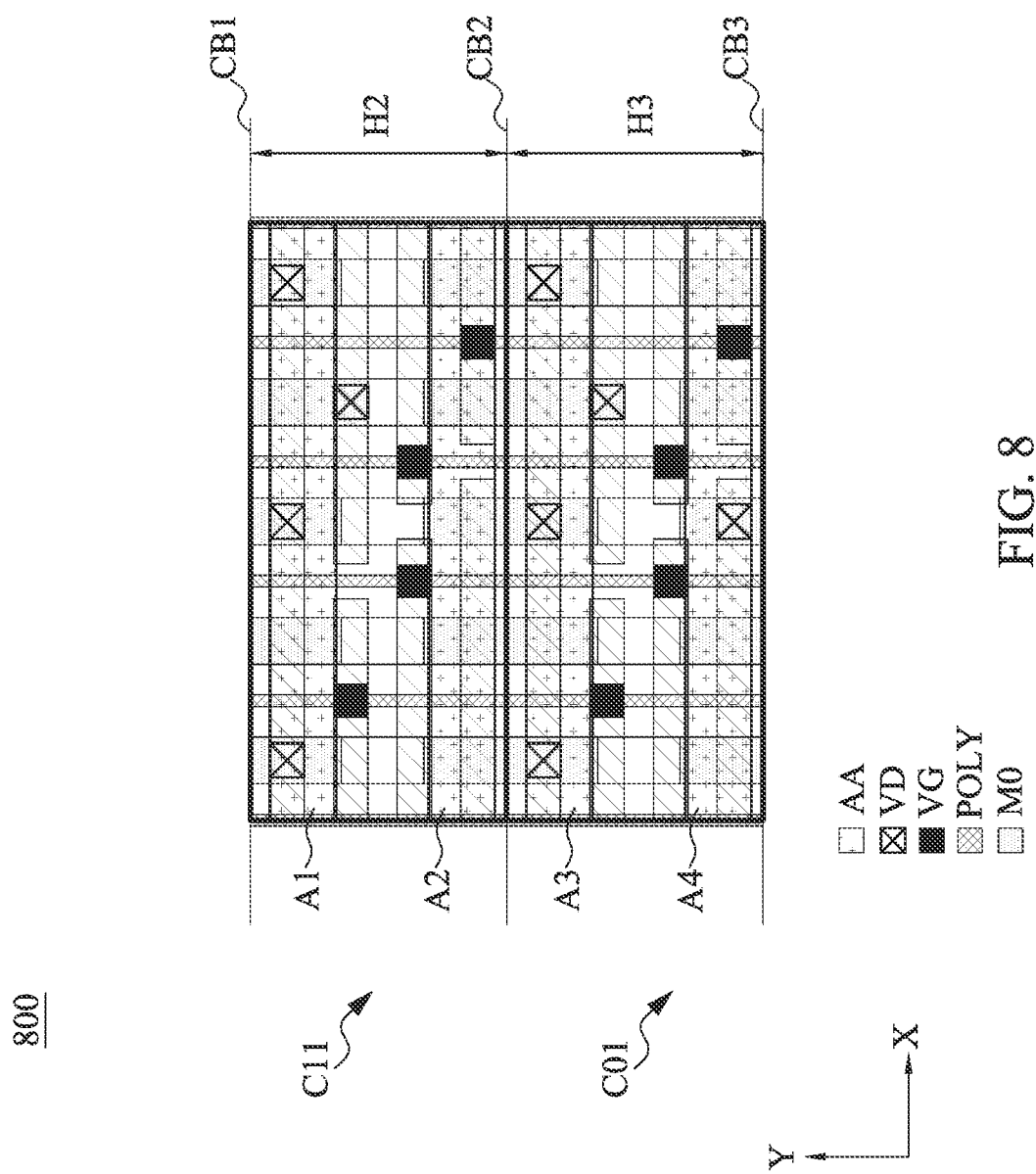
FIG. 8 is a schematic layout diagram of a semiconductor device, which includes single height cells, corresponding to the semiconductor device in FIG. 2, in accordance with some embodiments of the present disclosure.

Reference is now made to FIG. 8. FIG. 8 is a schematic layout diagram 800 of a semiconductor device, in accordance with some embodiments of the present disclosure. In some embodiments, the layout diagram 800 is an alternative embodiment of the layout diagrams 200 or 500 shown in FIG. 2 or 5. In various embodiments, the layout diagram 800 is utilized to fabricate the semiconductor device 300 in FIGS. 3A-4B or the semiconductor device 1700 in FIGS. 17-18C. The correspondence between a given layout diagram feature formed based on the given layout diagram feature, a same reference designator is used in each of the layout diagram and structure depictions, as discussed below. For simplicity of illustration, only few elements are labeled in FIG. 8. The layout diagram 800 with respect to the embodiments of FIGS. 2-5, like elements in FIG. 8 are designated with the same reference numbers for ease of understanding.

As illustrated in FIG. 8, two single height cells C11 and C01 are included in the layout diagram 800. The cell C11 is defined between the cell boundaries including CB1 and CB2. In the cell C11, active areas A1 and A2 are arranged and include various doped materials. In some embodiments, regarding the single height cell C11, the cell boundary CB1 is defined corresponding to the active area A1, and another boundary CB2 is defined corresponding to the active area A2. Similarly, the cell C01 is defined between the cell boundaries including CB2 and CB3. In the cell C01, active areas A3 and A4 are arranged and include various doped materials. In some embodiments, regarding the single height cell C01, the cell boundary CB2 is defined corresponding to the active area A3, and another boundary CB3 is defined corresponding to the active area A.

In some embodiments, the active area A1 is made of n-type doped material, and a cell boundary CB1 of the cell C11 is located adjacent to the active area A1. In some embodiments, the active area A2 is made of p-type doped material, and a cell boundary CB2 of the cell C11 is located adjacent to the active area A2. Furthermore, the cell boundary CB2 of the cell C01 is also located adjacent to the active area A3 that is made of p-type doped material. In some embodiments, the active area A4 is made of n-type doped material, and a cell boundary CB3 of the cell C01 is located adjacent to the active area A4.

In some embodiments, with reference to FIG. 8, with respect to the Y direction, the cell C11 has a cell height H2, and the cell C01 has a cell height H3. In some embodiments, cell C11 corresponds to the cell C11 illustrated in at least FIGS. 5-7B. In some other embodiments, the cell height H2 is equal to the cell height H1. In various embodiments, the cell heights H1-H3 are the same. In some embodiments, at least one of the cell heights H1-H3 is different from the others.

To implement various semiconductor devices included in an IC, the layout diagrams as discussed above with reference to FIGS. 1, 2, 5, 6A-6B, 7A-7D and 8 are used or modified to be used, as illustrated by the non-limiting examples discussed below with respect to FIGS. 9A-14B. These semiconductor devices correspond to the semiconductor device 300 discussed with reference FIGS. 3A-4B or the semiconductor devices 1700 discussed with reference FIGS. 17-18C. In the various embodiments discussed below, the semiconductor device or the IC of the present disclosure is implemented through the use of layout diagrams, including the single height cell, depicted in FIGS. 9B-9D, 10B-10D, 11B-11D, 12B-12D, 13B-13D and 14B that correspond to circuit diagrams depicted in FIGS. 9A, 10A, 11A, 12A, 13A and 14A, as indicated. It is noted that these layout diagrams merely illustrate a front side of the corresponding semiconductor device, and are provided when the guidelines with various constraints are followed as discussed above with reference to FIGS. 5-7D.

Reference is now made to FIG. 9A. FIG. 9A is a circuit diagram of an IC 900A, in accordance with some embodiments of the present disclosure. In some embodiments, the IC 900A is used as one unit cell/circuit for implementing an inverter.

For illustration of the IC 900A, a gate terminal of a PMOS transistor P1 is coupled to a gate terminal of a NMOS transistor N1 as indicated by connection I. In some embodiments, the connection I is indicated as an input terminal, for providing a control signal to both of the PMOS transistor P1 and the NMOS transistor N1.

A source/drain terminal of the PMOS transistor P1 is coupled to a node A1. A source/drain terminal of the PMOS transistor P1 is coupled to a node A2. A source/drain terminal of the NMOS transistor N1 is coupled to a node B1. A source/drain terminal of the NMOS transistor N2 is coupled to a node B2. The node A1 is further coupled to a power rail referenced as VDD. The nodes B1 is further coupled to another power rail referenced as VSS. The node A2 is further coupled to the node B2 as indicated by a connection ZN. To implement the IC 900A, embodiments of layout designs and/or structures are provided and discussed below as illustrated with reference to FIGS. 9B-9D.

Figure 9D:
Figure 9C:
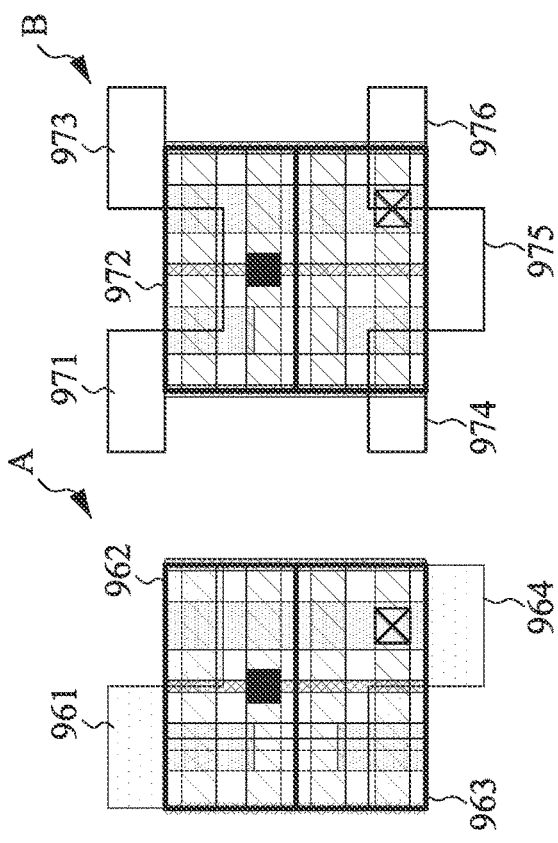

For clarification of demonstrating various forbidden regions patterned as DLFZ and GLFZ, the following layout diagrams 900B-900D in FIGS. 9B-9D have separate diagrams A and B for illustrating the patterns DLFZ and GLFZ, respectively. In addition, for simplicity of illustration, similar elements are not repeatedly labeled in the layout diagrams 900B-900D, and similar detailed description is therefore omitted.

FIG. 9B is a layout diagram 900B of the IC 900A in FIG. 9A, in accordance with some embodiments of the present disclosure. The layout diagram 900B is provided in diagram A of FIG. 9B by following the first guideline with the first constraint. The layout diagram 900B is also provided in diagram B of FIG. 9B by following the second guideline with the first constraint.

As illustrated in diagram A of FIG. 9B, a gate 911 is arranged as the gate terminals of PMOS transistor P1 and NMOS transistor N1 in FIG. 9A. MD segments 921, 922 and 923 are arranged as sources/drains of PMOS transistor P1 or NMOS transistor N1 in FIG. 9A.

The gate 911 and the MD segments 921 and 922 together correspond to the PMOS transistor P1. The gate 911 and the MD segments 923 and 922 together correspond to the NMOS transistor N1. In such embodiments, the PMOS transistor P1 share the MD segment 922, which corresponds to the PMOS transistor P1 being coupled at the nodes A2 and B2 together illustrated in FIG. 9A. It also corresponds to the nodes A2 and B2 being coupled between the connection ZN illustrated in FIG. 9A.

A contact via 931 is arranged. Signal rails 951 and 952 are arranged. The contact via 931 couples the MD segment 922 to the signal rail 952.

A gate via 941 is arranged. The gate via 941 couples the gate 911 to the signal rail 951, which corresponds to the gate of the PMOS transistor P1 or NMOS transistor N1 being coupled between the connection I as discussed above with respect to FIG. 9A.

Backside vias (not shown) are arranged at a back side of the same cell illustrated in the layout diagram 900B. One of the backside vias couples the MD segment 921 to a backside power rail (not shown), which corresponds to the node A1 being coupled to the power rail VDD as discussed above with respect to FIG. 9A. The other one of the backside vias (not shown) couples the MD segment 923 to a backside power rail (not shown), which corresponds to the node B1 being coupled to the power rail VSS as discussed above with respect to FIG. 9A.

The forbidden regions 961, 962, 963 and 964 are arranged. The forbidden regions 961-964 correspond to the forbidden regions 611-615 as discussed above with reference to FIGS. 5-6A. The arrangement and distribution of the forbidden regions 961-964 further correspond to that is discussed above with reference to FIGS. 7A-7B. Therefore, with such configurations, no contact vias are formed in the forbidden regions 961-964.

Compared to diagram A of FIG. 9B, in the layout diagram 900B shown in diagram B of FIG. 9B, the forbidden regions 971, 972, 973, 974, 975 and 976 are arranged. The forbidden regions 971-976 correspond to the forbidden regions 631-636 as discussed above with reference to FIGS. 5 and 6B. The arrangement and distribution of the forbidden regions 971-976 correspond to that is discussed above with reference to FIGS. 7A-7B. Therefore, with such configurations, no gate vias are formed in the forbidden regions 971-976.

FIG. 9C is a layout diagram 900C of the IC 900A in FIG. 9A, in accordance with some embodiments of the present disclosure. The layout diagram 900C is provided in diagram A of FIG. 9C by following the first guideline with the second constraint. The layout diagram 900C is also provided in diagram B of FIG. 9B by following the second guideline with the second constraint.

Compared to diagram A of FIG. 9B, in the layout diagram 900C shown in diagram A of FIG. 9C, the forbidden regions 961-964 are arranged at different locations, with consideration of the second constraint. The arrangement and distribution of the forbidden regions 961-964 correspond to that is discussed above with reference to FIGS. 7C-7D. Therefore, with such configurations, no contact vias are formed in the forbidden regions 961-964.

Compared to diagram B of FIG. 9B, in the layout diagram 900C shown in diagram B of FIG. 9C, the forbidden regions 971-976 are arranged at different locations, with consideration of the second constraint. The arrangement and distribution of the forbidden regions 971-976 correspond to that is discussed above with reference to FIGS. 7C-7D. Therefore, with such configurations, no gate vias are formed in the forbidden regions 971-976.

FIG. 9D is a layout diagram 900D of the IC 900A in FIG. 9A, in accordance with some embodiments of the present disclosure. The layout diagram 900D is provided in diagram A of FIG. 9D by following the first guideline with the first constraint. The layout diagram 900D is also provided in diagram B of FIG. 9D by following the second guideline with the second constraint.

The layout diagram 900D in diagram A of FIG. 9D and the layout diagram 900B in diagram A of FIG. 9B are the same, followed by the first guideline with the first constraint. The layout diagram 900D in diagram B of FIG. 9D and the layout diagram 900C in diagram B of FIG. 9C are the same, followed by the second guideline with the second constraint. As such, no detailed discussion herein.

Figure 10A:
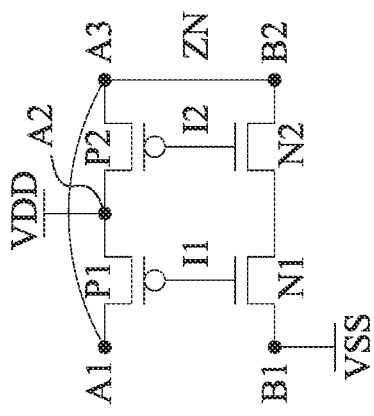
FIG. 10A is a circuit diagram of an IC, in accordance with some embodiments of the present disclosure.

Reference is now made to FIG. 10A. FIG. 10A is a circuit diagram of an IC 1000A, in accordance with some embodiments of the present disclosure. In some embodiments, the IC 1000A is used as one unit cell/circuit for implementing an NAND gate.

For illustration of the IC 1000A, a gate terminal of a PMOS transistor P1 is coupled to a gate terminal of a NMOS transistor N1 as indicated by a connection I1. A gate terminal of a PMOS transistor P2 is coupled to a gate terminal of a NMOS transistor N2 as indicated by a connection I2. In some embodiments, the connections I1 and I2 are indicated as input terminals, for providing corresponding control signals to both of the PMOS transistor P1 and the NMOS transistor N1, and both of the PMOS transistor P2 and the NMOS transistor N2, respectively.

A source/drain terminal of the PMOS transistor P1 is coupled to a node A1; a source/drain terminal of the PMOS transistor P1 is coupled to a source/drain terminal of the PMOS transistor P2 at a node A2; and a source/drain terminal of the PMOS transistor P2 is coupled at a node A3. The node A1 is further coupled to the node A3. The node A2 is further coupled to a power rail referenced as VDD. A source/drain terminal of the NMOS transistor N1 is coupled to a node B1; a source/drain terminal of the NMOS transistor N1 is coupled to a source/drain terminal of the NMOS transistor N2; and a source/drain terminal of the NMOS transistor N2 is coupled at a node B2. The node B1 is further coupled to a power rail referenced as VSS. The node B2 is further coupled to the node A3 as indicated by a connection ZN. To implement the IC 1000A, embodiments of layout designs and/or structures are provided and discussed below as illustrated with reference to FIGS. 10B-10D.

Figure 10B:
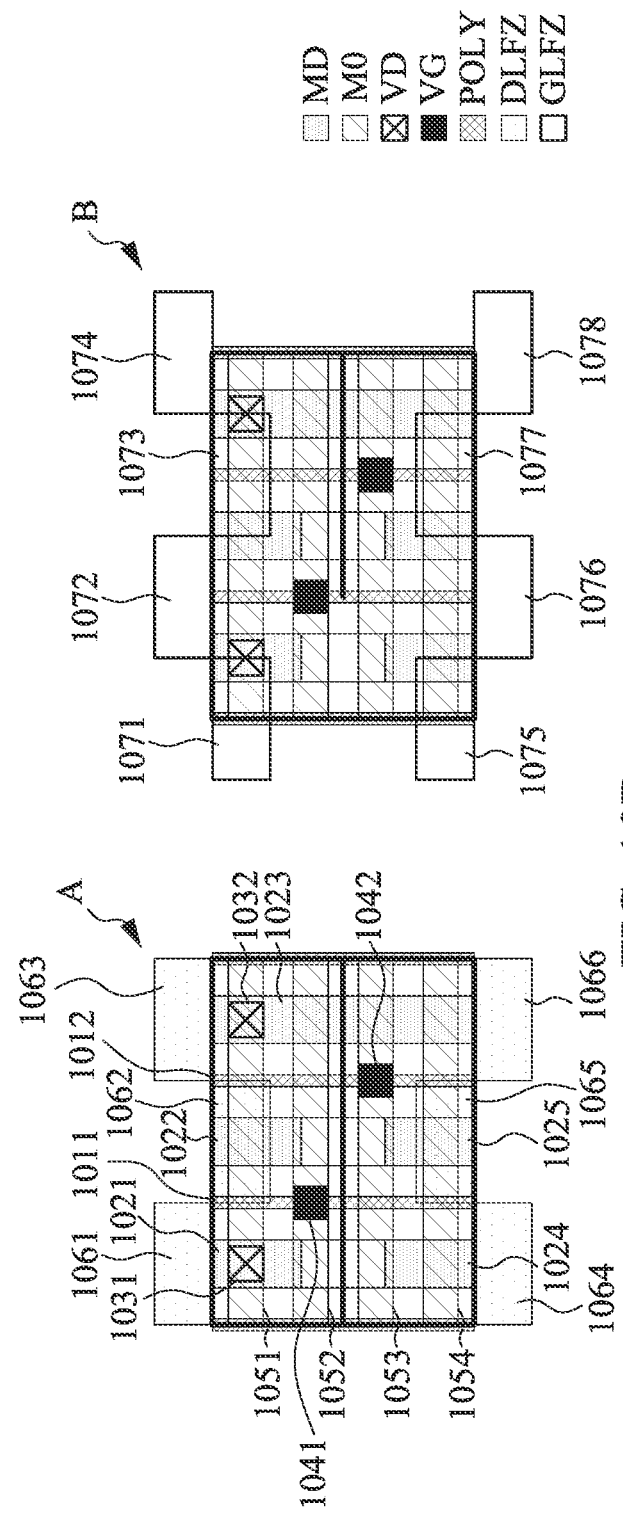
FIGS. 10B-10D are layout diagrams of an IC corresponding to the IC of FIG. 10A, in accordance with some embodiments of the present disclosure.
Figure 10C:
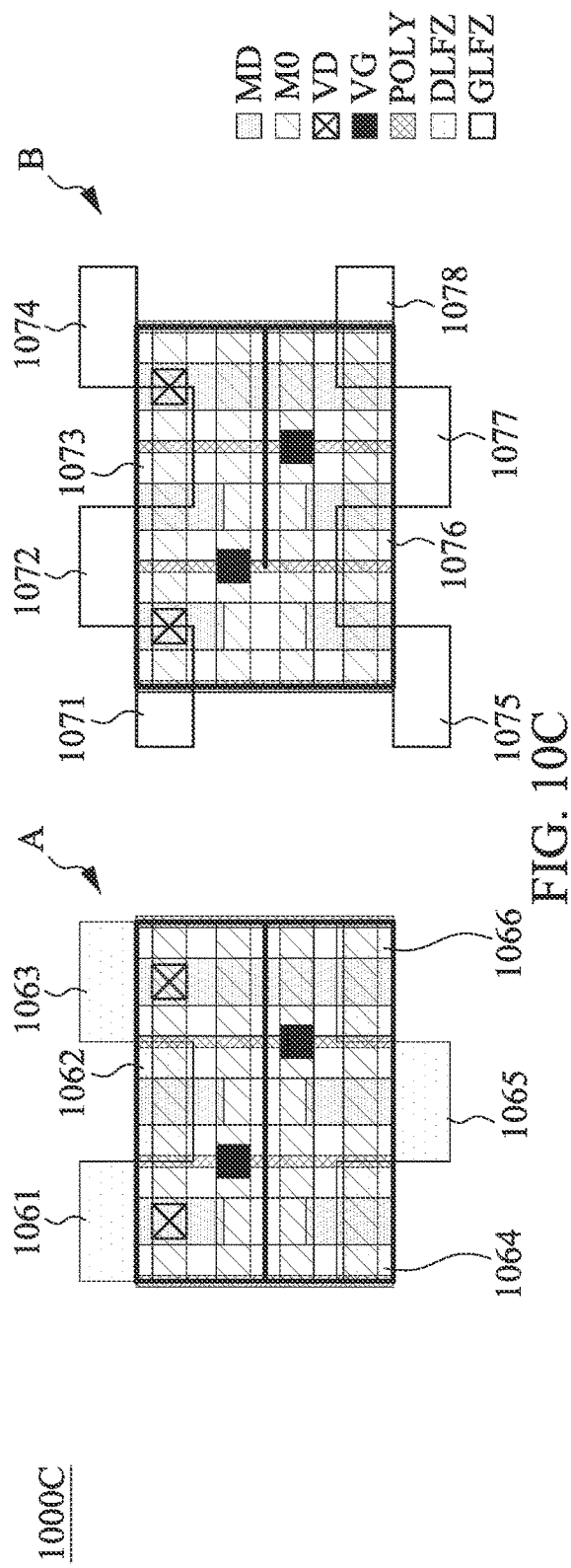
Figure 10D:
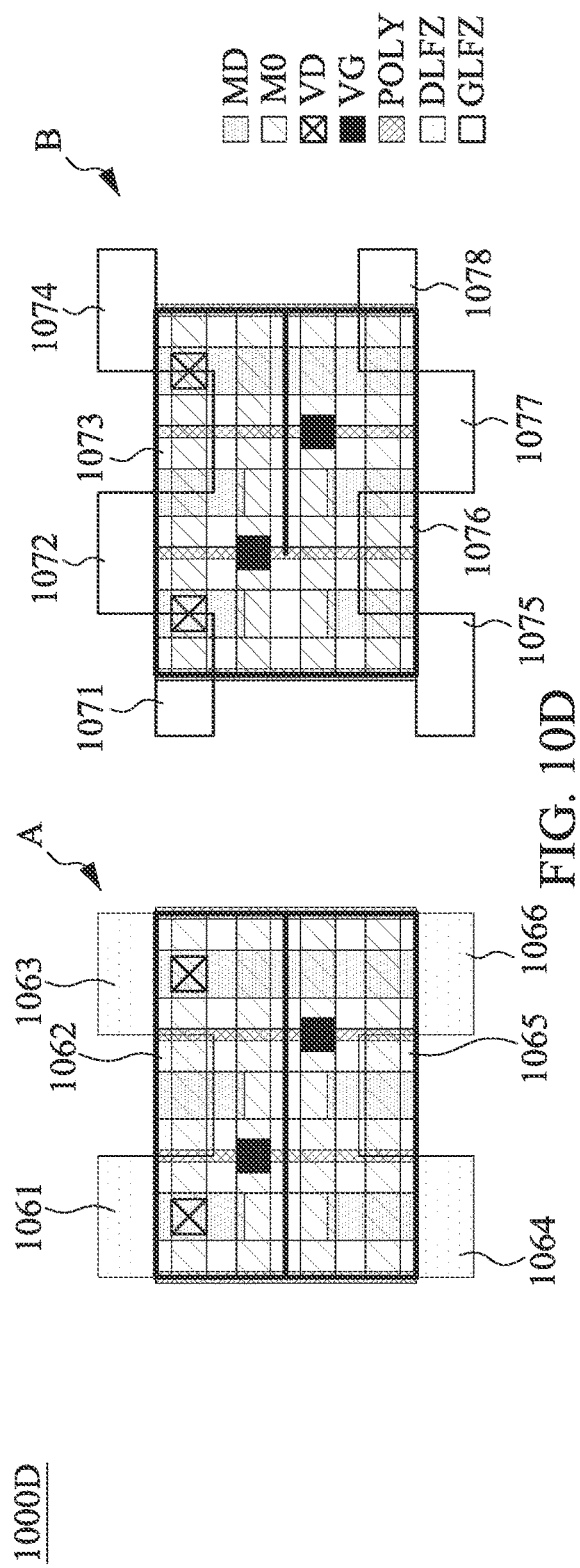

For clarification of demonstrating various forbidden regions patterned as DLFZ and GLFZ, the following layout diagrams 1000B-1000D in FIGS. 10B-10D have separate diagrams A and B for illustrating the patterns DLFZ and GLFZ, respectively. In addition, for simplicity of illustration, similar elements are not repeatedly labeled in the layout diagrams 1000B-1000D, and similar detailed description is therefore omitted.

FIG. 10B is a layout diagram 1000B of the IC 1000A in FIG. 10A, in accordance with some embodiments of the present disclosure. The layout diagram 1000B is provided in diagram A of FIG. 10B by following the first guideline with the first constraint. The layout diagram 1000B is also provided in diagram B of FIG. 10B by following the second guideline with the first constraint.

As illustrated in diagram A of FIG. 10B, gates 1011 and 1012 are arranged as gate terminals of PMOS transistors P1-P2 or NMOS transistors N1-N2 in FIG. 10A. MD segments 1021, 1022, 1023, 1024 and 1025 are arranged as source/drain terminals of PMOS transistors P1-P2 or NMOS transistors N1-N2 in FIG. 10A.

The gate 1011 and the MD segments 1021 and 1022 together correspond to the PMOS transistor P1. The gate 1012 and the MD segments 1022 and 1023 together correspond to the PMOS transistor P2. In such configurations, the PMOS transistors P1 and P2 share the MD segment 1022, which corresponds to the PMOS transistors P1 and P2 being coupled at the node A2 illustrated in FIG. 10A. The gate 1011 and the MD segments 1024 and 1025 together correspond to the NMOS transistor N1. The gate 1012 and the MD segments 1025 and 1023 together correspond to the NMOS transistor N2. In such configurations, the PMOS transistor P2 and the NMOS transistor N2 share the MD segment 1023, which corresponds to the PMOS transistor P2 and the NMOS transistor N2 being coupled together illustrated in FIG. 10A. It also corresponds to the nodes A3 and B2 being coupled between the connection ZN illustrated in FIG. 10A.

Contact vias 1031 and 1032 are arranged. Signal rails 1051, 1052, 1053 and 1054 are arranged. The contact via 1031 couples the MD segment 1021 to the signal rail 1051. The contact via 1032 couples the MD segment 1023 to the signal rail 1051. With such configurations, the MD segments 1021 and 1023 are coupled together, which corresponds to the nodes A1 and A3 being coupled together as discussed above with respect to FIG. 10A.

Gate vias 1041 and 1042 are arranged. The gate via 1041 couples the gate 1011 to the signal rail 1052, which corresponds to the gate of the PMOS transistor P1 or NMOS transistor N1 being coupled between the connection I1 as discussed above with respect to FIG. 10A. The gate via 1042 couples the gate 1012 to the signal rail 1053, which corresponds to the gate of the PMOS transistor P2 or NMOS transistor N2 being coupled between the connection I2 as discussed above with respect to FIG. 10A.

Backside vias (not shown) are arranged at a back side of the same cell illustrated in the layout diagram 1000B. One of the backside vias couples the MD segment 1022 to a backside power rail (not shown), which corresponds to the node A2 being coupled to the power rail VDD as discussed above with respect to FIG. 10A. The other one of the backside vias (not shown) couples the MD segment 1024 to a backside power rail (not shown), which corresponds to the node B1 being coupled to the power rail VSS as discussed above with respect to FIG. 10A.

The forbidden regions 1061, 1062, 1063, 1064, 1065 and 1066 are arranged. The forbidden regions 1061-1066 correspond to the forbidden regions 611-615 as discussed above with reference to FIGS. 5-6A. The arrangement and distribution of the forbidden regions 1061-1066 further correspond to that is discussed above with reference to FIGS. 7A-7B. Therefore, with such configurations, no contact vias are formed in the forbidden regions 1061-1066.

Compared to diagram A of FIG. 10B, in the layout diagram 1000B shown in diagram B of FIG. 10B, the forbidden regions 1071, 1072, 1073, 1074, 1075, 1076, 1077 and 1078 are arranged. The forbidden regions 1071-1078 correspond to the forbidden regions 631-636 as discussed above with reference to FIGS. 5 and 6B. The arrangement and distribution of the forbidden regions 1071-1078 correspond to that is discussed above with reference to FIGS. 7A-7B. Therefore, with such configurations, no gate vias are formed in the forbidden regions 1071-1078.

FIG. 10C is a layout diagram 1000C of the IC 1000A in FIG. 10A, in accordance with some embodiments of the present disclosure. The layout diagram 1000C is provided in diagram A of FIG. 10C by following the first guideline with the second constraint. The layout diagram 1000C is also provided in diagram B of FIG. 10B by following the second guideline with the second constraint.

Compared to diagram A of FIG. 10B, in the layout diagram 1000C shown in diagram A of FIG. 10C, the forbidden regions 1061-1066 are arranged at different locations, with consideration of the second constraint. The arrangement and distribution of the forbidden regions 1061-1066 correspond to that is discussed above with reference to FIGS. 7C-7D. Therefore, with such configurations, no contact vias are formed in the forbidden regions 1061-1066.

Compared to diagram B of FIG. 10B, in the layout diagram 1000C shown in diagram B of FIG. 10C, the forbidden regions 1071-1078 are arranged at different locations, with consideration of the second constraint. The arrangement and distribution of the forbidden regions 1071-1078 correspond to that is discussed above with reference to FIGS. 7C-7D. Therefore, with such configurations, no gate vias are formed in the forbidden regions 1071-1078.

FIG. 10D is a layout diagram 1000D of the IC 1000A in FIG. 10A, in accordance with some embodiments of the present disclosure. The layout diagram 1000D is provided in diagram A of FIG. 10D by following the first guideline with the first constraint. The layout diagram 1000D is also provided in diagram B of FIG. 10D by following the second guideline with the second constraint.

The layout diagram 1000D in diagram A of FIG. 10D and the layout diagram 1000B in diagram A of FIG. 10B are the same, followed by the first guideline with the first constraint. The layout diagram 1000D in diagram B of FIG. 10D and the layout diagram 1000C in diagram B of FIG. 10C are the same, followed by the second guideline with the second constraint. As such, no detailed discussion herein.

Figure 11A:
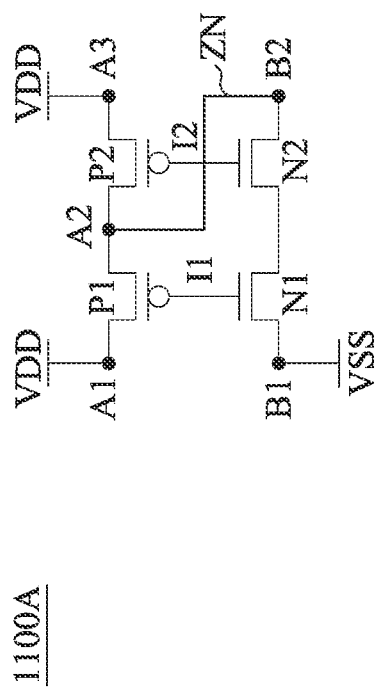
FIG. 11A is a circuit diagram of an IC, in accordance with some embodiments of the present disclosure.

Reference is now made to FIG. 11A. FIG. 11A is a circuit diagram of an IC 1100A, in accordance with some embodiments of the present disclosure. In some embodiments, the IC 1100A is an alternative embodiments of the IC 1000A shown in FIG. 10A. The circuit diagram of the IC 1100A has configurations similar to that of the IC 1000A as illustrated in FIG. 10A, and similar detailed description is therefore omitted.

Compared to FIG. 10A, in the circuit diagram shown in FIG. 11A, the nodes A1 and A3 are respectively coupled to a power rail referenced as VDD. The node A2 is coupled to the node B2 as indicated by connection ZN shown in FIG. 11A. To implement the IC 1100A, embodiments of layout designs and/or structures are provided and discussed below as illustrated with reference to FIGS. 11B-11D.

Figure 11B:
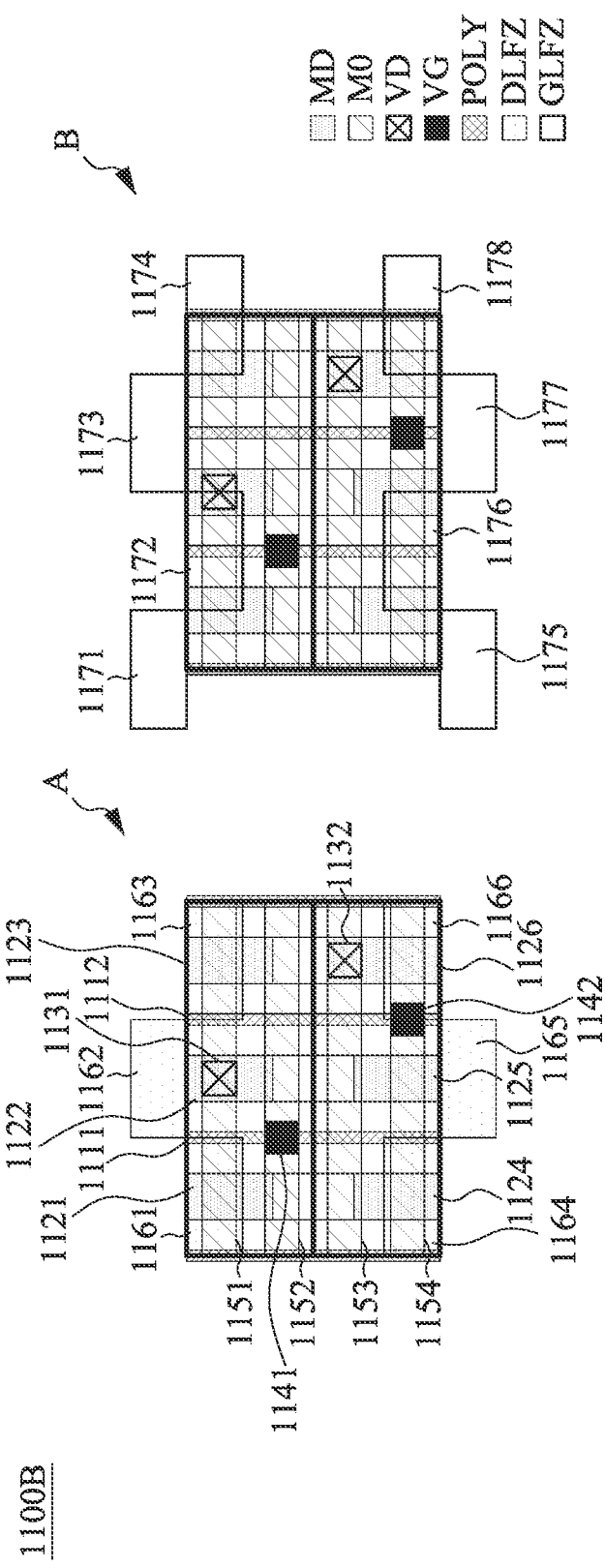
FIGS. 11B-11D are layout diagrams of an IC corresponding to the IC of FIG. 11A, in accordance with some embodiments of the present disclosure.
Figure 11C:
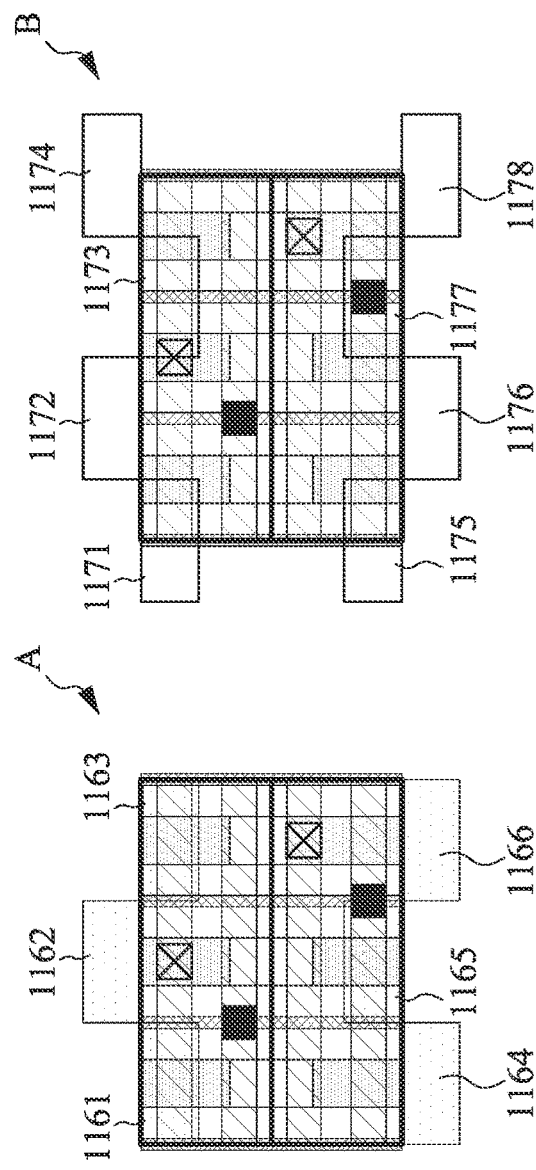
Figure 11D:
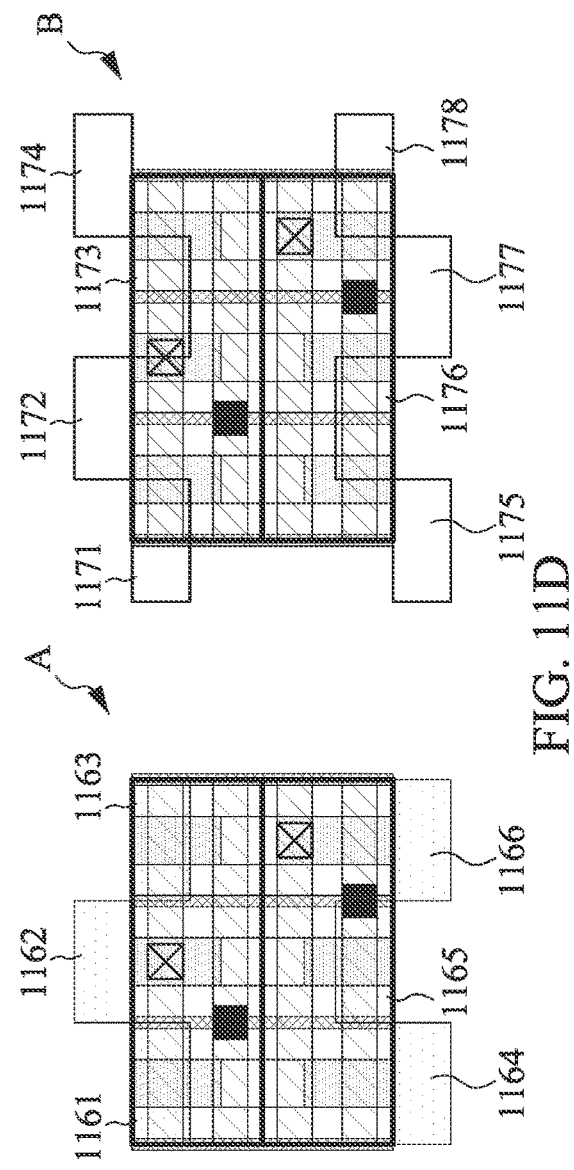

For clarification of demonstrating various forbidden regions patterned as DLFZ and GLFZ, the following layout diagrams 1100B-1100D in FIGS. 11B-11D have separate diagrams A and B for illustrating the patterns DLFZ and GLFZ, respectively. In addition, for simplicity of illustration, similar elements are not repeatedly labeled in the layout diagrams 1100B-1100D, and similar detailed description is therefore omitted.

FIG. 11B is a layout diagram 1100B of the IC 1100A in FIG. 11A, in accordance with some embodiments of the present disclosure. The layout diagram 1100B is provided in diagram A of FIG. 11B by following the first guideline with the first constraint. The layout diagram 1100B is also provided in diagram B of FIG. 11B by following the second guideline with the first constraint.

As illustrated in diagram A of FIG. 11B, gates 1111 and 1112 are arranged as gate terminals of PMOS transistors P1-P2 or NMOS transistors N1-N2 in FIG. 11A. MD segments 1121, 1122, 1123, 1124, 1125 and 1126 are arranged as source/drain terminals of PMOS transistors P1-P2 or NMOS transistors N1-N2 in FIG. 11A.

The gate 1111 and the MD segments 1121 and 1122 together correspond to the PMOS transistor P1. The gate 1112 and the MD segments 1122 and 1123 together correspond to the PMOS transistor P2. In such embodiments, the PMOS transistors P1 and P2 share the MD segment 1122, which corresponds to the PMOS transistors P1 and P2 being coupled at the node A2 illustrated in FIG. 11A. The gate 1111 and the MD segments 1124 and 1125 together correspond to the NMOS transistor N1. The gate 1112 and the MD segments 1125 and 1126 together correspond to the NMOS transistor N2.

Contact vias 1131 and 1132 are arranged. Signal rails 1151, 1152, 1153 and 1154 are arranged. The contact via 1131 couples the MD segment 1122 to the signal rail 1151. The contact via 1132 couples the MD segment 1126 to the signal rail 1153. With such configurations, the MD segments 1122 and 1126 are coupled together, which corresponds to the nodes A2 and B2 being coupled together as discussed above with respect to FIG. 11A. It also corresponds to the nodes A2 and B2 being coupled between the connection ZN illustrated in FIG. 11A.

Gate vias 1141 and 1142 are arranged. The gate via 1141 couples the gate 1111 to the signal rail 1152, which corresponds to the gate of the PMOS transistor P1 or NMOS transistor N1 being coupled between the connection I1 as discussed above with respect to FIG. 11A. The gate via 1142 couples the gate 1112 to the signal rail 1154, which corresponds to the gate of the PMOS transistor P2 or NMOS transistor N2 being coupled between the connection I2 as discussed above with respect to FIG. 11A.

Backside vias (not shown) are arranged at a back side of the same cell illustrated in the layout diagram 1100B. The backside vias couple the MD segments 1121 and 1123 to a backside power rail (not shown), which respectively corresponds to the nodes A1 and A3 being coupled to the power rail VDD as discussed above with respect to FIG. 11A. The other one of the backside vias (not shown) couples the MD segment 1124 to a backside power rail (not shown), which corresponds to the node B1 being coupled to the power rail VSS as discussed above with respect to FIG. 11A.

The forbidden regions 1161, 1162, 1163, 1164, 1165 and 1166 are arranged. The forbidden regions 1161-1166 correspond to the forbidden regions 1061-1066 shown in FIG. 10B, which is not detailed herein.

Compared to diagram A of FIG. 11B, in the layout diagram 1100B shown in diagram B of FIG. 11B, the forbidden regions 1171, 1172, 1173, 1174, 1175, 1176, 1177 and 1178 are arranged. The forbidden regions 1071-1078 correspond to the forbidden regions 1071-1078 shown in FIG. 10B, which is not detailed herein.

FIG. 11C is a layout diagram 1100C of the IC 1100A in FIG. 11A, in accordance with some embodiments of the present disclosure. The layout diagram 1100C is provided in diagram A of FIG. 11C by following the first guideline with the second constraint. The layout diagram 1100C is also provided in diagram B of FIG. 11B by following the second guideline with the second constraint. In some embodiments, the forbidden regions 1161-1166 correspond to the forbidden regions 1061-1066 shown in FIG. 10C, which is not detailed herein. In some embodiments, the forbidden regions 1171-1178 correspond to the forbidden regions 1071-1078 shown in FIG. 10C, which is not detailed herein.

FIG. 11D is a layout diagram 1100D of the IC 1100A in FIG. 11A, in accordance with some embodiments of the present disclosure. The layout diagram 1100D is provided in diagram A of FIG. 11D by following the first guideline with the first constraint. The layout diagram 1100D is also provided in diagram B of FIG. 11D by following the second guideline with the second constraint. In some embodiments, the forbidden regions 1161-1166 correspond to the forbidden regions 1061-1066 shown in FIG. 10D which is not detailed herein. In some embodiments, the forbidden regions 1171-1178 correspond to the forbidden regions 1071-1078 shown in FIG. 10D, which is not detailed herein.

Figure 12A:
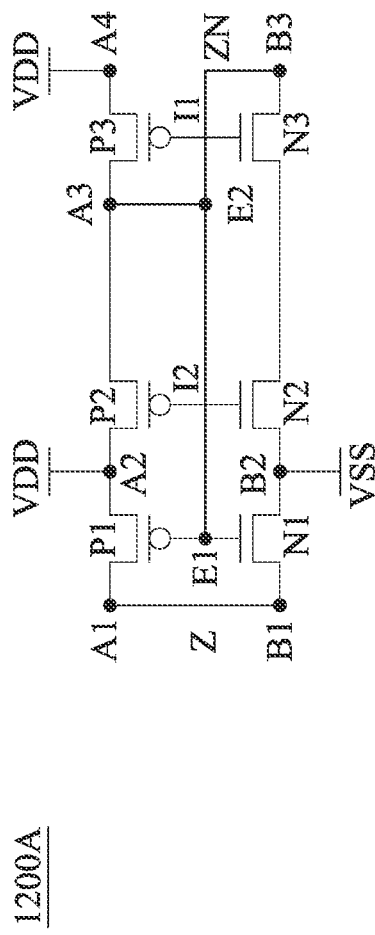
FIG. 12A is a circuit diagram of an IC, in accordance with some embodiments of the present disclosure.

Reference is now made to FIG. 12A. FIG. 12A is a circuit diagram of an IC 1200A, in accordance with some embodiments of the present disclosure. In some embodiments, the IC 1200A is used as one unit cell/circuit for implementing two different logic functions including, for example, a AND gate which is a combination of an NAND gate function and an inverse function.

For illustration of the IC 1200A, a gate terminal of a PMOS transistor P1 is coupled to a gate terminal of a NMOS transistor N1 at a node E1; a gate terminal of a PMOS transistor P2 is coupled to a gate terminal of a NMOS transistor N2 as indicated by connection I2; and a gate terminal of a PMOS transistor P3 is coupled to a gate terminal of a NMOS transistor N3 as indicated by a connection I1. In some embodiments, the connections I1 and I2 are indicated as input terminals, for providing corresponding control signals to both of the PMOS transistor P3 and the NMOS transistor N3, and both of the PMOS transistor P2 and the NMOS transistor N2, respectively.

A source/drain terminal of the PMOS transistor P1 is coupled to a node A1; a source/drain terminal of the PMOS transistor P1 is coupled to a source/drain terminal of a PMOS transistor P2 at a node A2; a source/drain terminal of the PMOS transistor P2 is coupled to a source/drain terminal of a PMOS transistor P3 at a node A3; a source/drain terminal of the PMOS transistor P3 is coupled to a node A4. A source/drain terminal of the NMOS transistor N1 is coupled to a node B1; a source/drain terminal of the NMOS transistor N1 is coupled to a source/drain terminal of a NMOS transistor N2 at a node B2; a source/drain terminal of the NMOS transistor N2 is coupled to a source/drain terminal of a NMOS transistor N3; and a source/drain terminal of the NMOS transistor N3 is coupled to a node B3. The node A1 is further coupled to the node B1 as indicated by a connection Z. The nodes A2 and A4 are further coupled to a power rail referenced as VDD. The node A3 is further coupled to the node E1 at a node E2, and the node E1 is also further coupled to the node B3 as indicated by connection ZN. The nodes B2 is further coupled to another power rail referenced as VSS. To implement the IC 12A, embodiments of layout designs and/or structures are provided and discussed below as illustrated with reference to FIGS. 12B-12D.

Figure 12B:
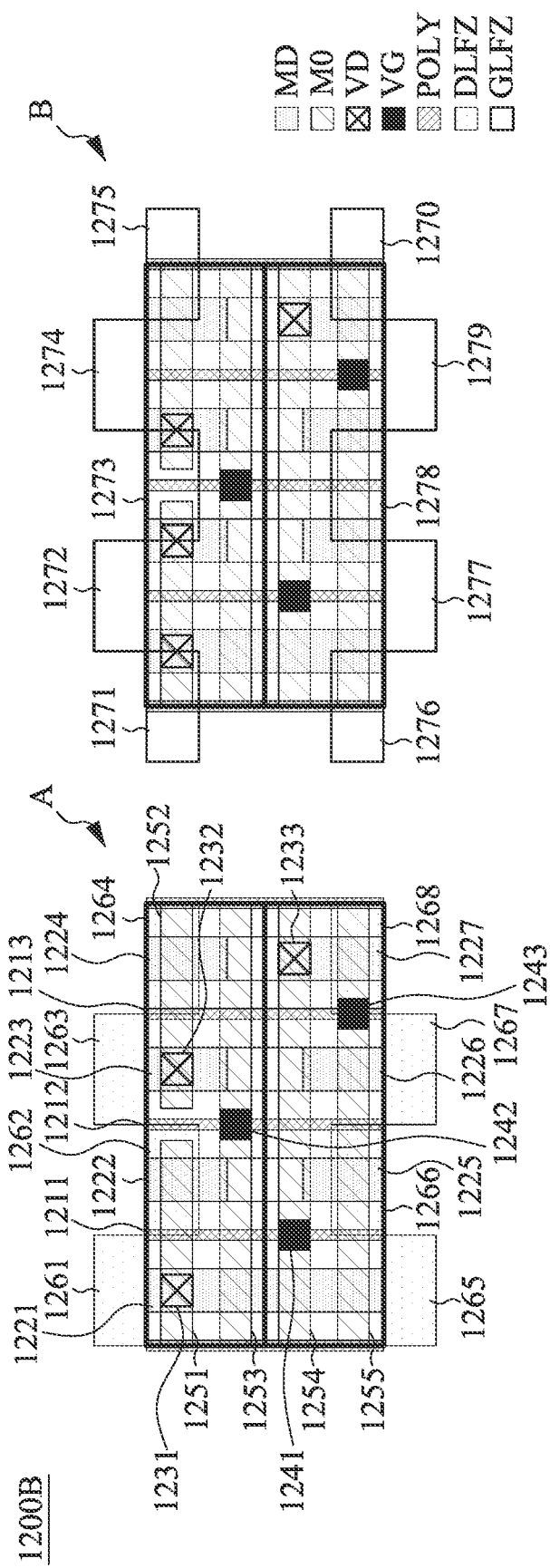

For clarification of demonstrating various forbidden regions patterned as DLFZ and GLFZ, the following layout diagrams 1200B-1200D in FIGS. 12B-12D have separate diagrams A and B for illustrating the patterns DLFZ and GLFZ, respectively. In addition, for simplicity of illustration, similar elements are not repeatedly labeled in the layout diagrams 1200B-1200D, and similar detailed description is therefore omitted.

FIG. 12B is a layout diagram 1200B of the IC 1200A in FIG. 12A, in accordance with some embodiments of the present disclosure. The layout diagram 1200B is provided in diagram A of FIG. 10B by following the first guideline with the first constraint. The layout diagram 1200B is also provided in diagram B of FIG. 12B by following the second guideline with the first constraint.

As illustrated in diagram A of FIG. 12B, gates 1211, 1212 and 1213 are arranged as gate terminals of PMOS transistors P1-P3 or NMOS transistors N1-N3 in FIG. 10A. MD segments 1221, 1222, 1223, 1224, 1225, 1226 and 1227 are arranged as source/drain terminals of PMOS transistors P1-P3 or NMOS transistors N1-N3 in FIG. 12A.

The gate 1211 and the MD segments 1221 and 1222 together correspond to the PMOS transistor P1. The gate 1212 and the MD segments 1222 and 1223 together correspond to the PMOS transistor P2. The gate 1213 and the MD segments 1223 and 1224 together correspond to the PMOS transistor P3. In such configurations, the PMOS transistors P1 and P2 share the MD segment 1222, which corresponds to the PMOS transistors P1 and P2 being coupled at the node A2 illustrated in FIG. 12A. The PMOS transistors P2 and P3 share the MD segment 1223, which corresponds to the PMOS transistors P2 and P3 being coupled at the node A3 illustrated in FIG. 12A.

Furthermore, the gate 1211 and the MD segments 1221 and 1225 together correspond to the NMOS transistor N1. The gate 1212 and the MD segments 1225 and 1226 together correspond to the NMOS transistor N2. The gate 1213 and the MD segments 1226 and 1227 together correspond to the NMOS transistor N3. In such configurations, the PMOS transistor P1 and the NMOS transistor N1 share the MD segment 1221, which corresponds to the PMOS transistor P1 and the NMOS transistor N1 coupled at the nodes A1 and B1 together. It also corresponds to the nodes A1 and B1 being coupled between the connection Z illustrated in FIG. 12A. Also, the NMOS transistors N1 and N2 share the MD segment 1225, which corresponds to the NMOS transistors N1 and N2 being coupled at the node B2 illustrated in FIG. 12A.

Contact vias 1231, 1232 and 1233 are arranged. Signal rails 1251, 1252, 1253, 1254 and 1255 are arranged. The contact via 1231 couples the MD segment 1221 to the signal rail 1251, for transmitting a first data signal (not shown) that is also transmitted within the connection Z. The contact via 1232 couples the MD segment 1223 to the signal rail 1252, for transmitting a second data signal (not shown). The contact via 1233 couples the MD segment 1227 to the signal rail 1254, for transmitting the second data signal. In such configurations, the MD segments 1223 and 1227 receive the same data signal, which corresponds to the nodes A3 and B3 being coupled together as discussed above with respect to FIG. 12A.

Gate vias 1241, 1242 and 1243 are arranged. The gate via 1241 couples the gate 1211 to the signal rail 1254, which corresponds to the gate of the PMOS transistor P1 or NMOS transistor N1 being coupled together at the node E1 as discussed above with respect to FIG. 12A, for transmitting the second data signal. In such configurations, the MD segments 1223 and 1227 and the gate 1211 receive the same data signal, which further corresponds to the nodes E1, E2 and B3 being coupled between the connection ZN as discussed above with respect to FIG. 12A. The Gate via 1242 couples the gate 1212 to the signal rail 1253, which corresponds to the gate of the PMOS transistor P2 or NMOS transistor N2 being coupled between the connection I2 as discussed above with respect to FIG. 12A. The Gate via 1243 couples the gate 1213 to the signal rail 1255, which corresponds to the gate of the PMOS transistor P3 or NMOS transistor N3 being coupled between the connection I1 as discussed above with respect to FIG. 12A.

Backside vias (not shown) are arranged at a back side of the same cell illustrated in the layout diagram 1200B. The backside vias couple the MD segments 1222 and 1224 to a backside power rail (not shown), which respectively corresponds to the nodes A2 and A4 being coupled to the power rail VDD as discussed above with respect to FIG. 12A. The other one of the backside vias (not shown) couples the MD segment 1225 to a backside power rail (not shown), which corresponds to the node B2 being coupled to the power rail VSS as discussed above with respect to FIG. 12A.

The forbidden regions 1261, 1262, 1263, 1264, 1265, 1266, 1267 and 1268 are arranged. The forbidden regions 1261-1268 correspond to the forbidden regions 611-615 as discussed above with reference to FIGS. 5-6A. The arrangement and distribution of the forbidden regions 1261-1268 further correspond to that is discussed above with reference to FIGS. 7A-7B. Therefore, with such configurations, no contact vias are formed in the forbidden regions 1261-1268.

Compared to diagram A of FIG. 12B, in the layout diagram 1200B shown in diagram B of FIG. 12B, the forbidden regions 1270, 1271, 1272, 1273, 1274, 1275, 1276, 1277, 1278 and 1279 are arranged. The forbidden regions 1270-1279 correspond to the forbidden regions 631-636 as discussed above with reference to FIGS. 5 and 6B. The arrangement and distribution of the forbidden regions 1270-1279 correspond to that is discussed above with reference to FIGS. 7A-7B. Therefore, with such configurations, no gate vias are formed in the forbidden regions 1270-1279.

FIG. 12C is a layout diagram 1200C of the IC 1200A in FIG. 12A, in accordance with some embodiments of the present disclosure. The layout diagram 1200C is provided in diagram A of FIG. 12C by following the first guideline with the second constraint. The layout diagram 1200C is also provided in diagram B of FIG. 12B by following the second guideline with the second constraint.

Compared to diagram A of FIG. 12B, in the layout diagram 1200C shown in diagram A of FIG. 12C, the forbidden regions 1261-1268 are arranged at different locations, with consideration of the second constraint. The arrangement and distribution of the forbidden regions 1261-1268 correspond to that is discussed above with reference to FIGS. 7C-7D. Therefore, with such configurations, no contact vias are formed in the forbidden regions 1261-1268.

Compared to diagram B of FIG. 12B, in the layout diagram 1200C shown in diagram B of FIG. 12C, the forbidden regions 1270-1279 are arranged at different locations, with consideration of the second constraint. The arrangement and distribution of the forbidden regions 1270-1279 correspond to that is discussed above with reference to FIGS. 7C-7D. Therefore, with such configurations, no gate vias are formed in the forbidden regions 1270-1279.

FIG. 12D is a layout diagram 1200D of the IC 1200A in FIG. 12A, in accordance with some embodiments of the present disclosure. The layout diagram 1200D is provided in diagram A of FIG. 12D by following the first guideline with the first constraint. The layout diagram 1200D is also provided in diagram B of FIG. 12D by following the second guideline with the second constraint.

The layout diagram 1200D in diagram A of FIG. 12D and the layout diagram 1200B in diagram A of FIG. 12B are the same, followed by the first guideline with the first constraint. The layout diagram 1200D in diagram B of FIG. 12D and the layout diagram 1200C in diagram B of FIG. 12C are the same, followed by the second guideline with the second constraint. As such, no detailed discussion herein.

Reference is now made to FIG. 13A. FIG. 13A is a circuit diagram of an IC 1300A, in accordance with some embodiments of the present disclosure. In some embodiments, the IC 1300A is used as one unit cell/circuit for implementing various logic functions including, for example, a AND gate function, an OR gate function and an inverse function.

For illustration of the IC 1300A, a gate terminal of a PMOS transistor P1 is coupled to a gate terminal of a NMOS transistor N1 as indicated by connection I4; a gate terminal of a PMOS transistor P2 is coupled to a gate terminal of a NMOS transistor N2 as indicated by connection I3; a gate terminal of a PMOS transistor P3 is coupled to a gate terminal of a NMOS transistor N3 as indicated by a connection I1; and a gate terminal of a PMOS transistor P4 is coupled to a gate terminal of a NMOS transistor N4 as indicated by a connection I2. In some embodiments, the connections I1-I4 are indicated as input terminals, for providing corresponding control signals to the corresponding PMOS transistors P1-P4 and the NMOS transistors N1-N4.

A source/drain terminal of the PMOS transistor P1 is coupled to a node A1; a source/drain terminal of the PMOS transistor P1 is coupled to a source/drain terminal of a PMOS transistor P2 at a node A2; a source/drain terminal of the PMOS transistor P2 is coupled to a source/drain terminal of a PMOS transistor P3 at a node A3; a source/drain terminal of the PMOS transistor P3 is coupled to a source/drain terminal of a PMOS transistor P4 at a node A4; and a source/drain terminal of the PMOS transistor P4 is coupled a node A5. A source/drain terminal of the NMOS transistor N1 is coupled to a node B1; a source/drain terminal of the NMOS transistor N1 is coupled to a source/drain terminal of a NMOS transistor N2; a source/drain terminal of the NMOS transistor N2 is coupled to a source/drain terminal of a NMOS transistor N3 at a node B2; a source/drain terminal of the NMOS transistor N3 is coupled to a source/drain terminal of a NMOS transistor N4; and a source/drain terminal of the NMOS transistor N4 is coupled to a node B3. The node A1 is further coupled to the nodes A3 and A5. The node A2 is further coupled to a power rail referenced as VDD. The node A4 is further coupled to the node B2 as indicated by a connection ZN. The nodes B1 and B3 are further coupled to a power rail referenced as VSS. To implement the IC 13A, embodiments of layout designs and/or structures are provided and discussed below as illustrated with reference to FIGS. 13B-13D.

Figure 13C:
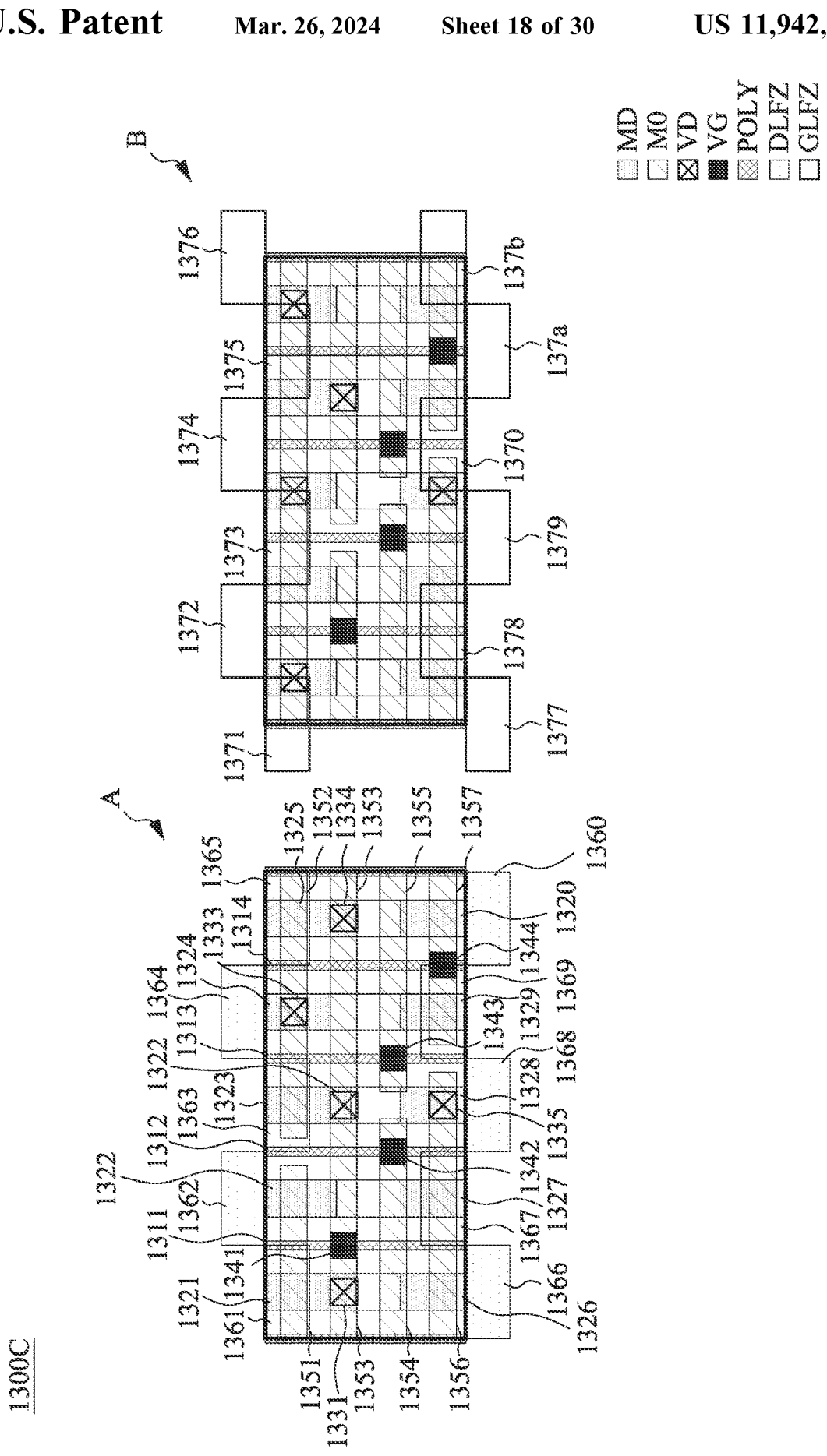
Figure 13D:
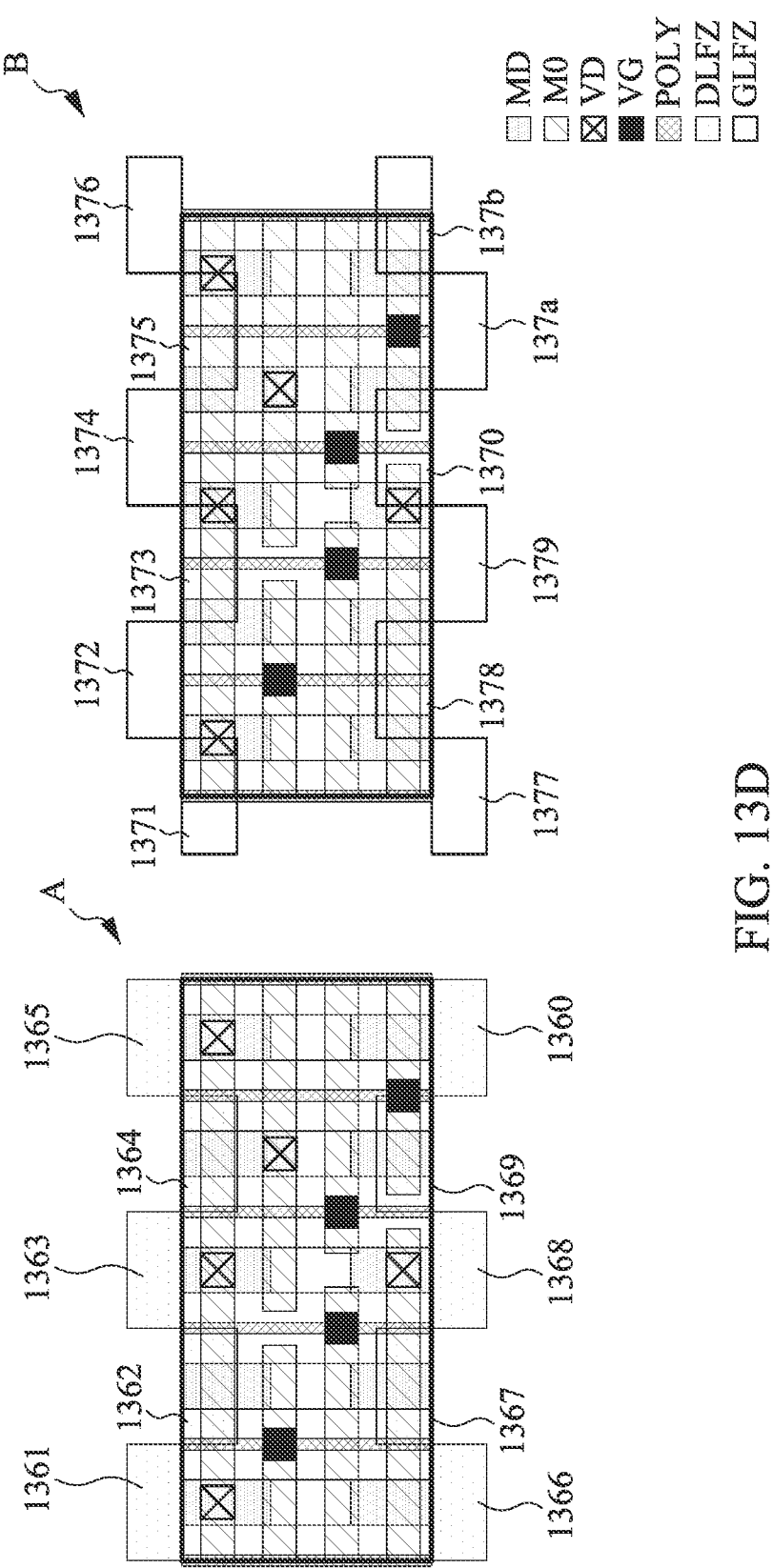

For clarification of demonstrating various forbidden regions patterned as DLFZ and GLFZ, the following layout diagrams 1300B-1300D in FIGS. 13B-13D have separate diagrams A and B for illustrating the patterns DLFZ and GLFZ, respectively. In addition, for simplicity of illustration, similar elements are not repeatedly labeled in the layout diagrams 1300B-1300D, and similar detailed description is therefore omitted.

FIG. 13B is a layout diagram 1300B of the IC 1300A in FIG. 13A, in accordance with some embodiments of the present disclosure. The layout diagram 1300B is provided in diagram A of FIG. 13B by following the first guideline with the first constraint. The layout diagram 1300B is also provided in diagram B of FIG. 13B by following the second guideline with the first constraint.

As illustrated in diagram A of FIG. 13B, gates 1311, 1312, 1313 and 1314 are arranged as gate terminals of PMOS transistors P1-P4 or NMOS transistors N1-N4 in FIG. 10A. MD segments 1320, 1321, 1322, 1323, 1324, 1325, 1326, 1327, 1328 and 1329 are arranged as source/drain terminals of PMOS transistors P1-P4 or NMOS transistors N1-N4 in FIG. 13A.

The gate 1311 and the MD segments 1321 and 1322 together correspond to the PMOS transistor P1. The gate 1312 and the MD segments 1322 and 1323 together correspond to the PMOS transistor P2. The gate 1313 and the MD segments 1323 and 1324 together correspond to the PMOS transistor P3. The gate 1314 and the MD segments 1324 and 1325 together correspond to the PMOS transistor P4. In such configurations, the PMOS transistors P1 and P2 share the MD segment 1322, which corresponds to the PMOS transistors P1 and P2 being coupled at the node A2 illustrated in FIG. 13A. The PMOS transistors P2 and P3 share the MD segment 1323, which corresponds to the PMOS transistors P2 and P3 being coupled at the node A3 illustrated in FIG. 13A. The PMOS transistors P3 and P4 share the MD segment 1324, which corresponds to the PMOS transistors P3 and P4 being coupled at the node A4 illustrated in FIG. 13A.

Furthermore, the gate 1311 and the MD segments 1326 and 1327 together correspond to the NMOS transistor N1. The gate 1312 and the MD segments 1327 and 1328 together correspond to the NMOS transistor N2. The gate 1313 and the MD segments 1328 and 1329 together correspond to the NMOS transistor N3. The gate 1314 and the MD segments 1329 and 1320 together correspond to the NMOS transistor N4. In such configurations, the NMOS transistors N2 and N3 share the MD segment 1228, which corresponds to the NMOS transistors N2 and N3 being coupled at the node B2 illustrated in FIG. 13A.

Contact vias 1331, 1332, 1333, 1334 and 1335 are arranged. Signal rails 1351, 1352, 1353, 1354, 1355, 1356 and 1357 are arranged. The contact via 1331 couples the MD segment 1321 to the signal rail 1351. The contact via 1332 couples the MD segment 1323 to the signal rail 1351. The contact via 1334 couples the MD segment 1325 to the signal rail 1351. In such configurations, the MD segments 1321, 1323 and 1325 couple to the same signal rail 1351, which corresponds to the nodes A1, A3 and A5 being coupled together illustrated in FIG. 13A. The contact via 1333 couples the MD segment 1324 to the signal rail 1355, for transmitting a first data signal (not shown). The contact via 1335 couples the MD segment 1328 to the signal rail 1354, for transmitting the first data signal. In such configurations, the MD segments 1324 and 1328 receive the same data signal, which corresponds to the nodes A4 and B2 being coupled together, which is also indicated as the connection ZN, illustrated in FIG. 13A.

Gate vias 1341, 1342, 1343 and 1344 are arranged. The gate via 1341 couples the gate 1311 to the signal rail 1352, which corresponds to the gate of the PMOS transistor P1 or NMOS transistor N1 being coupled between the connection I4 as discussed above with respect to FIG. 13A. The gate via 1342 couples the gate 1312 to the signal rail 1353, which corresponds to the gate of the PMOS transistor P2 or NMOS transistor N2 being coupled between the connection I3 as discussed above with respect to FIG. 13A. The gate via 1343 couples the gate 1313 to the signal rail 1356, which corresponds to the gate of the PMOS transistor P3 or NMOS transistor N3 being coupled between the connection I1 as discussed above with respect to FIG. 13A. The gate via 1344 couples the gate 1314 to the signal rail 1357, which corresponds to the gate of the PMOS transistor P4 or NMOS transistor N4 being coupled between the connection I2 as discussed above with respect to FIG. 13A.

Backside vias (not shown) are arranged at a back side of the same cell illustrated in the layout diagram 1300B. One of the backside vias couples the MD segment 1322 to a backside power rail (not shown), which respectively corresponds to the node A2 being coupled to the power rail VDD as discussed above with respect to FIG. 13A. Some other backside vias (not shown) couples the MD segments 1326 and 1320 to a backside power rail (not shown), which corresponds to the nodes B1 and B3 being coupled to the power rail VSS as discussed above with respect to FIG. 13A.

The forbidden regions 1361, 1362, 1363, 1364, 1365, 1366, 1367, 1368, 1369, and 1360 are arranged. The forbidden regions 1360-1369 correspond to the forbidden regions 611-615 as discussed above with reference to FIGS. 5-6A. The arrangement and distribution of the forbidden regions 1360-1369 further correspond to that is discussed above with reference to FIGS. 7A-7B. Therefore, with such configurations, no contact vias are formed in the forbidden regions 1360-1369.

Compared to diagram A of FIG. 13B, in the layout diagram 1300B shown in diagram B of FIG. 13B, the forbidden regions 1371, 1372, 1373, 1374, 1375, 1376, 1377, 1378, 1379, 1370, 137a and 137b are arranged. The forbidden regions 1370-1379 and 137a-137b correspond to the forbidden regions 631-636 as discussed above with reference to FIGS. 5 and 6B. The arrangement and distribution of the forbidden regions 1370-1379 and 137a-137b correspond to that is discussed above with reference to FIGS. 7A-7B. Therefore, with such configurations, no gate vias are formed in the forbidden regions 1370-1379 and 137a-137b.

FIG. 13C is a layout diagram 1300C of the IC 1300A in FIG. 13A, in accordance with some embodiments of the present disclosure. The layout diagram 1300C is provided in diagram A of FIG. 13C by following the first guideline with the second constraint. The layout diagram 1300C is also provided in diagram B of FIG. 13B by following the second guideline with the second constraint.

Compared to diagram A of FIG. 13B, in the layout diagram 1300C shown in diagram A of FIG. 13C, several patterns are altered, including, for example, some of the MD segments 1320-1329 have different sizes. For example, with reference to diagram A of FIG. 13B, sizes of the MD segments 1323, 1324 and 1325 are altered, compared to that shown in diagram A of FIG. 13B.

In addition, some of the contact vias 1331-1335 are placed at different locations, and some of the signal rails 1351-1357 have alternative patterns. For example, with reference to diagram A of FIG. 13C, in a layout view, the contact vias 1331, 1332 and 1334 are arranged to overlap with the signal rail 1353. In such configurations, similar to that is discussed with reference to diagram A of FIG. 13B, the MD segments 1321, 1323 and 1325 couple together to the same signal rail 1353, which corresponds to the nodes A1, A3 and A5 being coupled together illustrated in FIG. 13A. In a layout view, the contact via 1333 is arranged to overlap with the signal rail 1352, for transmitting the first data signal. In such case, the contact via 1335 couples the MD segment 1328 to the signal rail 1356, for transmitting the first data signal. With such configurations, similar to that is discussed with reference to diagram A of FIG. 13B, the MD segments 1324 and 1328 receive the same data signal, which corresponds to the connection ZN illustrated in FIG. 13A.

Furthermore, some of the gate vias 1341-1344 are placed at different locations. For example, with reference to diagram A of FIG. 13C, in a layout view, the gate via 1341 is arranged at a location that is close to the cell boundary, and arranged to overlap with the signal rail 1351. In some embodiments, the cell boundary corresponds to the cell boundary CB1 at least shown in FIG. 8. In such case, the gate via 1341 couples the gate 1311 to the signal rail 1351, which also corresponds to the connection I4 as discussed above with respect to FIGS. 13A-13B.

With the comparison of the layout diagram 1300B, the above alternations in the layout diagram 1300C are generated based on various forbidden regions 1360-1369, 1370-1379 and 137a-137b. Specifically, in the layout diagram 1300B shown in diagram A of FIG. 13B, the forbidden regions 1360-1369 are arranged at different at different locations, by following the first guideline with consideration of the second constraint. The second constraint is discussed above with reference to FIGS. 7C-7D. In the layout diagram 1300B shown in diagram B of FIG. 13B, the forbidden regions 1370-1379 and 137a-137b are arranged at different at different locations, by following the second guideline with consideration of the second constraint. Therefore, with such configurations, no contact vias are formed in the forbidden regions 1360-1369, and no gate vias are formed in the forbidden regions 1370-1379 and 137a-137b.

Figure 14A:
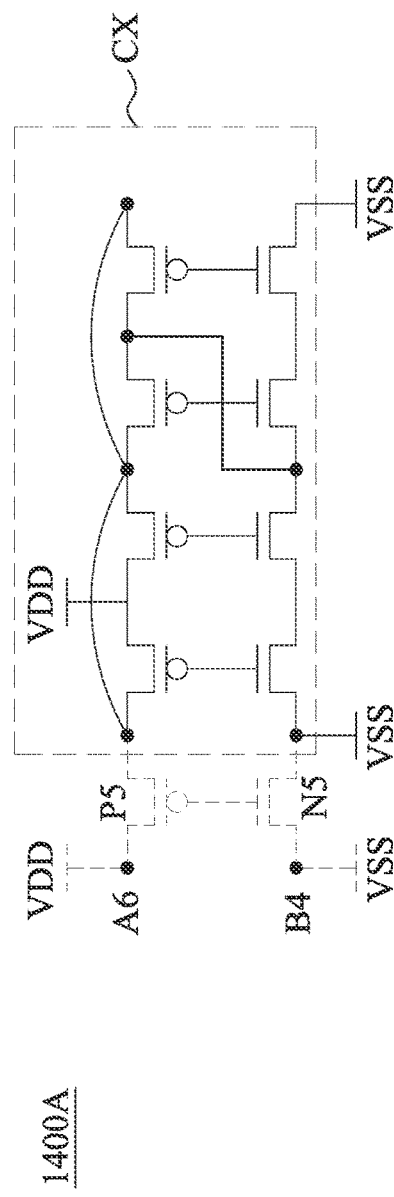
FIG. 14A is a circuit diagram of an IC, in accordance with some embodiments of the present disclosure.

Reference is now made to FIG. 14A. FIG. 14A is a circuit diagram of an IC 1400A, in accordance with some embodiments of the present disclosure. In some embodiments, the IC 1400A is an alternative embodiments of the IC 1300A shown in FIG. 13A. The circuit diagram of the IC 1400A has configurations similar to that of the IC 1300A as illustrated in FIG. 13A, and similar detailed description is therefore omitted.

For illustration of the IC 1400A, a dashed circle labeled with "CX" is a part of the IC 1400A, and is identical to the IC 1300A shown in FIG. 13A. The other part of the IC 1400A includes a PMOS transistor P5 and a NMOS transistor N5, that has no function in the IC 1400A. Gate terminals of the PMOS transistor P1 and the NMOS transistor N5 are not coupled to other metal rails. The PMOS transistor P5 and the NMOS transistor N5 are indicated as dummy transistors, in some embodiments.

A source/drain terminal of the PMOS transistor P5 is coupled to a node A6; a source/drain terminal of the PMOS transistor P5 is coupled to a source/drain terminal of the PMOS transistor P1 at the node A1. A source/drain terminal of the NMOS transistor N5 is coupled to a node B4; a source/drain terminal of the NMOS transistor N5 is coupled to a source/drain terminal of the PMOS transistor N1 at the node B1. The node A6 is further coupled to a power rail referenced as VDD. The node B4 is further coupled to a power rail referenced as VSS. To implement the IC 14A, embodiments of layout designs and/or structures are provided and discussed below as illustrated with reference to FIG. 14B.

Figure 14B:
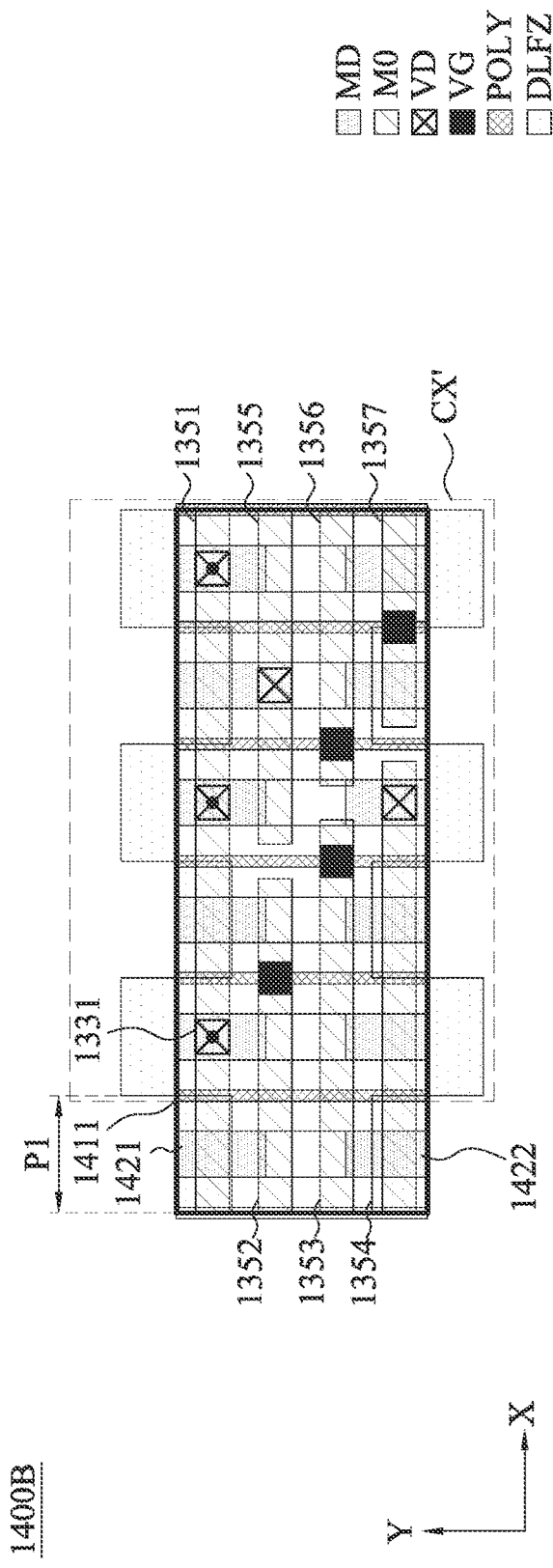
FIG. 14B is a layout diagram of an IC corresponding to the IC of FIG. 14A, in accordance with some embodiments of the present disclosure.

FIG. 14B is a layout diagram 1400B of the IC 1400A in FIG. 14A, in accordance with some embodiments of the present disclosure. The layout diagram 1400B is provided in FIG. 14B by following the first guideline with the first constraint. The layout diagram 1400B is provided in FIG. 14B by following the second guideline with the first constraint. For simplicity of illustration, forbidden regions patterned as DLFZ are shown and forbidden regions patterned as GLFZ are omitted. In some embodiments, the layout diagram 1400B is an alternative embodiments of the layout diagram 1300B shown in FIG. 13B. The layout diagram 1400B has configurations similar to that of the layout diagram 1300B as illustrated in FIG. 13B, and similar detailed description is therefore omitted.

For illustration of the layout diagram 1400B, a dashed circle labeled with "CX'" is a part of the layout diagram 1400B, and is identical to the layout diagram 1300B shown in diagram A in FIG. 13B.

Compared to diagram A of FIG. 14B, in the layout diagram 1400B shown in FIG. 14B, further arranged is a gate 1411 as gate a terminal of PMOS transistor P5 or NMOS transistor N5 in FIG. 14A. Also arranged are MD segments 1421 and 1423 are arranged as source/drain terminals of PMOS transistor P5 or NMOS transistor N5 in FIG. 14A.

The gate 1411 and the MD segments 1421 and 1322 together correspond to the PMOS transistor P5. The gate 1411 and the MD segments 1422 and 1327 together correspond to the NMOS transistor N5.

Signal rails 1351-1354 in the layout diagram 1400B are elongated, compared to the layout diagram 1300B. Specifically, since the gate 1411 is arranged, each of the signal rails 1351-1354 gets longer by substantially one gate pitch P1, with respect to the X direction. With such configurations, when a situation comes to that another cell (not shown) abuts the current cell with respect to the X direction, at least one of the contact vias, for example, the contact via 1331, is separated from other vias in the abutted cell by more distances.

Figure 15:
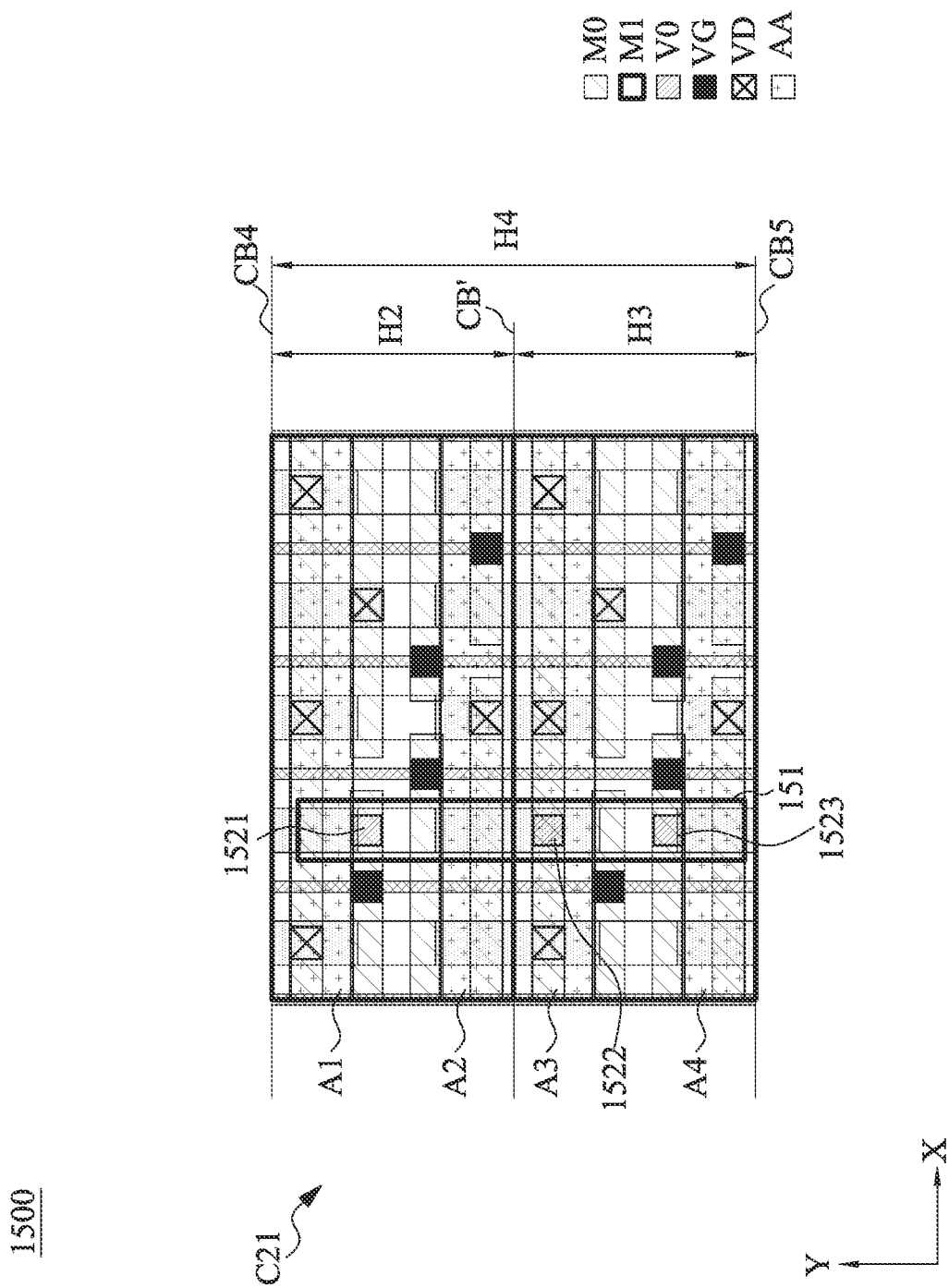
FIG. 15 is a schematic layout diagram of a semiconductor device, which includes a double height cell, corresponding to the semiconductor device in FIG. 2, in accordance with some embodiments of the present disclosure.

Reference is now made to FIG. 15. FIG. 15 is a schematic layout diagram 1500 of a semiconductor device, in accordance with some embodiments of the present disclosure. In some embodiments, the layout diagram 1500 is an alternative embodiment of the layout diagram 200 shown in FIG. 2. In some other embodiments, the layout diagram 1500 is an alternative embodiment of the layout diagram 800 shown in FIG. 8. In various embodiments, the layout diagram 1500 is utilized to fabricate the semiconductor device 300 in FIGS. 3A-4B or the semiconductor device 1700 in FIGS. 17-18C. The correspondence between a given layout diagram feature formed based on the given layout diagram feature, a same reference designator is used in each of the layout diagram and structure depictions, as discussed below. For simplicity of illustration, only few elements are labeled in FIG. 15. The layout diagram 1500 with respect to the embodiments of FIG. 8, like elements in FIG. 15 are designated with the same reference numbers for ease of understanding.

Compared to FIG. 8, in the layout diagram 1500 in FIG. 15, one double height cell C21 is included. The cell C21 is defined between the cell boundaries including CB4 and CB5, and has a cell height H4. In the cell C21, active areas A1, A2, A3 and A4 are arranged separately with respect to Y direction, and a metal segment 151 is arranged in a metal-1 (M1) layer. The metal segment 151 extends from the active area A1 to the active area A4, and extends across a boundary CB', with respect to Y direction. At least one via, for example, the vias 1521, 1522 and 1523, is arranged inside the metal segment 151, to form a metal via contacting between the signal rail (not labeled) in the M0 layer and the metal segment 151. This via is patterned as "V0" in the layout diagram 1500B, and indicates as a via coupled between the M0 and M1 layers. The M1 layer is above the M0 layer, in some embodiments.

In some embodiments, the active areas A1-A4 correspond to the active areas A1-A4 illustrated in FIG. 8. In some other embodiments, the cell boundaries CB4-CB5 correspond to the cell boundaries CB1-CB2 or CB2-CB3 illustrated in FIG. 8, respectively.

In some embodiments, regarding the double height cell C21, the cell boundaries CB4-CB5 are defined corresponding to the active areas A1 and A4, when at least one condition is satisfied. In some other embodiments, a first condition indicates that the metal segment in the M1 layer is arranged across the active areas A2-A3 which defining the boundary CB' therebetween. In some alternative embodiments, a second condition indicates that a length of the metal segment is less than a sum of heights H2 and H3, which is also referred to as the cell height H4. In various embodiments, a third condition indicates that at least two vias arranged inside the metal segment are configured to couple between at least one metal rail in the M0 layer and the metal segment in the M1 layer.

To implement various semiconductor devices included in an IC, the layout diagrams as discussed above with reference to FIGS. 1, 2, 5, 6A-6B, 7A-7D and 15 are used or modified to be used, as illustrated by the non-limiting examples discussed below with respect to FIGS. 16A-16C. These semiconductor devices correspond to the semiconductor device 300 discussed with reference FIGS. 3A-4B or the semiconductor devices 1700 discussed with reference FIGS. 17-18C. In the various embodiments discussed below, the semiconductor device or the IC of the present disclosure is implemented through the use of layout diagrams, including the double height cell, depicted in FIGS. 16B-16C that correspond to a circuit diagram depicted in FIG. 16A, as indicated. It is noted that these layout diagrams merely illustrate a front side of the corresponding semiconductor device, and are provided when the guidelines with various constraints are followed are followed as discussed above with reference to FIGS. 5-7D.

Figure 16A:
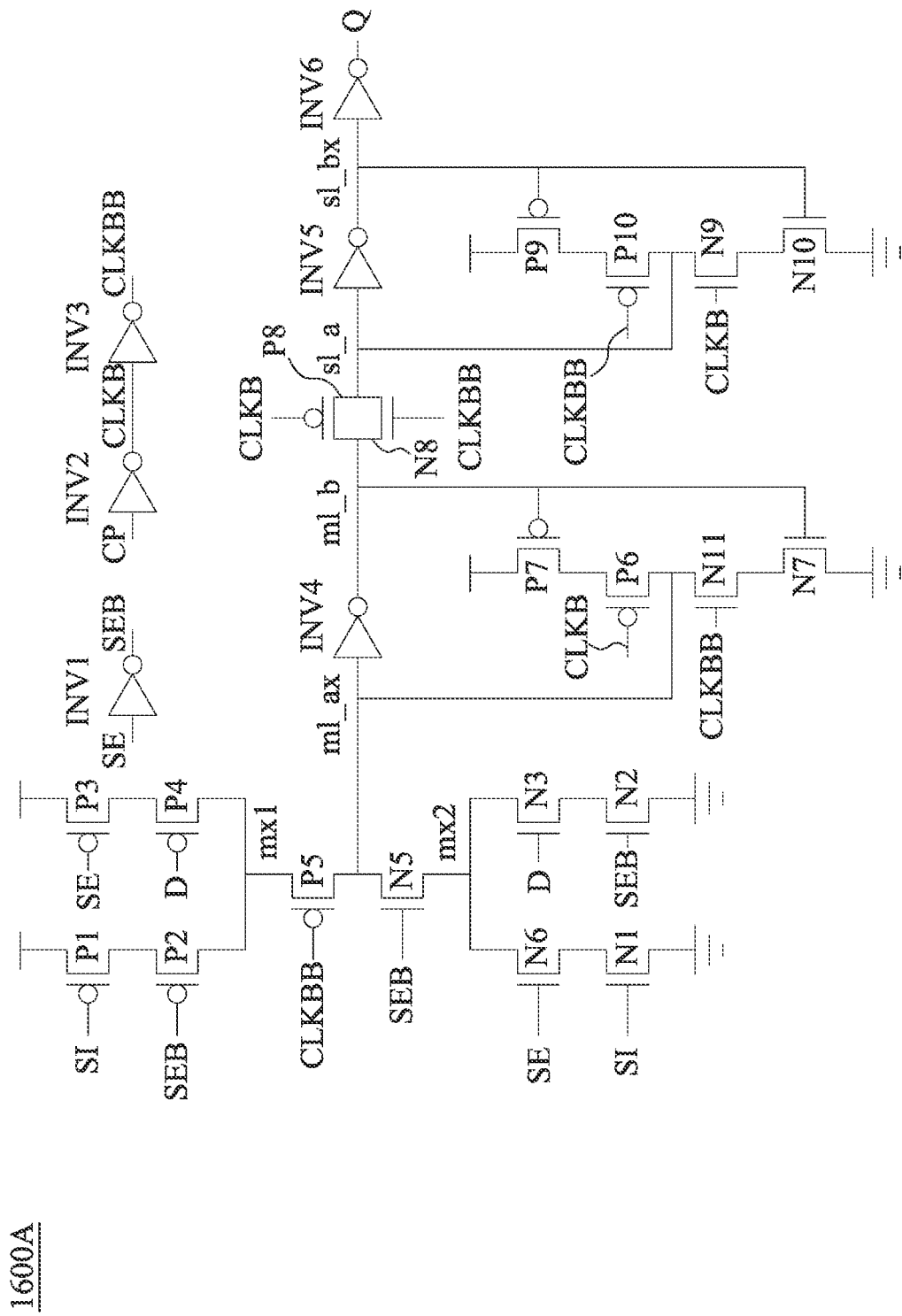
FIG. 16A is a circuit diagram of an IC, in accordance with some embodiments of the present disclosure.

Reference is now made to FIG. 16A. FIG. 16A is a circuit diagram of an IC 1600A, in accordance with some embodiments of the present disclosure. In some embodiments, the IC 1600A is used as one unit cell/circuit for implementing a flip-flop.

For illustration of the IC 1600A, it is provided multiple PMOS transistors, including the PMOS transistors P1, P2, P3, P4, P5, P6, P7, P8, P9 and P10, multiple NMOS transistors, including the NMOS transistors N1, N2, N3, N4, N5, N6, N7, N8, N9, N10 and N11, and invertors, including the invertors INV1, INV2, INV3, INV4, INV5 and INV6.

The PMOS transistor P1 is configured to receive a data signal SI as a control signal; the PMOS transistor P2 is configured to receive a data signal SEB as a control signal; the PMOS transistor P3 is configured to receive a data signal SE as a control signal; the PMOS transistor P4 is configured to receive a data signal D as a control signal. Similarly, the PMOS transistor P5 is configured to receive a data signal CLKBB, and the NMOS transistor N5 is configured to receive a data signal SEB. The NMOS transistor N1 is configured to receive the data signal SI; the NMOS transistor N6 is configured to receive the data signal SE; the NMOS transistor N3 is configured to receive the data signal D; and the NMOS transistor N2 is configured to receive the data signal SEB.

The invertor INV1 is configured to receive the data signal SE as an input signal, and to output the data signal SEB; the invertor INV2 is configured to receive a data signal CP as an input signal, and to output the data signal CLKB; and the invertor INV3 is configured to receive the data signal CLKB as an input signal, and to output the data signal CLKBB.

The invertor INV4 is configured to receive a data signal m1_ax as an input signal, which is transmitted from the PMOS transistor P5 and the NMOS transistor N5, and to output a data signal m1_b. The PMOS transistor P7 is configured to receive the data signal m1_b; the PMOS transistor P6 is configured to receive the data signal CLKB; the NMOS transistor N11 is configured to receive the data signal CLKBB; and the NMOS transistor N7 is configured to receive the data signal m1_b.

The PMOS transistor P8 is configured to receive the data signal CLKB, and the NMOS transistor N8 is configured to receive the data signal CLKBB.

The invertor INV5 is configured to receive a data signal s1_a as an input signal, which is transmitted from the PMOS transistor P8 and the NMOS transistor N8, and to output a data signal s1_bx; and the invertor INV6 is configured to receive the data signal s1_bx as an input signal, and to output a data signal Q, which is also indicated as an output signal of the flip-flop.

The PMOS transistor P9 is configured to receive the data signal s1_bx; the PMOS transistor P10 is configured to receive the data signal CLKBB; the NMOS transistor N9 is configured to receive the data signal CLKB; and the NMOS transistor N10 is configured to receive the data signal s1_bx.

Figure 16B:
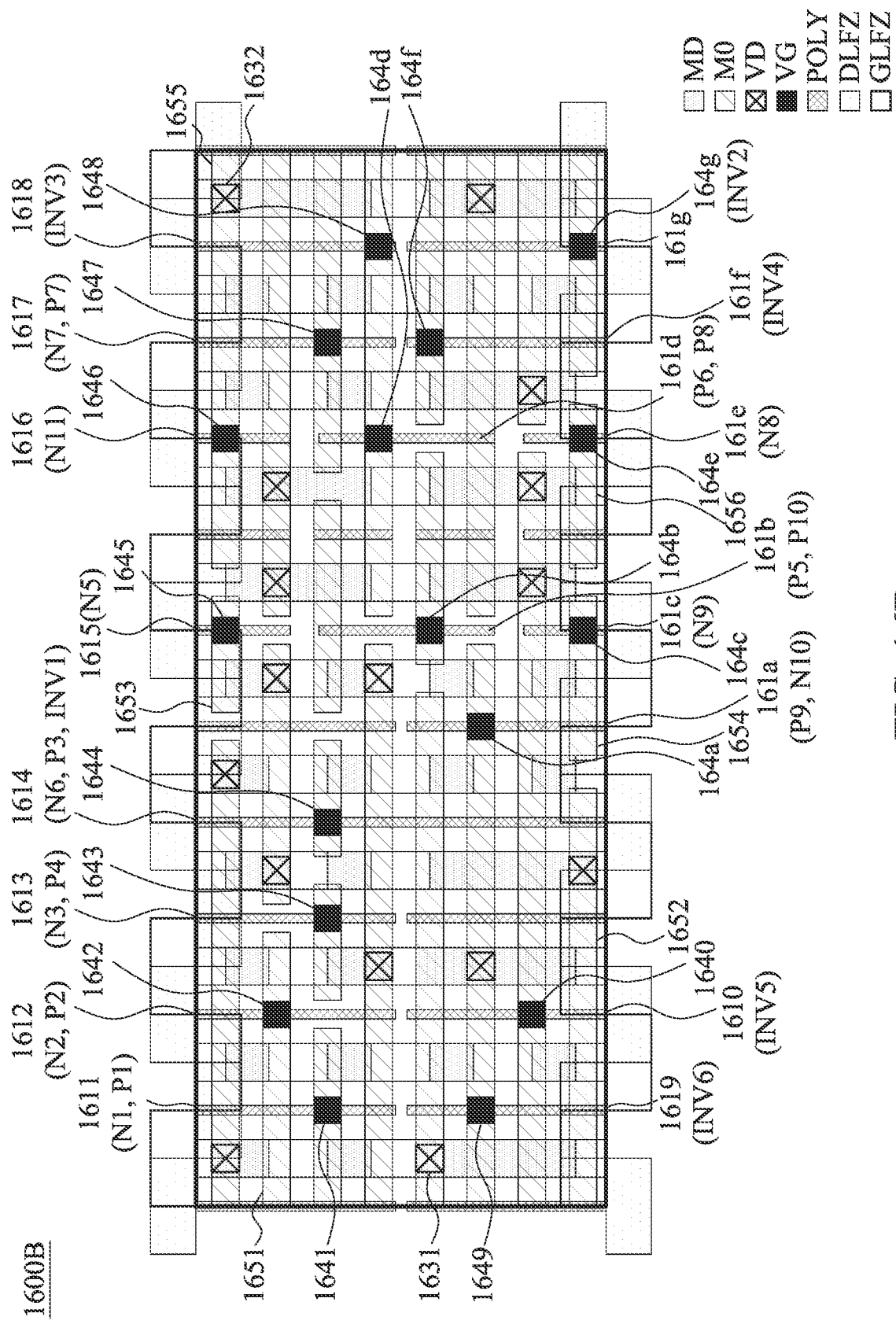
FIGS. 16B-16C are layout diagrams of an IC corresponding to the IC of FIG. 16A, in accordance with some embodiments of the present disclosure.
Figure 16C:
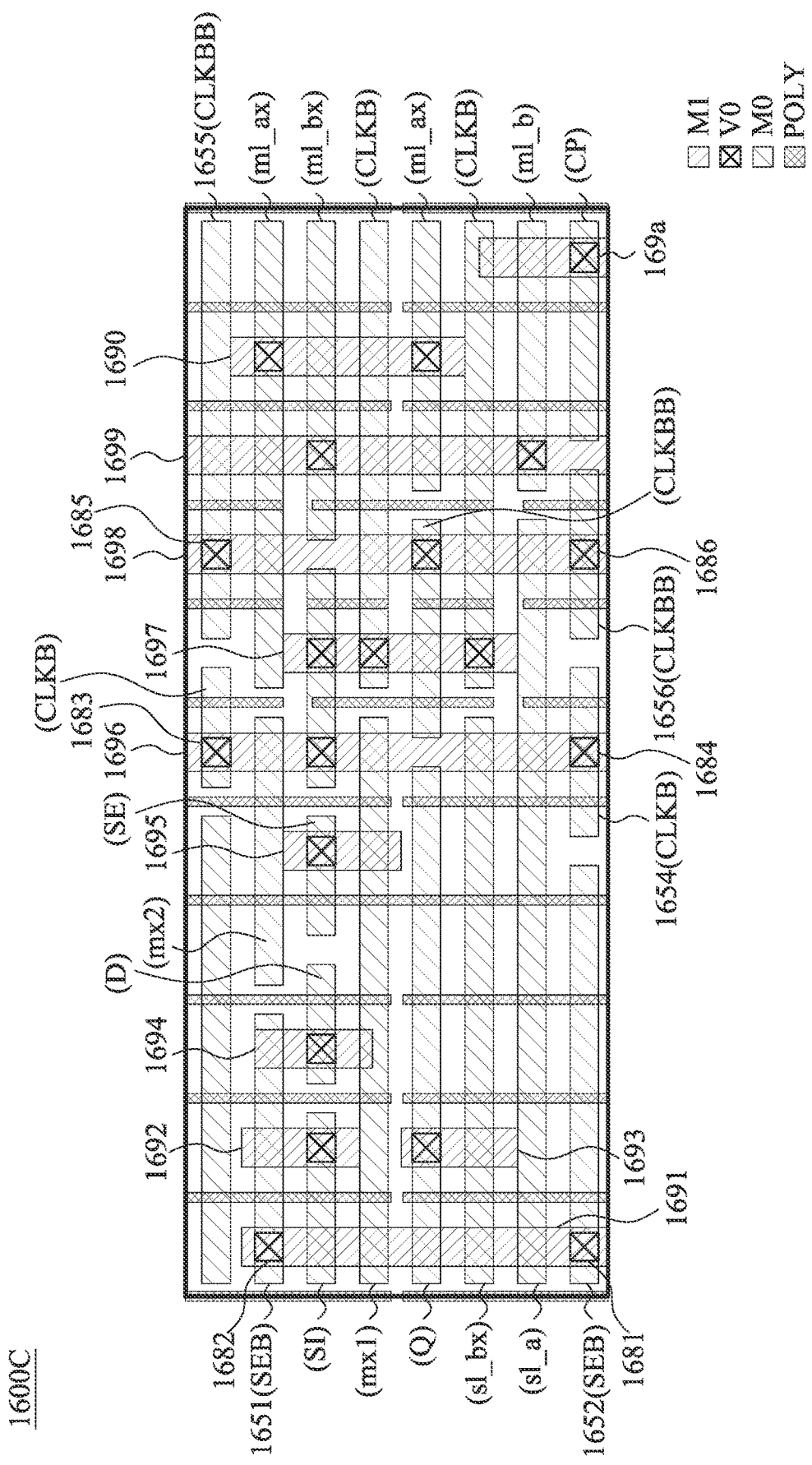

FIGS. 16B-16C are layout diagrams 1600B and 1600C of the IC 1600A in FIG. 16A, in accordance with some embodiments of the present disclosure. The layout diagrams 1600B and 1600C are provided by following the first guideline with the second constraint and the second guideline with the first constraint. In some other embodiments, the diagrams 1600B and 1600C are provided to fabricate the IC 1600A by following the first guideline with the first or second constraint and the second guideline with the first or second constraint.

As illustrated in FIG. 16B, the patterns below the M1 layer are illustrated. For simplicity of illustration, only few elements are labeled in FIG. 16B. In addition, the PMOS transistors P1-P10, the NMOS transistors N1-N11 and the invertors INV1-INV4 are noted with the corresponding gates 1610-1619 and 161a-161g. The data signals SEB, SI, D, mx1, mx2, CP, CLKB, CLKBB, m1_ax, m1_b, s1_bx and Q are noted with the corresponding signal rails in FIG. 16C. These signal rails are patterned as M0 and are configured to transmit the aforesaid data signals.

The gate 1611 is arranged as the gate terminals of PMOS transistor P1 and NMOS transistor N1; the gate 1612 is arranged as the gate terminals of PMOS transistor P2 and NMOS transistor N2; the gate 1613 is arranged as the gate terminals of PMOS transistor P4 and NMOS transistor N3; the gate 1614 is arranged as the gate terminals of PMOS transistor P3 and NMOS transistor N6 and as the input terminal of invertor INV1; the gate 1615 is arranged as the gate terminal of NMOS transistor N11; the gate 1616 is arranged as the gate terminal of NMOS transistor N6; the gate 1617 is arranged as the gate terminals of PMOS transistor P7 and NMOS transistor N7; and the gate 1618 is arranged as the input terminal of invertor INV3.

Furthermore, the gate 1619 is arranged as the input terminal of invertor INV6; the gate 1610 is arranged as the input terminal of invertor INV5; the gate 161a is arranged as the gate terminals of PMOS transistor P9 and NMOS transistor N10; the gate 161b is arranged as the gate terminal of PMOS transistor P10; the gate 161c is arranged as the gate terminal of NMOS transistor N9; the gate 161d is arranged as the gate terminal of PMOS transistor P6; the gate 161e is arranged as the gate terminal of NMOS transistor N8; the gate 161f is arranged as the input terminal of invertor INV4; and the gate 161g is arranged as the input terminal of invertor INV2.

Gate vias 1640-1649 and 164a-164g are arranged, and to couple the gates 1610-1619 and 161a-161g to the corresponding signal rails (not labeled).

Contact vias 1631, 1632 and others without labelling are arranged. The contact via 1631 couples one MD segment (not labeld) to one signal rail (not labeled), for transmitting the data signal Q (shown in FIG. 16C), which corresponds to the invertor INV6 being outputting the data signal Q as discussed above with respect to FIG. 16A. The contact via 1632 couples one MD segment (not labeld) to one signal rail 1655, for transmitting the data signal CLKBB (shown in FIG. 16C), which corresponds to the invertor INV3 being outputting the data signal CLKBB as discussed above with respect to FIG. 16A.

The forbidden regions patterned as DLFZ and GLFZ are arranged. Specifically, the forbidden regions patterned as DLFZ are arranged without the contact vias, and correspond to the forbidden regions discussed above with reference to FIGS. 7C-7D. The forbidden regions patterned as GLFZ are arranged without the gate vias, and correspond to the forbidden regions discussed above with reference to FIGS. 7A-7B.

As illustrated in FIG. 16C, the patterns disposed in the M0-M1 layers are illustrated. For simplicity of illustration, only few elements are labeled in FIG. 16C. For ease of understanding, the gates 1610-1619 and 161a-161g are also illustrated in the layout diagram 1600C.

Metal segments 1691, 1692, 1693, 1694, 1695, 1696, 1697, 1698, 1699, 1690 and 169a are arranged in the M1 layer. Vias 1681, 1682, 1683, 1684, 1685 and 1686 and others without labelling are arranged and patterned as "V0". The vias couples the signal rails in the M0 layer to the corresponding metal segments 1690-1691 and 169a in the M1 layer. For example, with reference to FIG. 16C, the via 1681 couples the signal rail 1652 to the metal segments 1691, and the via 1682 couples the signal rail 1651 to the metal segments 1691, which corresponds to the signal rails 1651-1652 transmitted with the data signal SEB. The via 1683 couples the signal rail 1653 to the metal segments 1696, and the via 1684 couples the signal rail 1654 to the metal segments 1696, which corresponds to the signal rails 1653-1654 transmitted with the data signal CLKB. The via 1685 couples the signal rail 1655 to the metal segments 1698, and the via 1686 couples the signal rail 1656 to the metal segments 1698, which corresponds to the signal rails 1655-1656 transmitted with the data signal CLKBB.

Figure 17:
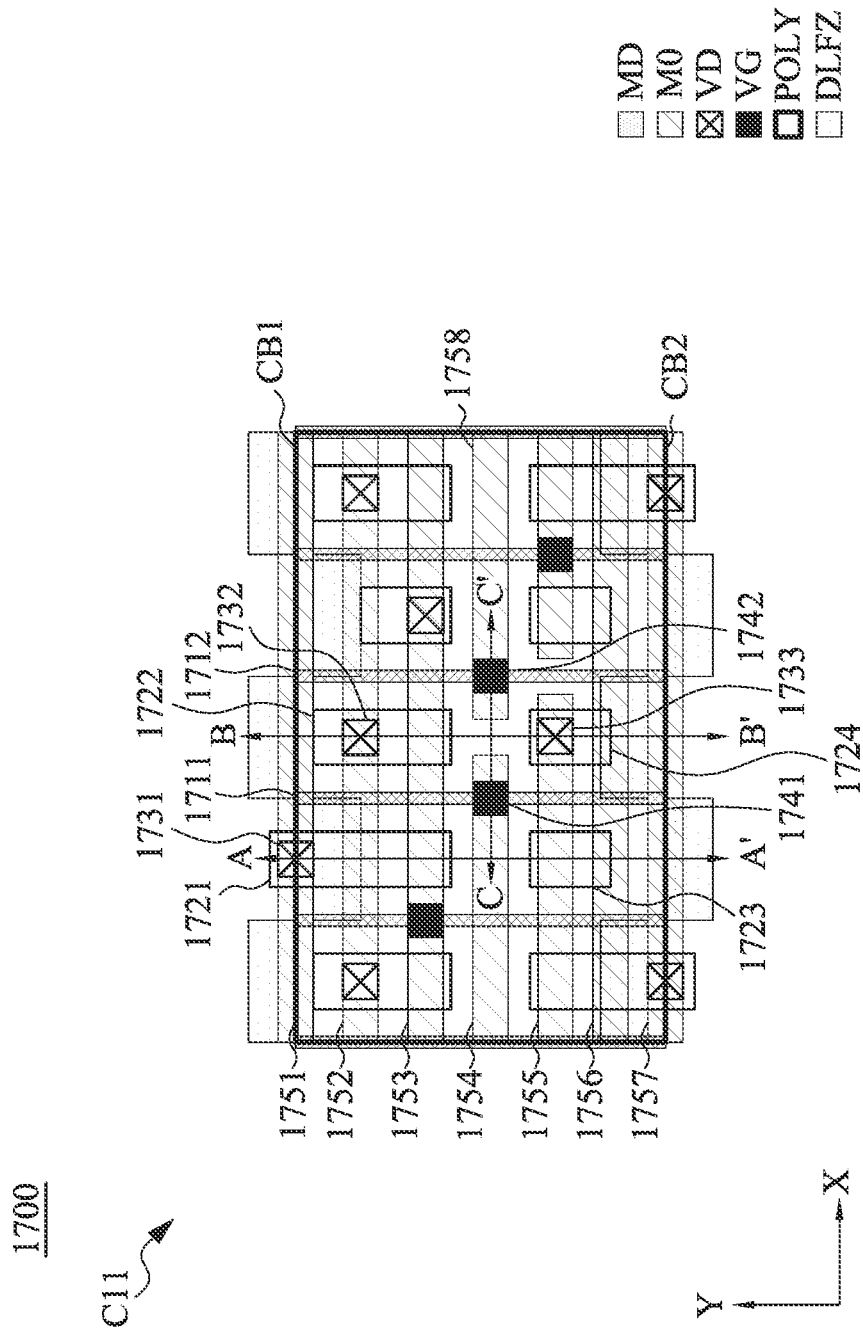
FIG. 17 is a schematic layout diagram of a semiconductor device included in an IC corresponding to the IC in FIG. 1, in accordance with some embodiments of the present disclosure.

Reference is now made to FIG. 17. FIG. 17 is a schematic layout diagram of a semiconductor device 1700, in accordance with some embodiments of the present disclosure. In some embodiments, the semiconductor device 1700 corresponds to the semiconductor device 300 depicted in FIGS. 3A-3B. The semiconductor device 1700 with respect to the embodiments of FIGS. 3A-3B, like elements in FIG. 17 are designated with the same reference numbers for ease of understanding, and similar detailed description is therefore omitted. For simplicity of illustration, only few elements are labeled in FIG. 17.

For illustration in FIG. 17, a cell C11 is arranged. In some embodiments, the cell C11 is an alternative embodiment of the cell C11 depicted in FIGS. 3A-3B. Compared to embodiments depicted in FIGS. 3A-3B, in the cell C11, no backside power rails or backside vias are arranged. A front side of the semiconductor device 1700 is illustrated.

The semiconductor device 1700 includes gates 1711 and 1712, MD segments 1721, 1722, 1723 and 1724, contact vias 1731, 1732 and 1733, gate vias 1741 and 1742, and metal rails 1751, 1752, 1753, 1754, 1755, 1756, 1757 and 1758. Some forbidden regions patterned as DLFZ are also shown for the following illustration, and some forbidden regions patterned as GLFZ are not shown for simplifying illustration.

The metal rails 1751-1758 have widths that are the same, with respect to the Y direction. In some embodiments, the metal rails 1751-1758 include power rails 1751 and 1757, and signal rails 1752-1756 and 1758. In some other embodiments, the power rails 1751 and 1757 are configured to transmit power signals. For example, with reference to FIG. 17, the power rail 1751 is configured to receive a power voltage signal VDD and couple the power voltage signal VDD to the corresponding transistors. The power rail 1757 is configured to receive a reference voltage signal VSS and couple the reference voltage signal VSS to the corresponding transistors. In some alternative embodiments, the signal rails 1752-1756 and 1758 are configured to transmit data signals, and are configured to couple the data signals to the corresponding transistors.

Figures 18A, 18B:
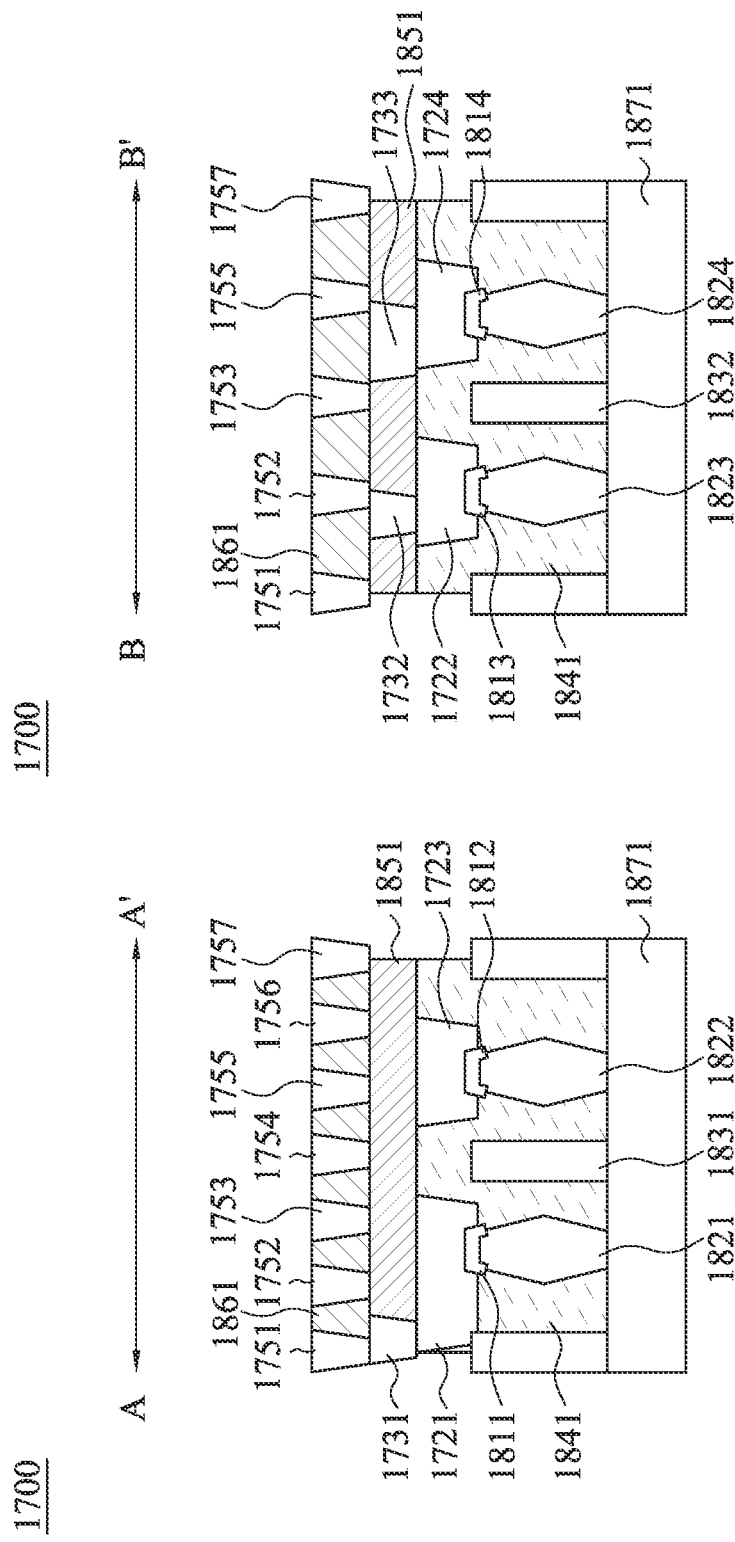
FIGS. 18A-18C are cross sectional view of a semiconductor device corresponding to the semiconductor device in FIG. 17, in accordance with some embodiments of the present disclosure.
Figure 18C:
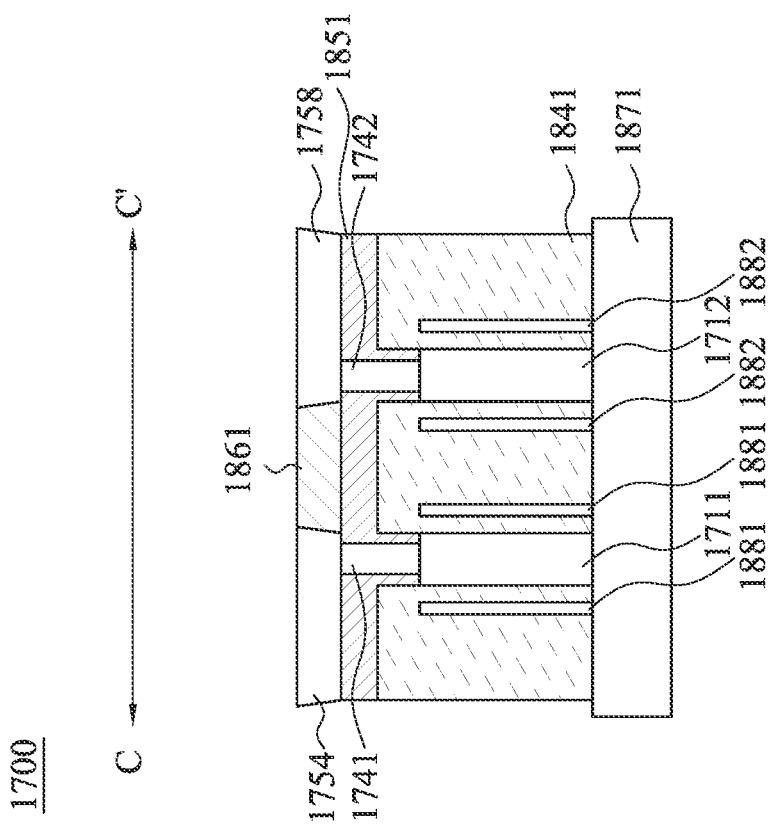

Reference is now made to FIGS. 18A-18C. FIGS. 18A-18C are cross sectional view of the semiconductor device 1700 shown in FIG. 17, in accordance with some embodiments of the present disclosure. FIG. 18A is a cross-sectional view along a line A-A' of FIG. 17. FIG. 18B is a cross-sectional view along a line B-B' of FIG. 17. FIG. 18C is a cross-sectional view along a line C-C' of FIG. 17. For ease of understanding, the embodiments with respect to FIG. 18A are discussed with reference to FIGS. 18B-18C, and only illustrates some structures that are associated with the corresponding structures shown in FIG. 17 as an exemplary embodiment. The semiconductor device 1700 with respect to the embodiments of FIG. 17, like elements in FIGS. 18A-18C are designated with the same reference numbers for ease of understanding.

As illustrated in FIG. 18A, the MD segments 1721 and 1723 are respectively disposed on epitaxy structures 1821 and 1822, and silicide layers 1811 and 1812 are respectively disposed over therebetween. An isolation structure 1831 is formed between the MD segments 1721 and 1723, between the epitaxy structures 1821 and 1822, and between the silicide layers 1811 and 1812, and a dielectric structure 1841 is filled therebetween.

An interlayer dielectric (ILD) layer 1851 is disposed above the MD segments 1721 and 1723 and the dielectric structure 1841. A dielectric structure 1861 is filled between the power rails 1751 and 1757 and signal rails 1752-1756, and is also indicated as the M0 layer in some embodiments. The contact via 1731 is disposed in the ILD layer 1851, and contacts both of the MD segment 1721 and the power rail 1751. A backside ILD layer 1871 is disposed below the epitaxy structures 1821 and 1822, the isolation structure 1831 and the dielectric structure 1841.

As illustrated in FIG. 18B, the MD segments 1722 and 1724 are respectively disposed on epitaxy structures 1823 and 1824, and silicide layers 1813 and 1814 are respectively disposed over therebetween. An isolation structure 1832 is formed between the MD segments 1722 and 1724, between the epitaxy structures 1823 and 1824, and between the silicide layers 1813 and 1814, and the dielectric structure 1841 is filled therebetween.

The ILD layer 1851 is disposed above the MD segments 1722 and 1724 and the dielectric structure 1841. The dielectric structure 1861 is filled between the power rails 1751 and 1757 and signal rails 1752-1753 and 1755. The contact via 1732 is disposed in the ILD layer 1851, and contacts both of the MD segment 1722 and the signal rail 1752. The contact via 1733 is disposed in the ILD layer 1851, and contacts both of the MD segment 1724 and the signal rail 1755. The backside ILD layer 1871 is disposed below the epitaxy structures 1823 and 1824, the isolation structure 1832 and the dielectric structure 1841.

As illustrated in FIG. 18C, spacers 1881 and 1882 are disposed on opposite sidewalls of the gate 1711 and 1712 respectively. The dielectric structure 1841 is filled between the gates 1711-1712 and the spacers 1881-1882. The gate vias 1741-1742 are disposed in the ILD layer 1851, and contacts both of the gate 1711 and the signal rail 1754 and both of the gate 1712 and the signal rail 1758, respectively.

In some embodiments, the silicide layers 1811-1814 correspond to the silicide layers 411-412 shown in FIG. 4A. In some embodiments, the epitaxy structures 1821-1824 correspond to the epitaxy structures 421-422 shown in FIGS. 4A-4B. In some embodiments, the isolation structures 1831-1832 correspond to the isolation structure 431 shown in FIG. 4A. In some embodiments, the dielectric structure 1841 corresponds to the dielectric structure 441 shown in FIGS. 4A-4B. In some embodiments, the ILD layer 1851 corresponds to the ILD layer 451 shown in FIGS. 4A-4B. In some embodiments, the dielectric structure 1861 corresponds to the dielectric structure 461 shown in FIG. 4A. In some embodiments, the backside ILD layer 1871 corresponds to the backside ILD layer 471 shown in FIGS. 4A-4B. In some embodiments, the spacers 1881-1882 correspond to the spacer 481 shown in FIG. 4B.

Figure 19:
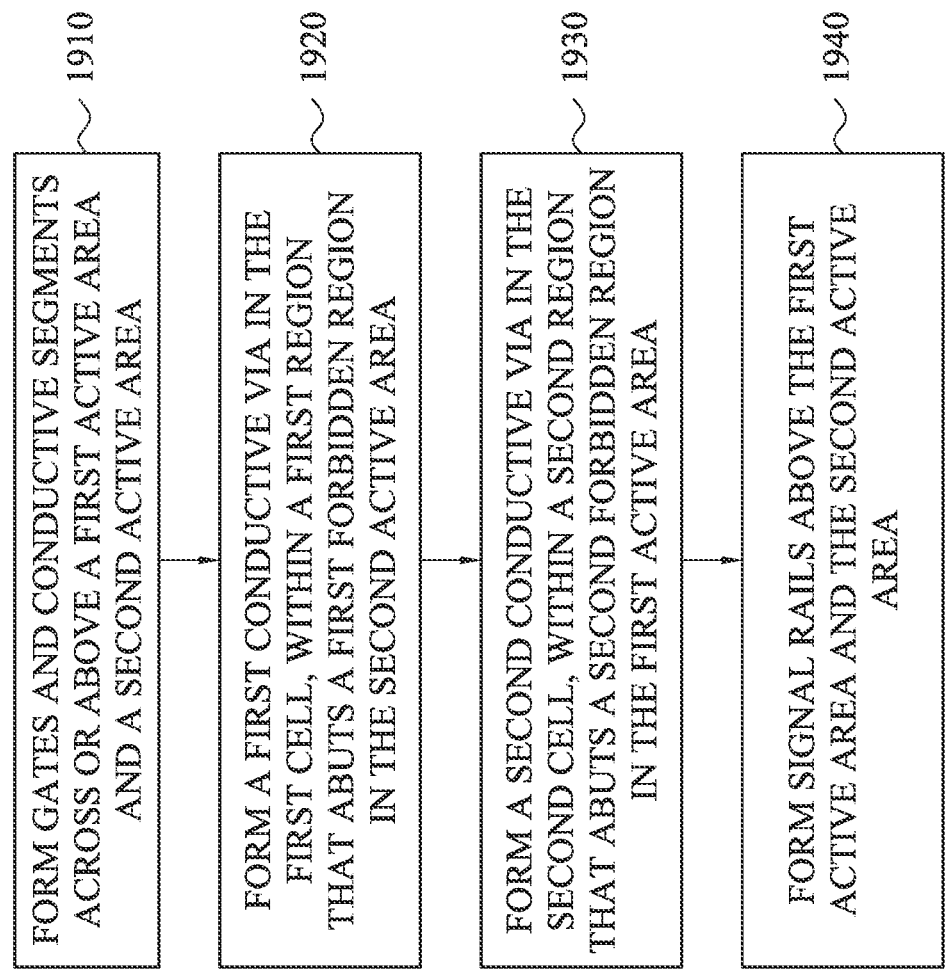
FIG. 19 is a flow chart of a method for fabricating an IC corresponding to the IC in FIG. 1, in accordance with some embodiments of the present disclosure.

Reference is now made to FIG. 19. FIG. 19 is a flow chart of a method 1900 for fabricating an IC, in accordance with some embodiments of the present disclosure. In some embodiments, the IC includes at least one semiconductor device including, for example, the semiconductor device 300 or 1700. In some other embodiments, the IC is manufactured based on at least one layout diagram including, for example, layout diagrams 200, 500, 600A-600B, 700A-700D, 800, 900B-900D, 1000B-1000D, 1100B-1200D, 1300B-1300D, 1400B, 1500, or 1600B-1600C, discussed above with respect to FIGS. 2-16C. Following illustrations of the method 1900 in FIG. 19 with reference to the semiconductor device 300 shown in FIGS. 3A-4B or the layout diagrams 600A-600B in FIGS. 6A-6B thereof include exemplary operations. However, the operations in FIG. 19 are not necessarily performed in the order shown. Alternatively stated, operations may be added, replaced, changed order, and/or eliminated as appropriate, in accordance with the spirit and scope of various embodiments of the present disclosure.

At operation 1910, gates and conductive segments are formed across or above a first active area and a second active area. The first active area is included in a first cell that corresponds to a first circuit. The second active area is included in a second cell that corresponds to a second circuit and abuts with the first cell. For illustration, as shown in FIG. 3A, the gates 311-313 are formed across the active areas patterned as AA in the cells C11 and C01, and the MD segments 321 and 323 are formed above these active areas. The cell C11 corresponds to one circuit, and the cell C01 that abuts the cell C11 corresponds to another circuit.

At operation 1920, a first conductive via is formed in the first cell, within a first region that abuts a first forbidden region in the second active area, in a layout view. For illustration, as shown in FIG. 6A, the contact via 532 is disposed in the cell C11 within a region that abuts the forbidden region 611 in the active area (not shown) of another cell (not shown) that abuts the cell C11. The cell abutting the cell C11 is indicated as an abutted cell hereinafter. In another example, with reference to FIG. 6B, the gate via 341 is disposed in the cell C11 within a region that abuts the forbidden region 635 in the active area of another abutted cell.

At operation 1930, a second conductive via is formed in the second cell, within a second region that abuts a second forbidden region in the first active area, in a layout view. For illustration, as shown in FIG. 6A, a contact via (not shown) is disposed in the abutted cell within the region 621 that abuts the forbidden region 612 in the active area of cell C11. In another example, with reference to FIG. 6B, a gate via (not shown) is disposed in another abutted cell within the region 642 that abuts the forbidden region 634 in the active area of cell C11.

At operation 1940, signal rails are formed above the first active area and the second active area. For illustration, as shown in FIG. 3A, the signal rails 351-352 are formed in the M0 layer that is disposed above the active areas. Also for illustration as shown in FIGS. 6A-6B, the signal rails 351-352 are disposed.

In some embodiments, the first conductive via formed in the operation 1920 couples one of the signal rails to one of the gates or the conductive segments formed in the operation 1910. For illustration, as shown in FIG. 6A, the contact via 532 couples the signal rail 355 to one MD segment (which is not labeled and shown in FIG. 3A). In another example, with reference to FIG. 6B, the gate via 341 couples the signal rail 352 to the gate 311.

In some embodiments, the second conductive via formed in the operation 1920 couples one of the signal rails to one of the gates or the conductive segments formed in the operation 1910. For illustration, as shown in FIG. 3A, in the abutted cell C01, the contact via 331 couples the signal rail 353 to the MD segment 322.

In some embodiments, the first forbidden region is configured where no conductive via is disposed, and the second forbidden region is configured where no conductive via is disposed. For illustration, as shown in FIG. 6A, the forbidden region 611, when the contact via 532 is disposed as the illustration, has no contact vias disposed in. The forbidden region 612, when the contact via is disposed in the region 621, has no contact vias disposed in. For another illustration, as shown in FIG. 6B, the forbidden region 635, when the gate via 341 is disposed as the illustration, has no gate vias disposed in. The forbidden region 634, when the gate via is disposed in the region 642, has no gate vias disposed in.

Figure 20:
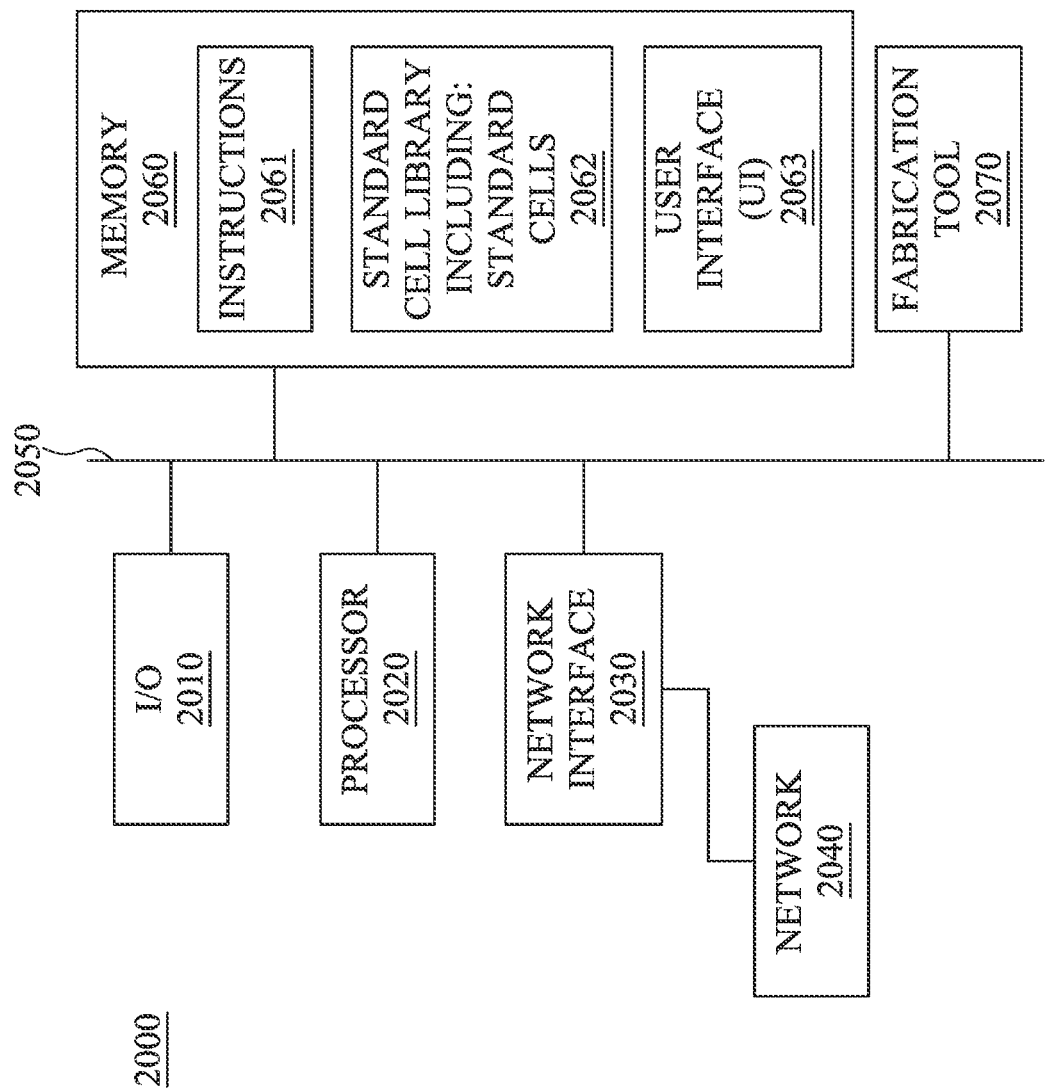
FIG. 20 is a block diagram of a system for designing an IC layout design, in accordance with some embodiments of the present disclosure.

Reference is now made to FIG. 20. FIG. 20 is a block diagram of an electronic design automation (EDA) system 2000 for designing the integrated circuit layout design, in accordance with some embodiments of the present disclosure. EDA system 2000 is configured to implement one or more operations of the method 1900 disclosed in FIG. 19, and further explained in conjunction with FIGS. 3A-7D. In some embodiments, EDA system 2000 includes an APR system.

In some embodiments, EDA system 2000 is a general purpose computing device including a hardware processor 2020 and a non-transitory, computer-readable storage medium 2060. Storage medium 2060, amongst other things, is encoded with, i.e., stores, computer program code (instructions) 2061, i.e., a set of executable instructions. Execution of instructions 2061 by hardware processor 2020 represents (at least in part) an EDA tool which implements a portion or all of, e.g., the method 1900.

The processor 2020 is electrically coupled to computer-readable storage medium 2060 via a bus 2050. The processor 2020 is also electrically coupled to an I/O interface 2010 and a fabrication tool 2070 by bus 2050. A network interface 2030 is also electrically connected to processor 2020 via bus 2050. Network interface 2030 is connected to a network 2040, so that processor 2020 and computer-readable storage medium 2060 are capable of connecting to external elements via network 2040. The processor 2020 is configured to execute computer program code 2061 encoded in computer-readable storage medium 2060 in order to cause EDA system 2000 to be usable for performing a portion or all of the noted processes and/or methods. In one or more embodiments, processor 2020 is a central processing unit (CPU), a multi-processor, a distributed processing system, an application specific integrated circuit (ASIC), and/or a suitable processing unit.

In one or more embodiments, computer-readable storage medium 2060 is an electronic, magnetic, optical, electromagnetic, infrared, and/or a semiconductor system (or apparatus or device). For example, computer-readable storage medium 2060 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 2060 includes a compact disk-read only memory (CD-ROM), a compact disk-read/write (CD-R/W), and/or a digital video disc (DVD).

In one or more embodiments, storage medium 2060 stores computer program code 2061 configured to cause EDA system 2000 (where such execution represents (at least in part) the EDA tool) to be usable for performing a portion or all of the noted processes and/or methods. In one or more embodiments, storage medium 2060 also stores information which facilitates performing a portion or all of the noted processes and/or methods. In one or more embodiments, storage medium 2060 stores library 2062 of standard cells including such standard cells as disclosed herein, for example, cells C01, C11, C12 and C21 discussed above with respect to FIGS. 2-8 and 15.

EDA system 2000 includes I/O interface 2010. I/O interface 2010 is coupled to external circuitry. In one or more embodiments, I/O interface 2010 includes a keyboard, keypad, mouse, trackball, trackpad, touchscreen, and/or cursor direction keys for communicating information and commands to processor 2020.

EDA system 2000 also includes network interface 2030 coupled to processor 2020. Network interface 2030 allows EDA system 2000 to communicate with network 2040, to which one or more other computer systems are connected. Network interface 2030 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 2000.

EDA system 2000 also includes the fabrication tool 2070 coupled to the processor 2020. The fabrication tool 2070 is configured to fabricate semiconductor devices, including, for example, the semiconductor device 300 in FIGS. 3A-4B and the semiconductor device 1700 in FIGS. 17-18C, and integrated circuits that include the semiconductor devices based on the design files processed by the processor 2020 and/or the IC layout designs as discussed above.

EDA system 2000 is configured to receive information through I/O interface 2010. The information received through I/O interface 2010 includes one or more of instructions, data, design rules, libraries of standard cells, and/or other parameters for processing by processor 2020. The information is transferred to processor 2020 via bus 2050. EDA system 2000 is configured to receive information related to a UI through I/O interface 2010. The information is stored in computer-readable medium 2060 as user interface (UI) 2063.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 2000. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 21:
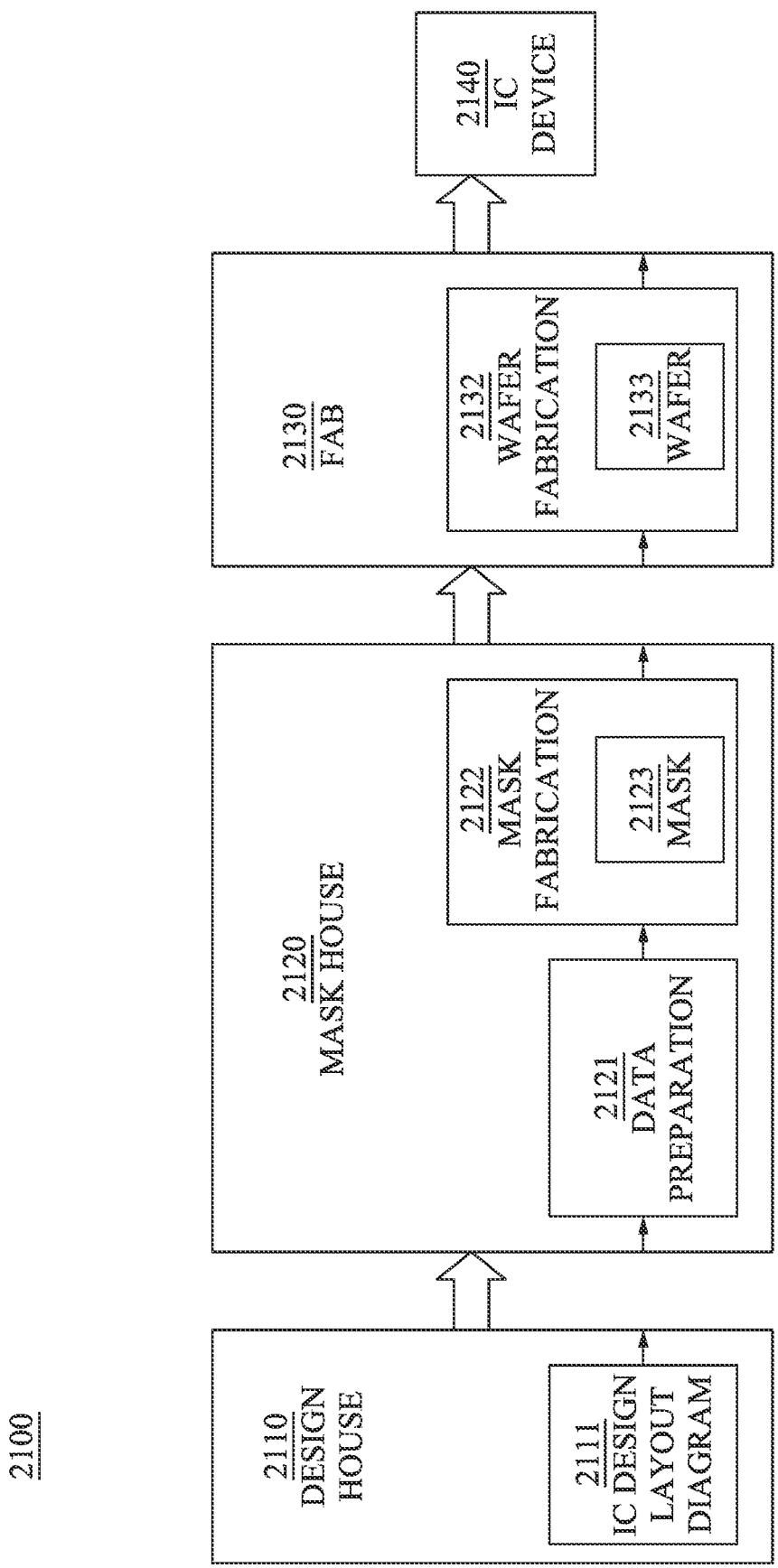
FIG. 21 is a block diagram of an IC manufacturing system, and an IC manufacturing flow associated therewith, in accordance with some embodiments.

FIG. 21 is a block diagram of IC manufacturing system 2100, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 2100.

In FIG. 21, IC manufacturing system 2100 includes entities, such as a design house 2110, a mask house 2120, and an IC manufacturer/fabricator ("fab") 2130, that interact with one another in the design, development, and manufacturing cycles and/or services related to manufacturing an IC device 2140. The entities in IC manufacturing system 2100 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 2110, mask house 2120, and IC fab 2130 is owned by a single larger company. In some embodiments, two or more of design house 2110, mask house 2120, and IC fab 2130 coexist in a common facility and use common resources.

Design house (or design team) 2110 generates an IC design layout diagram 2111. IC design layout diagram 2111 includes various geometrical patterns, for example, an IC layout design depicted in FIG. 2, FIG. 5, FIGS. 6A-6B, FIGS. 7A-7D, FIG. 8, FIGS. 9B-9D, FIGS. 10B-10D, FIGS. 11B-11D, FIGS. 12B-12D, FIGS. 13B-13D, FIG. 14B, FIG. 15, and/or FIGS. 16B-16C, designed for an IC device 2140, for example, semiconductor devices 300 and 1700, discussed above with respect to FIGS. 3A-4B and/or FIGS. 17-18C. The geometrical patterns correspond to patterns of metal, oxide, or semiconductor layers that make up the various components of IC device 2140 to be fabricated. The various layers combine to form various IC features. For example, a portion of IC design layout diagram 2111 includes various IC features, such as an active area, gate electrode, source and drain, conductive segments or vias of an interlayer interconnection, to be formed in a semiconductor substrate (such as a silicon wafer) and various material layers disposed on the semiconductor substrate. Design house 2110 implements a proper design procedure to form IC design layout diagram 2111. The design procedure includes one or more of logic design, physical design or place and route. IC design layout diagram 2111 is presented in one or more data files having information of the geometrical patterns. For example, IC design layout diagram 2111 can be expressed in a GDSII file format or DFII file format.

Mask house 2120 includes data preparation 2121 and mask fabrication 2121. Mask house 2120 uses IC design layout diagram 2111 to manufacture one or more masks 2123 to be used for fabricating the various layers of IC device 2140 according to IC design layout diagram 2111. Mask house 2120 performs mask data preparation 2121, where IC design layout diagram 2111 is translated into a representative data file ("RDF"). Mask data preparation 2121 provides the RDF to mask fabrication 2122. Mask fabrication 2122 includes a mask writer. A mask writer converts the RDF to an image on a substrate, such as a mask (reticle) 2123 or a semiconductor wafer 2133. The IC design layout diagram 2111 is manipulated by mask data preparation 2121 to comply with particular characteristics of the mask writer and/or requirements of IC fab 2130. In FIG. 21, data preparation 2121 and mask fabrication 2122 are illustrated as separate elements. In some embodiments, data preparation 2121 and mask fabrication 2122 can be collectively referred to as mask data preparation.

In some embodiments, data preparation 2121 includes optical proximity correction (OPC) which uses lithography enhancement techniques to compensate for image errors, such as those that can arise from diffraction, interference, other process effects and the like. OPC adjusts IC design layout diagram 2111. In some embodiments, data preparation 2121 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 2121 includes a mask rule checker (MRC) that checks the IC design layout diagram 2111 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 2111 to compensate for limitations during mask fabrication 2122, which may undo part of the modifications performed by OPC in order to meet mask creation rules.

In some embodiments, data preparation 2121 includes lithography process checking (LPC) that simulates processing that will be implemented by IC fab 2130 to fabricate IC device 2140. LPC simulates this processing based on IC design layout diagram 2111 to create a simulated manufactured device, such as IC device 2140. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 2111.

It should be understood that the above description of data preparation 2121 has been simplified for the purposes of clarity. In some embodiments, data preparation 2121 includes additional features such as a logic operation (LOP) to modify the IC design layout diagram 2111 according to manufacturing rules. Additionally, the processes applied to IC design layout diagram 2111 during data preparation 2121 may be executed in a variety of different orders.

After data preparation 2121 and during mask fabrication 2122, a mask 2123 or a group of masks 2123 are fabricated based on the modified IC design layout diagram 2111. In some embodiments, mask fabrication 2122 includes performing one or more lithographic exposures based on IC design layout diagram 2111. In some embodiments, an electron-beam (e-beam) or a mechanism of multiple e-beams is used to form a pattern on a mask (photomask or reticle) 2123 based on the modified IC design layout diagram 2111. Mask 2123 can be formed in various technologies. In some embodiments, mask 2123 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 2123 includes a transparent substrate (for example, fused quartz) and an opaque material (for example, chromium) coated in the opaque regions of the binary mask. In another example, mask 2123 is formed using a phase shift technology. In a phase shift mask (PSM) version of mask 2123, various features in the pattern formed on the phase shift mask are configured to have proper phase difference to enhance the resolution and imaging quality. In various examples, the phase shift mask can be attenuated PSM or alternating PSM. The mask(s) generated by mask fabrication 2122 is used in a variety of processes. For example, such a mask(s) is used in an ion implantation process to form various doped regions in semiconductor wafer 2133, in an etching process to form various etching regions in semiconductor wafer 2133, and/or in other suitable processes.

IC fab 2130 includes wafer fabrication 2132. IC fab 2130 is an IC fabrication business that includes one or more manufacturing facilities for the fabrication of a variety of different IC products. In some embodiments, IC Fab 2130 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 2130 uses mask(s) 2123 fabricated by mask house 2120 to fabricate IC device 2140. Thus, IC fab 2130 at least indirectly uses IC design layout diagram 2111 to fabricate IC device 2140. In some embodiments, semiconductor wafer 2133 is fabricated by IC fab 2130 using mask(s) 2123 to form IC device 2140. In some embodiments, the IC fabrication includes performing one or more lithographic exposures based at least indirectly on IC design layout diagram 2111. Semiconductor wafer 2133 includes a silicon substrate or other proper substrate having material layers formed thereon. Semiconductor wafer 2133 further includes one or more of various doped regions, dielectric features, multi-level interconnects, and the like (formed at subsequent manufacturing steps).

Moreover, various circuits or devices to implement the transistors in the aforementioned embodiments are within the contemplated scope of the present disclosure. In some embodiments of this document, at least one of the transistors is implemented with at least one MOS transistor, at least one bipolar junction transistor (BJT), etc., or the combination thereof. Various circuits or devices to implement the transistors in the aforementioned embodiments are within the contemplated scope of the present disclosure.

In some embodiments, a semiconductor device is disclosed and includes a first cell. The first cell is surrounded by a castle-shaped forbidden region. The first cell includes a first active region, a second active region, and at least one via. The first active region and the second active region extend along a first direction and are separated from each other along a second direction traverse to the first direction. The first active region partially overlaps an upper region of the castle-shaped forbidden region, and the second active region partially overlaps a lower region of the castle-shaped forbidden region. The at least one via is arranged outside the castle-shaped forbidden region.

In some embodiments, a portion of the first active region overlaps the upper region. A portion of the second active region overlaps the lower region. The portion of the first active region and the portion of the second active region align with each other along the second direction.

In some embodiments, the semiconductor device further includes a second cell abutting the first cell along the second direction. A boundary between the first cell and the second cell is arranged between first portions of the upper region and second portions of the upper region. The first portions of the upper region overlap the first cell and the second portions of the upper region overlap the second cell.

In some embodiments, the first and second portions of the upper region are arranged in a staggered manner along the first direction.

In some embodiments, the first portions of the upper region and first portions of the lower region are aligned with each other along the second direction. The second portions of the upper region and second portions of the lower region are aligned with each other along the second direction.

In some embodiments, the first cell further includes multiple strip structures. The strip structures extend along the second direction and are separated from each other along the first direction. The strip structures partially abut or overlap the castle-shaped forbidden region.

In some embodiments, the first cell further includes multiple conductive structures. The conductive structures extend along the first direction. The at least one via is coupled to one of the conductive structures. Each of the strip structures partially abuts the upper region and the lower region.

In some embodiments, the at least one via is coupled to one of the strip structures. Odd-number strip structures of the strip structures partially overlap with the upper region and the lower region.

In some embodiments, a method is disclosed and includes: forming multiple strip structures within a first cell, wherein the strip structures extend along a first direction and are separated from each other along a second direction different from the first direction, and odd-number strip structures of the strip structures partially overlap with a first serpentine forbidden portion abutting a first boundary between the first cell and a second cell; forming a first via within a first region of the second cell, wherein three sides of the first region abut the first serpentine forbidden portion;

and forming a second via that is within the first cell and outside the first serpentine forbidden portion.

In some embodiments, the odd-number strip structures of the strip structures partially overlap with a second serpentine forbidden portion abutting a second boundary between the first cell and a third cell.

In some embodiments, even-number strip structures of the strip structures are arranged outside the first serpentine forbidden portion and the second serpentine forbidden portion.

In some embodiments, the first serpentine forbidden portion and the second serpentine forbidden portion are symmetrical with respect to a line between the first boundary and the second boundary.

In some embodiments, the method further includes: forming a first active region and a second active region that extend along the second direction and are separated from each other along the first direction. The first active region partially overlaps the first serpentine forbidden portion, and the second active region partially overlaps the second serpentine forbidden portion.

In some embodiments, a portion of the first active region overlaps the first serpentine forbidden portion. A portion of the second active region overlaps the second serpentine forbidden portion. The portion of the first active region and the portion of the second active region align with each other along the first direction.

In some embodiments, a portion of the first cell overlaps the first serpentine forbidden portion. A portion of the second cell overlaps the first serpentine forbidden portion. The portion of the first cell and the portion of the second cell are arranged in a staggered manner along the second direction on the first boundary.

In some embodiments, a method is disclosed and includes: forming at least one first via in a first region abutting multiple forbidden regions; forming at least one second via in a second region that is different from the first region and abuts the forbidden regions; and forming multiple conductive structures, wherein one of the conductive structures is coupled to the at least one second via. The forbidden regions are arranged on two sides of a cell boundary.

In some embodiments, three sides of the first region abut the forbidden regions. Three sides of the second region abut the forbidden regions.

In some embodiments, the first region and the second region are arranged on the two sides of the cell boundary and are arranged in a diagonal manner.

In some embodiments, the conductive structures extend along a first direction and are separated from each other along a second direction traverse to the first direction. Each of the conductive structures partially abuts the forbidden regions.

In some embodiments, odd-number conductive structures of the conductive structures partially overlap with the forbidden regions. Even-number conductive structures are arranged outside the forbidden regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first cell surrounded by a castle-shaped forbidden region and comprising:
   a first active region and a second active region that extend along a first direction and are separated from each other along a second direction traverse to the first direction,
   wherein the first active region partially overlaps an upper region of the castle-shaped forbidden region, and the second active region partially overlaps a lower region of the castle-shaped forbidden region; and
   at least one via arranged outside the castle-shaped forbidden region.

2. The semiconductor device of claim 1, wherein
a portion of the first active region overlaps the upper region;
a portion of the second active region overlaps the lower region; and
the portion of the first active region and the portion of the second active region align with each other along the second direction.

3. The semiconductor device of claim 1, further comprising:
a second cell abutting the first cell along the second direction;
wherein a boundary between the first cell and the second cell is arranged between first portions of the upper region and second portions of the upper region, wherein the first portions of the upper region overlap the first cell and the second portions of the upper region overlap the second cell.

4. The semiconductor device of claim 3, wherein the first and second portions of the upper region are arranged in a staggered manner along the first direction.

5. The semiconductor device of claim 4, wherein
the first portions of the upper region and first portions of the lower region are aligned with each other along the second direction, and
the second portions of the upper region and second portions of the lower region are aligned with each other along the second direction.

6. The semiconductor device of claim 1, wherein the first cell further comprises:
a plurality of strip structures that extend along the second direction and are separated from each other along the first direction, wherein the plurality of strip structures partially overlap the castle-shaped forbidden region.

7. The semiconductor device of claim 6, wherein the first cell further comprises:
a plurality of conductive structures extending along the first direction,
wherein the at least one via is coupled to one of the plurality of conductive structures; and
each of the plurality of strip structures partially abuts the upper region and the lower region.

8. The semiconductor device of claim 6, wherein
the at least one via is coupled to one of the plurality of strip structures; and
odd-number strip structures of the plurality of strip structures partially overlap with the upper region and the lower region.

9. A method, comprising:
forming a plurality of strip structures within a first cell, wherein the plurality of strip structures extend along a first direction and are separated from each other along a second direction different from the first direction, and odd-number strip structures of the plurality of strip structures partially overlap with a first serpentine forbidden portion abutting a first boundary between the first cell and a second cell;
forming a first via within a first region of the second cell, wherein three sides of the first region abut the first serpentine forbidden portion; and
forming a second via that is within the first cell and outside the first serpentine forbidden portion.

10. The method of claim 9, wherein the odd-number strip structures of the plurality of strip structures partially overlap with a second serpentine forbidden portion that abuts a second boundary between the first cell and a third cell.

11. The method of claim 10, wherein even-number strip structures of the plurality of strip structures are arranged outside the first serpentine forbidden portion and the second serpentine forbidden portion.

12. The method of claim 10, wherein the first serpentine forbidden portion and the second serpentine forbidden portion are symmetrical with respect to a line between the first boundary and the second boundary.

13. The method of claim 10, further comprising:
forming a first active region and a second active region that extend along the second direction and are separated from each other along the first direction;
wherein the first active region partially overlaps the first serpentine forbidden portion, and the second active region partially overlaps the second serpentine forbidden portion.

14. The method of claim 13, wherein
a portion of the first active region overlaps the first serpentine forbidden portion;
a portion of the second active region overlaps the second serpentine forbidden portion; and
the portion of the first active region and the portion of the second active region align with each other along the first direction.

15. The method of claim 9, wherein
a portion of the first cell overlaps the first serpentine forbidden portion; and
a portion of the second cell overlaps the first serpentine forbidden portion;
the portion of the first cell and the portion of the second cell are arranged in a staggered manner along the second direction on the first boundary.

16. A method, comprising:
forming at least one first via in a first region abutting a plurality of forbidden regions;
forming at least one second via in a second region that is different from the first region and abuts the plurality of forbidden regions; and
forming a plurality of conductive structures, wherein one of the plurality of conductive structures is coupled to the at least one second via;
wherein the plurality of forbidden regions are arranged on two sides of a cell boundary.

17. The method of claim 16, wherein
three sides of the first region abut the plurality of forbidden regions; and
three sides of the second region abut the plurality of forbidden regions.

18. The method of claim 16, wherein
the first region and the second region are arranged on the two sides of the cell boundary and are arranged diagonally.

19. The method of claim 16, wherein
the plurality of conductive structures extend along a first direction and are separated from each other along a second direction traverse to the first direction; and
each of the plurality of conductive structures partially abuts the plurality of forbidden regions.

20. The method of claim 16, wherein
odd-number conductive structures of the plurality of conductive structures partially overlap with the plurality of forbidden regions; and
even-number conductive structures are arranged outside the plurality of forbidden regions.

\* \* \* \* \*